US007254151B2

(12) United States Patent
Lieber et al.

(10) Patent No.: US 7,254,151 B2
(45) Date of Patent: Aug. 7, 2007

(54) NANOSCALE COHERENT OPTICAL COMPONENTS

(75) Inventors: Charles M. Lieber, Lexington, MA (US); Xiangfeng Duan, Cambridge, MA (US); Yu Huang, Cambridge, MA (US); Ritesh Agarwal, Cambridge, MA (US)

(73) Assignee: President & Fellows of Harvard College, Cambridge, MA (US)

( * ) Notice: Subject to any disclaimer, the term of this patent is extended or adjusted under 35 U.S.C. 154(b) by 159 days.

(21) Appl. No.: 10/734,086

(22) Filed: Dec. 11, 2003

(65) Prior Publication Data

US 2004/0213307 A1    Oct. 28, 2004

Related U.S. Application Data

(63) Continuation-in-part of application No. 10/624,135, filed on Jul. 21, 2003, now abandoned.

(60) Provisional application No. 60/397,121, filed on Jul. 19, 2002.

(51) Int. Cl.
*H01S 5/00*    (2006.01)
(52) U.S. Cl. ............... 372/44.01; 977/951; 977/825
(58) Field of Classification Search ............ 372/43.01, 372/44.01; 977/949, 950, 951, 762, 765, 977/813, 825
See application file for complete search history.

(56) References Cited

U.S. PATENT DOCUMENTS 3,873,359 A    3/1975 Lando
3,873,360 A    3/1975 Lando
3,900,614 A    8/1975 Lando
4,673,474 A    6/1987 Ogawa (Continued)

FOREIGN PATENT DOCUMENTS

EP    1087413 A2    3/2001

(Continued)

OTHER PUBLICATIONS

Peidong Yang et al., Controlled Growth of ZnO Nanowires and Their Optical Properties, Advanced Functional Materials, vol. 12, No. 5, May 2002, p. 323-331.*

(Continued)

*Primary Examiner*—James Menefee
(74) *Attorney, Agent, or Firm*—Wolf, Greenfield & Sacks

(57)    ABSTRACT

This invention generally relates to nanotechnology and nanoelectronics as well as associated methods and devices. In particular, the invention relates to nanoscale optical components such as electroluminescence devices (e.g., LEDs), amplified stimulated emission devices (e.g., lasers), waveguides, and optical cavities (e.g., resonators). Articles and devices of a size greater than the nanoscale are also included. Such devices can be formed from nanoscale wires such as nanowires or nanotubes. In some cases, the nanoscale wire is a single crystal. In one embodiment, the nanoscale laser is constructed as a Fabry-Perot cavity, and is driven by electrical injection. Any electrical injection source may be used. For example, electrical injection may be accomplished through a crossed wire configuration, an electrode or distributed electrode configuration, or a core/shell configuration. The output wavelength can be controlled, for example, by varying the types of materials used to fabricate the device. One or more such nanoscale lasers may also be integrated with other nanoscale components within a device.

70 Claims, 37 Drawing Sheets

U.S. PATENT DOCUMENTS

| | | |
|---|---|---|
| 4,939,556 A | 7/1990 | Eguchi et al. |
| 5,023,139 A | 6/1991 | Birnboim et al. |
| 5,089,545 A | 2/1992 | Pol |
| 5,252,835 A | 10/1993 | Lieber et al. |
| 5,274,602 A | 12/1993 | Glenn |
| 5,453,970 A | 9/1995 | Rust et al. |
| 5,475,341 A | 12/1995 | Reed |
| 5,512,131 A | 4/1996 | Kumar et al. |
| 5,537,075 A | 7/1996 | Miyazaki |
| 5,539,214 A | 7/1996 | Lynch et al. |
| 5,581,091 A | 12/1996 | Moskovits et al. |
| 5,589,692 A | 12/1996 | Reed |
| 5,607,876 A | 3/1997 | Biegelsen et al. |
| 5,620,850 A | 4/1997 | Bamdad et al. |
| 5,640,343 A | 6/1997 | Gallagher et al. |
| 5,726,524 A | 3/1998 | Debe |
| 5,739,057 A | 4/1998 | Tiwari et al. |
| 5,747,180 A | 5/1998 | Miller et al. |
| 5,751,156 A | 5/1998 | Muller et al. |
| 5,776,748 A | 7/1998 | Singhvi et al. |
| 5,824,470 A | 10/1998 | Baldeschwieler et al. |
| 5,830,538 A | 11/1998 | Gates et al. |
| 5,840,435 A | 11/1998 | Lieber et al. |
| 5,847,565 A | 12/1998 | Narayanan |
| 5,858,862 A | 1/1999 | Westwater et al. |
| 5,864,823 A | 1/1999 | Levitan |
| 5,897,945 A | 4/1999 | Lieber et al. |
| 5,900,160 A | 5/1999 | Whitesides et al. |
| 5,903,010 A | 5/1999 | Flory et al. |
| 5,908,692 A | 6/1999 | Hamers et al. |
| 5,916,642 A | 6/1999 | Chang |
| 5,942,443 A | 8/1999 | Parce et al. |
| 5,997,832 A | 12/1999 | Lieber et al. |
| 6,036,774 A | 3/2000 | Lieber et al. |
| 6,038,060 A | 3/2000 | Crowley |
| 6,060,121 A | 5/2000 | Hidber et al. |
| 6,060,724 A | 5/2000 | Flory et al. |
| 6,069,380 A | 5/2000 | Chou et al. |
| 6,123,819 A | 9/2000 | Peeters |
| 6,128,214 A | 10/2000 | Kuekes et al. |
| 6,143,184 A | 11/2000 | Martin et al. |
| 6,149,819 A | 11/2000 | Martin et al. |
| 6,159,742 A | 12/2000 | Lieber et al. |
| 6,180,239 B1 | 1/2001 | Whitesides et al. |
| 6,187,165 B1 | 2/2001 | Chien et al. |
| 6,190,634 B1 | 2/2001 | Lieber et al. |
| 6,203,864 B1 | 3/2001 | Zhang et al. |
| 6,207,392 B1 | 3/2001 | Weiss et al. |
| 6,231,744 B1 | 5/2001 | Ying et al. |
| 6,256,767 B1 | 7/2001 | Kuekes et al. |
| 6,270,074 B1 | 8/2001 | Rasmussen et al. |
| 6,278,231 B1 | 8/2001 | Iwasaki et al. |
| 6,286,226 B1 | 9/2001 | Jin |
| 6,287,765 B1 | 9/2001 | Cubicciotti |
| 6,314,019 B1 | 11/2001 | Kuekes et al. |
| 6,325,904 B1 | 12/2001 | Peeters |
| 6,340,822 B1 | 1/2002 | Brown et al. |
| 6,346,189 B1 | 2/2002 | Dai et al. |
| 6,355,198 B1 | 3/2002 | Kim et al. |
| 6,359,288 B1 | 3/2002 | Ying et al. |
| 6,437,329 B1 | 8/2002 | Yedur et al. |
| 6,459,095 B1 | 10/2002 | Heath et al. |
| 6,465,132 B1 | 10/2002 | Jin |
| 6,503,375 B1 | 1/2003 | Maydan et al. |
| 6,528,020 B1 | 3/2003 | Dai et al. |
| 6,538,367 B1 | 3/2003 | Choi et al. |
| 6,559,468 B1 | 5/2003 | Kuekes et al. |
| 6,586,095 B2 | 7/2003 | Wang et al. |
| 6,628,053 B1 | 9/2003 | Den et al. |
| 6,716,409 B2 | 4/2004 | Hafner et al. |
| 6,741,019 B1 | 5/2004 | Filas et al. |
| 6,743,408 B2 | 6/2004 | Lieber |
| 6,756,025 B2 | 6/2004 | Colbert et al. |
| 6,756,795 B2 | 6/2004 | Hunt et al. |
| 6,762,056 B1 | 7/2004 | Peeters |
| 6,781,166 B2 | 8/2004 | Lieber et al. |
| 6,803,840 B2 | 10/2004 | Hunt et al. |
| 6,808,746 B1 | 10/2004 | Dai et al. |
| 6,815,706 B2 | 11/2004 | Li et al. |
| 6,846,565 B2 | 1/2005 | Korgel et al. |
| 6,872,645 B2 | 3/2005 | Duan et al. |
| 6,882,051 B2 | 4/2005 | Majumdar et al. |
| 6,882,767 B2 | 4/2005 | Yang et al. |
| 6,902,720 B2 | 6/2005 | McGimpsey |
| 6,946,197 B2 | 9/2005 | Yadav et al. |
| 6,958,216 B2 | 10/2005 | Kelley et al. |
| 6,962,823 B2 | 11/2005 | Empedocles et al. |
| 6,974,706 B1 | 12/2005 | Melker et al. |
| 6,996,147 B2 * | 2/2006 | Majumdar et al. ............ 372/43 |
| 2001/0054709 A1 | 12/2001 | Heath et al. |
| 2002/0013031 A1 | 1/2002 | Chen et al. |
| 2002/0040805 A1 | 4/2002 | Swager |
| 2002/0055239 A1 | 5/2002 | Tuominen |
| 2002/0084502 A1 | 7/2002 | Jang et al. |
| 2002/0086335 A1 | 7/2002 | Massey et al. |
| 2002/0112814 A1 | 8/2002 | Hafner et al. |
| 2002/0117659 A1 | 8/2002 | Lieber et al. |
| 2002/0122766 A1 | 9/2002 | Lieber et al. |
| 2002/0130311 A1 | 9/2002 | Lieber et al. |
| 2002/0130353 A1 | 9/2002 | Lieber et al. |
| 2002/0146714 A1 | 10/2002 | Lieber et al. |
| 2002/0158342 A1 | 10/2002 | Mark et al. |
| 2002/0172820 A1 | 11/2002 | Majumdar et al. |
| 2002/0175408 A1 | 11/2002 | Majumdar et al. |
| 2002/0179434 A1 | 12/2002 | Dai et al. |
| 2002/0187504 A1 | 12/2002 | Reich et al. |
| 2003/0001091 A1 | 1/2003 | Nakayama et al. |
| 2003/0003300 A1 | 1/2003 | Korgel et al. |
| 2003/0032892 A1 | 2/2003 | Erlach et al. |
| 2003/0048619 A1 | 3/2003 | Kaler et al. |
| 2003/0073071 A1 | 4/2003 | Fritz et al. |
| 2003/0089899 A1 | 5/2003 | Lieber et al. |
| 2003/0098488 A1 | 5/2003 | O'Keeffe et al. |
| 2003/0113713 A1 | 6/2003 | Glezer et al. |
| 2003/0113940 A1 | 6/2003 | Erlanger et al. |
| 2003/0121764 A1 | 7/2003 | Yang et al. |
| 2003/0124509 A1 | 7/2003 | Kenis et al. |
| 2003/0124717 A1 | 7/2003 | Awano et al. |
| 2003/0134267 A1 | 7/2003 | Kang et al. |
| 2003/0134433 A1 | 7/2003 | Gabriel et al. |
| 2003/0135971 A1 | 7/2003 | Lieberman et al. |
| 2003/0156992 A1 | 8/2003 | Anderson et al. |
| 2003/0186522 A1 | 10/2003 | Duan et al. |
| 2003/0186544 A1 | 10/2003 | Matsui |
| 2003/0189202 A1 | 10/2003 | Li et al. |
| 2003/0197456 A1 | 10/2003 | Den et al. |
| 2003/0200521 A1 | 10/2003 | DeHon et al. |
| 2004/0005723 A1 | 1/2004 | Empedocles et al. |
| 2004/0026684 A1 | 2/2004 | Empedocles |
| 2004/0067530 A1 | 4/2004 | Gruner |
| 2004/0095658 A1 | 5/2004 | Burtea et al. |
| 2004/0106203 A1 | 6/2004 | Stasiak et al. |
| 2004/0113119 A1 | 6/2004 | DeHon et al. |
| 2004/0113138 A1 | 6/2004 | DeHon et al. |
| 2004/0118448 A1 | 6/2004 | Scher et al. |
| 2004/0122964 A1 | 6/2004 | Empedocles et al. |
| 2004/0136866 A1 | 7/2004 | Pontis et al. |
| 2004/0146560 A1 | 7/2004 | Whiteford et al. |
| 2004/0157414 A1 | 8/2004 | Gole et al. |
| 2004/0213307 A1 | 10/2004 | Lieber et al. |
| 2005/0037374 A1 | 2/2005 | Melker et al. |
| 2005/0064185 A1 | 3/2005 | Buretea et al. |
| 2005/0064731 A1 | 3/2005 | Park et al. |
| 2005/0066883 A1 | 3/2005 | Dubrow et al. |

| | | |
|---|---|---|
| 2005/0072213 A1 | 4/2005 | Besnard et al. |
| 2005/0079533 A1 | 4/2005 | Samuelson et al. |
| 2005/0079659 A1 | 4/2005 | Duan et al. |
| 2005/0100960 A1 | 5/2005 | Dai et al. |
| 2005/0101026 A1 | 5/2005 | Sailor et al. |
| 2005/0109989 A1 | 5/2005 | Whiteford et al. |
| 2005/0110064 A1 | 5/2005 | Duan |
| 2005/0161662 A1 | 7/2005 | Majumdar et al. |
| 2005/0181587 A1 | 8/2005 | Duan et al. |
| 2005/0201149 A1 | 9/2005 | Duan et al. |
| 2005/0202615 A1 | 9/2005 | Duan et al. |
| 2005/0212079 A1 | 9/2005 | Stumbo et al. |
| 2005/0214967 A1 | 9/2005 | Scher et al. |
| 2005/0219788 A1 | 10/2005 | Chow et al. |
| 2005/0230356 A1 | 10/2005 | Empedocles et al. |
| 2005/0253137 A1 | 11/2005 | Whang et al. |
| 2005/0287717 A1 | 12/2005 | Heald et al. |
| 2006/0008942 A1 | 1/2006 | Romano et al. |
| 2006/0009003 A1 | 1/2006 | Romano et al. |
| 2006/0019472 A1 | 1/2006 | Pan et al. |

FOREIGN PATENT DOCUMENTS

| | | |
|---|---|---|
| JP | 11-011917 B2 | 1/1999 |
| JP | 2000-31462 A | 1/2000 |
| WO | WO 91/06036 A1 | 5/1991 |
| WO | WO 95/02709 A2 | 1/1995 |
| WO | WO 96/29629 A2 | 9/1996 |
| WO | WO 97/33737 A1 | 9/1997 |
| WO | WO 97/34025 A1 | 9/1997 |
| WO | WO 98/39250 A1 | 9/1998 |
| WO | WO 98/48456 A1 | 10/1998 |
| WO | WO 98/42620 A1 | 10/1999 |
| WO | WO 99/63347 A2 | 12/1999 |
| WO | WO 00/09443 A1 | 2/2000 |
| WO | WO 00/17101 A1 | 3/2000 |
| WO | WO 00/19494 A1 | 4/2000 |
| WO | WO 00/51186 A1 | 8/2000 |
| WO | WO 01/03208 A1 | 1/2001 |
| WO | WO 01/44796 A1 | 6/2001 |
| WO | WO 02/08028 A2 | 2/2002 |
| WO | WO 02/31183 A1 | 4/2002 |
| WO | WO 02/17362 A2 | 6/2002 |
| WO | WO 02/48701 A1 | 10/2002 |
| WO | WO 02/086480 A1 | 10/2002 |
| WO | WO 03/005450 A2 | 1/2003 |
| WO | WO 03/016901 A1 | 2/2003 |
| WO | WO 03/053851 A2 | 7/2003 |
| WO | WO 03/054931 A1 | 7/2003 |
| WO | WO 03/063208 A2 | 7/2003 |
| WO | WO 2004/003535 | 1/2004 |
| WO | WO 2004/010552 A1 | 1/2004 |
| WO | WO 2004/032190 A2 | 4/2004 |
| WO | WO 2004/032193 A2 | 4/2004 |
| WO | WO 2004/034025 A2 | 4/2004 |
| WO | WO 2005/089165 | 9/2005 |
| WO | 2005/094440 | 10/2005 |
| WO | WO 2005/093831 A1 | 10/2005 |
| WO | WO 2005/114282 A2 | 12/2005 |
| WO | WO 2006/107312 A1 | 10/2006 |

OTHER PUBLICATIONS

Mark S. Gudiksen et al., Growth of Nanowire Superlattice Structures for Nanoscale Photonics and Electronics, Nature, vol. 415, Feb. 7, 2002, p. 617-620.*

Justin C. Johnson et al., Single Nanowire Lasers, J. Physical Chemistry B, vol. 105, No. 46, Nov. 22, 2001, p. 11387-11390.*

Michael H. Huang et al., Room-Temperature Ultraviolet Nanowire Nanolasers, Science, vol. 292, Jun. 8, 2001, p. 1897-1899.*

Xiangfeng Duan et al., Indium Phosphide Nanowires as Building Blocks for Nanoscale Electronic and Optoelectronic Devices, Nature, vol. 409, Jan. 4, 2001, p. 66-69.*

L. Pavesi et al., Optical Gain in Silicon Nanocrystals, Nature, vol. 408, Nov. 23, 2000, p. 440-444.*

S.-Y. Hu et al., Serpentine Superlattice Nanowire-Array Lasers, IEEE J. of Quantum Electronics, vol. 31, No. 8, Aug. 1995, p. 1380-1388.*

Kenji Hiruma et al., GaAs Free Standing Quantum Sized Wires, J. APplied Physics, vol. 74, No. 5, Sep. 1, 1993, p. 3162-3171.*

Agarwal, R. et al., "Lasing in Single Cadmium Sulfide Nanowire Optical Cavities," *Nano Letters*, 2005, 5(5):917-920.

Chen, J. et al., "Large On-Off Ratios and Negative Differential Resistance in a Molecular Electronic Device," *Science*, 1999, 286:1550-1551.

Chen, R.J. et al., "Noncovalent functionalization of carbon nanotubes for highly specific electronic biosensors," *PNAS*, Apr. 2003, 100(9):4984-4989.

Cheung, C.L. et al., "Diameter-Controlled Synthesis of Carbon Nanotubes," *J. Phys. Chem.*, 2002, 106:2429-2433.

Choi, K.J. et al., "Enhancement of Ferroelectricity in Strained $BaTiO_3$ Thin Films," *Science*, Nov. 2004, 306:1005-1009.

Chung, S. et al., "Silicon nanowires devices," *Appl. Phys. Lett.*, 2000, 76(15):2068-2070.

Collier C.P. et al., "Electronically Configurable Molecular-Based Logic Gates," *Science*, 1999, 285:391-394.

Cui, Y. et al., "Diameter-controlled synthesis of single-crystal silicon nanowires," *Appl. Phys. Lett.*, 2001, 78(15):2214-2216.

Cui, Y. et al., "Doping and Electrical Transport in Silicon Nanowires," *Journal of Physical Chemistry*, 2000, 104(22):5213-5216.

Cui, Y. et al., "Functional Nanoscale Electronic Devices Assembled Using Silicon Nanowire Building Blocks," *Science*, 2001, 291:851-853.

Cui, Y. et al., "Nanowire Nanosensors for Highly Sensitive and Selective Detection of Biological and Chemical Species," *Science*, 2001, 293:1289-1292.

Duan, X. et al., "General Synthesis of Compound Semiconductor Nanowires," *Adv. Mater.*, 2000 12(4):298-302.

Duan, X. et al., "High-performance thin-film transistors using semiconductor nanowires and nanoribbons," *Nature*, 2003, 425:274-278.

Duan, X. et al., "Laser-Assisted Catalytic Growth of Single Crystal GaN Nanowires," *J. Am. Chem. Soc.*, 2000, 122:188-189.

Duan, X. et al., "Nonvolatile Memory and Programmable Logic from Molecule-Gated Nanowires," *Nano Letters*, 2002, 2(5):487-490.

Duan, X. et al., "Single-nanowire electrically driven lasers," *Nature*, 2003, 421:241-245.

Duan, X. et al., "Synthesis and optical properties of gallium arsenide nanowires," *Applied Physics Letters*, Feb. 2000, 76(9):1116-1118.

Esfarjani, K. et al., "Electronic and transport properties of N-P doped nanotubes," *Appl. Phys. Lett.*, 1999, 74(1):79-81.

Friedman, R.S. et al., "High-speed integrated nanowire circuits," *Nature*, Apr. 2005, 434:1085.

Givargizov, E.I., "Fundamental Aspects of VLS Growth," *Journal of Crystal Growth*, 1975, 31:21-30.

Gradecak, S. et al., "GaN nanowire lasers with now lasing thresholds," *Applied Physics Letters*, 2005, 87:173111-1-173111-3.

Gudiksen, M.S. et al., "Diameter-Selective Synthesis of Semiconductor Nanowires," *J. Am. Chem. Soc.*, 2000, 122:8801-8802.

Gudiksen, M.S. et al., "Size-Dependent Photoluminescence from Single Indium Phosphide Nanowires," *J. Phys. Chem.*, 2002, 106:4036-4039.

Gudiksen, M.S. et al., "Synthetic Control of the Diameter and Length of Single Crystal Semiconductor Nanowires," *J. Phys. Chem.*, 2001, 105:4062-4064.

Guo, L. et al., "A Silicon Single-Electron Transistor Memory Operating at Room Temperature," *Science*, 1997, 275:649-651.

Guo, L. et al., "Nanoscale silicon field effect transistors fabricated using imprint lithography," *Appl. Phys. Lett.*, 1997, 71(13):1881-1883.

Hahm, J. et al., "Direct Ultrasensitive Electrical Detection of DNA and DNA Sequence Variations Using Nanowire Nanosensors," *Nano Letters*, 2004, 4(1):51-54.

Haraguchi, K. et al., "GaAs p-n junction formed in quantum wire crystals," *Appl. Phys. Lett.*, 1992, 60(6):745-747.

Haraguchi, K. et al., "Polarization dependence of light emitted from GaAs *p-n* junctions in quantum wire crystals," *J. Appl. Phys.*, 1994, 75(8):4220-4225.

Heath, J.R. et al., "A liquid solution synthesis of single crystal germanium quantum wires," *Chemical Physics Letters*, Jun. 1993, 208(3,4):263-268.

Hiruma, K. et al., "Self-organized growth of GaAs/InAs heterostructure nanocylinders by organometallic vapor phase epitaxy," *Journal of Crystal Growth*, 1996, 163:226-231.

Holmes, J.D. et al., "Control of Thickness and Orientation of Solution-Grown Silicon Nanowires," *Science*, 2000, 287:1471-1473.

Hu, J. et al., "Chemistry and Physics in One Dimension: Synthesis and Properties of Nanowires and Nanotubes," *Acc. Chem. Res.*, 1999, 32:435-445.

Hu, J. et al., "Controlled growth and electrical properties of heterojunctions of carbon nanotubes and silicon nanowires," *Nature*, 1999, 399:48-51.

Huang, Y. et al., "Directed Assembly of One-Dimensional Nanostructures into Functional Networks," *Science*, 2001, 291:630-633.

Huang, Y. et al., "Gallium Nitride Nanowire Nanodevices," *Nano Letters*, 2002, 2(2):101-104.

Huang, Y. et al., "Logic Gates and Computation from Assembled Nanowire Building Blocks," *Science*, 2001, 294:1313-1317.

IBM News, 2002, downloaded from http://www.ibm.com/news/us/2002//05/20.html.

Jin, S. et al., "Scalable Interconnection and Integration of Nanowire Devices without Registration," *Nano Letters*, 2004, 4(5):915-919.

Johnson, J.C. et al., "Single Gallium nitride nanowires lasers," *Nature Materials*, 2002, 1:106-110.

Joselevich, E. et al., "Vectorial Growth of Metallic and Semiconducting Single-Wall Carbon Nanotubes," *Nano Letters*, 2002, 2(10):1137-1141.

Kanjanachuchai, S. et al., "Coulomb blockade in strained-Si nanowires on leaky virtual substrates," *Semiconductor Science and Technology*, 2000, 16:72-76.

Kong, J. et al., "Chemical vapor deposition of methane for single-walled carbon nanotubes," *Chemical Physical Letters*, 1998, 292:567-574.

Kong, J. et al., "Nanotube Molecular Wires as Chemical Sensors," *Science*, 2000, 287:622-625.

Kong, J. et al., "Synthesis of Individual Sngle-Walled Carbon Nanotubes on Patterned silicon Wafers", *Nature*, vol. 395, Oct. 29, 1998, 878-881.

Lauhon, L.J. et al., "Epitaxial core-shell and core-multishell nanowire heterostructures," *Nature*, 2002, 420:57-61.

Lauhon, L.J. et al., "Semiconductor nanowire heterostructures," *Phil. Trans. R. Soc. Lond. A.*, 2002, 362:1247-1260.

Law, M. et al., "Nanoribbon Waveguides for Subwavelength Photonics Integration," *Science*, Aug. 2004, 305:1269-1273.

Leff, D.V. et al., "Thermodynamic Control of Gold Nanocrystal Size: Experiment and Theory," *J. Phys. Chem.*, 1995, 99:7036-7041.

Lei, B. et al., "Nanowire transistors with ferroelectric gate dielectrics: Enhanced performance and memory effects," *Applied Physics Letters*, May 2004, 84(22):4553-4555.

Lieber, C., "Nanowire Superlattices," *Nano Letters*, Feb. 2002, 2(2):81-82.

Lieber, C.M., "Nanoscale Science and Technology: Building a Big Future from Small Things," *MRS Bulletin*, 2003, 486-491.

Lu, W. et al., "One-dimensional hole gas in germanium/silicon nanowire heterostructures," *PNAS*, 102(29):10046-10051.

Martel, R. et al., "Single- and multi-wall carbon nanotube field-effect transistors," *Appl. Phys. Lett.*, 1998, 73(17):2447-2449.

McAlpine, M.C. et al., "High Performance Nanowire Electronics and Photonics on Glass and Plastic Substrates," *Nano Letters*, 2003, 3(11):1531-1535.

McAlpine, M.C. et al., "High-Performance Nanowire Electronics and Photonics and Nanoscale Patterning on Flexible Plastic Substrates," Proceedings of the IEEE, Jul. 2005, 93(7):1357-1363.

McAlpine, M.C. et al., "Nanoimprint Lithography for Hybrid Plastic Electronics," *Nano Letters*, 2003, 3(4):443-445.

Menon, V.P. et al., "Fabrication and Evaluation of Nanoelectrode Ensembles," Anal. Chem., Jul. 1995, 67(13):1920-1928.

Morales, A.M. et al., "A Laser Ablation Method for the Synthesis of Crystalline Semiconductor Nanowires," *Science*, 1998, 279:208-211.

Padeste, C. et al., "Modular Amperometric Immunosensor Device," 8th Int. Conf. Solid-State Sens., 1995, 487-490.

Patolsky, F. et al., "Electrical detection of single viruses," PNAS, Sep. 2004, 101(39):14017-14022.

Patolsky, F. et al., "Nanowire nanosensors," Materials Today, Apr. 2005, 8:20-28.

Qi, P. et al., "Toward Large Arrays of Multiplex Functionalized Carbon Nanotube Sensors for Highly Sensitive and Selective Molecular Detection," *Nano Letters*, 2003, 3(3):347-351.

Reuckes, T. et al., "Carbon Nanotube-Based Nonvolatile Random Access Memory for Molecular Computing," *Science*, 2000, 289:94-97.

Star, A et al., "Preparation and Properties of Polymer-Wrapped Single-Walled Carbon Nanotubes", Angew. Che.. Inc. Ed. 2001, 40, No. 9, pp. 1721-1725.

Takayama, S. et al., "Patterning cells and their environments using multiple laminar fluid flows in capillary networks," *Proc. Natl. Acad. Sci. USA*, 1999, 96:5545-5548.

Tans, S.J. et al., "Room-temperature transistor based on a single carbon nanotube," *Nature*, 1998, 393:49-52.

Thess et al., "Crystalline Ropes of Metallic Carbon Nanotubes," *Science*, 1996, 273:483-487.

Tiefenauer, L.X. et al., "Towards amperometric immunosensor devices," *Biosensors & Bioelectronics*, 1997, 12(3):213-223.

Tong, L. et al., "Subwavelength-diameter silica wires for low-loss optical wave guiding," *Nature*, Dec. 2003, 426:816-819.

Urban, J. et al., "Single-Crystalline Barium Titanate Nanowires," Adv. Mater., 2003, 15(5):423-426.

Vossmeyer, T. et al., "Combinatorial approaches toward patterning nanocrystals," Journal of Applied Physics, 1998, 84(7):3664-3670.

Wang, J. et al., "Highly Polarized Photoluminescence and Photodetection from Single Indium Phosphide Nanowires," *Science*, 2001, 293:1455-1457.

Wang, N. et al., "$SiO_2$-enhanced synthesis of Si nanowires by laser ablation," *Appl. Phys. Lett.*, 1998, 73(26):3902-3904.

Wang, W.U., "Label-free detection of small-molecule-protein interactions by using nanowire nanosensors," PNAS, 2005, 102(9):3208-3212.

Wei, Q. et al., "Synthesis of Single Crystal Bismuth-Telluride and Lead-Telluride Nanowires for New Thermoelectric Materials," *Mat. Res. Soc. Symp. Proc.*, 2000, 581:219-223.

Whang, D. et al., "Large-Scale Hierarchical Organization of Nanowire Arrays for Integrated Nanosystems," Nano Letters, 2003, 3(9) 1255-1259.

Whang, D. et al., "Nanolithography Using Hierarchically Assembled Nanowire Masks," Nano Letters, 2003, 3(7):951-954.

Wolf, S. et al., "Silicon Processing for the VLSI Era," 2000, 1:12-13.

Wong, S.S. et al., "Covalently functionalized nanotubes as nanometresized probes in chemistry and biology," *Nature*, 1998, 394:52-55.

Wu, Y. et al., "Block-by-Block Growth of Single-Crystalline Si/SiGe Superlattic Nanowires," *Nano Letters*, 2002, 2(2):83-86.

Wu, Y. et al., "Controlled Growth and Structures of Molecular-Scale Silicon Nanowires," Nano Letters, 2004, 4(3):433-436.

Wu, Y. et al., "Single-Crystal metallic nanowires and metal/semiconductor nanowire heterostructures," Nature, 2004, 430:61-65.

Xiang, J., et al., "Ge/Si Nanowire Heterostructures as High-Performance Field-Effect Transistors," Nature, 2006, 441, 489-493.

Yamada, T., "Analysis of submicron carbon nanotube field-effect transistors," *Appl. Phys. Lett.*, 2000, 76(5):628-630.

Yang, P., "Wires on water," Nature, 2003, 425:243-244.

Yu, D.P. et al., "Nanoscale silicon wires synthesized using simple physical evaporation," *Appl. Phys. Lett.*, 1998, 72(26):3458-3460.

Zheng, G. et al., "Multiplexed electrical detection of cancer markers with nanowire sensor arrays," Nature Biotechnology, 2005, 23(10):1294-1301.

Zheng, G. et al., "Synthesis and Fabrication of High-Performance n-Type Silicon Nanowire Transistors," Advanced Materials, 2004, 16(21):1890-1893.

Zhong, Z. et al., "Coherent Single Charge Transport in Molecular-Scale Silicon Nanowires," Nano Letters, 2005, 5(6):1143-1146.

Zhong, Z. et al., "Nanowire Crossbar Arrays as Address Decoders for Integrated Nanosystems," Science, 2003, 302:1377-1379.

Zhong, Z. et al., "Synthesis of p-Type Gallium Nitride Nanowires for Electronic and Photonic Nanodevices," Nano Letters, 2003, 3(3):343-346.

Zhou, G. et al., "Growth morphology and micro-structural aspects of Si nanowires synthesized by laser ablation," *Journal of Crystal Growth*, 1000, 197:129-135.

International Preliminary Examination Report dated Jun. 18, 2003 in PCT/US2001/48230, filed Dec. 18, 2002.

Search Report dated Aug. 29, 2005 in PCT/US2005/004459, filed Feb. 14, 2005.

Written Opinion dated Aug. 29, 2005 in PCT/US2005/004459, filed Feb. 14, 2005.

Search Report dated Nov. 17, 2003 in PCT/US2003/22753, filed Jul. 21, 2003.

Search Report dated Dec. 2, 2003 in PCT/US2003/22061, filed May 20, 2002.

Search Report dated Jun. 6, 2006 in PCT/US2005/026759, filed Jul. 28, 2005.

Written Opinion dated Jun. 6, 2006 in PCT/US2005/026759, filed Jul. 28, 2005.

Search Report dated Apr. 24, 2003 in PCT/US2001/48230, filed Dec. 18, 2002.

Written Opinion dated Apr. 24, 2003 in PCT/US2001/48230, filed Dec. 18, 2002.

Search Report dated Jun. 2, 2006 in PCT/US2005/020974, filed Jun. 15, 2005.

Written Opinion dated Jun. 2, 2006 in PCT/US2005/020974, filed Jun. 15, 2005.

Office Action dated May 16, 2006 in U.S. Appl. No. 09/935,776.

Office Action dated Mar. 21, 2006 in U.S. Appl. No. 10/117,720.

Office Action dated Feb. 23, 2006 in U.S. Appl. No. 10/196,337.

Office Action dated Nov. 29, 2005 in U.S. Appl. No. 10/995,075.

Office Action dated Aug. 30, 2005 in U.S. Appl. No. 10/020,004.

Office Action dated Aug. 30, 2005 in U.S. Appl. No. 09/935,776.

Office Action dated May 25, 2005 in U.S. Appl. No. 10/196,337.

Office Action dated Mar. 14, 2005 in U.S. Appl. No. 10/020,004.

Office Action dated Mar. 11, 2005 in U.S. Appl. No. 09/935,776.

Office Action dated Jan. 30, 2005 in U.S. Appl. No. 10/196,337.

Office Action dated Sep. 15, 2004 in U.S. Appl. No. 09/935,776.

Office Action dated Jun. 30, 2004 in U.S. Appl. No. 10/196,337.

Office Action dated Jun. 25, 2004 in U.S. Appl. No. 10/020,004.

Office Action dated Sep. 2, 2003 in U.S. Appl. No. 09/935,776.

Office Action dated Jan. 15, 2003 in U.S. Appl. No. 10/020,004.

Javey, A., et al., "Ballistic carbon nanotube field-effect transistors," *Nature*, vol. 424, pp. 654-657 (2003).

Mizutani, T., et al., "Fabrication and characterization of carbon nanotube FETs," *Proceedings of SPIE*, vol. 5732, pp. 28-36 (2005).

Musin, R.N., et al., "Structural and electronic properties of epitaxial core-shell nanowire heterostructures," *Physical Review*, vol. 71, pp. 155318-155318-4 (2005).

Nosho, Y., et al., "*n*-type carbon nanotube field-effect transistors fabricated by using Ca contact electrodes," *Applied Physics Letters*, vol. 86, pp. 073105-1-073105-3.

Office Action dated Nov. 2, 2006 in U.S. Appl. No. 10/196,337.

\* cited by examiner

First layer

Second layer

I. DIRECT GROWTH
    (a) DEFINE NANOCLUSTER CATALYST
    (b) INITIAL LCG SEMICONDUCTOR GROWTH
    (c) SECOND LCG SEMICONDUCTOR GROWTH
    (d) REPEAT (b) OR (c) AS DESIRED
II. POST-SYNTHESIS FUNCTIONALIZATION
    (a) FABRICATE NANOWIRE DEVICE
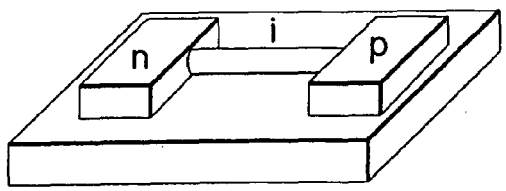
    (b) INTRODUCE DOPANTS BY ANNEALING
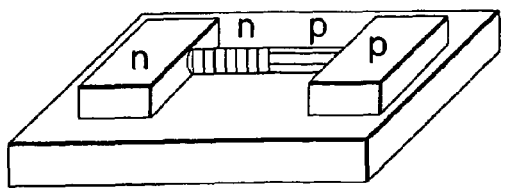
Fig. 8

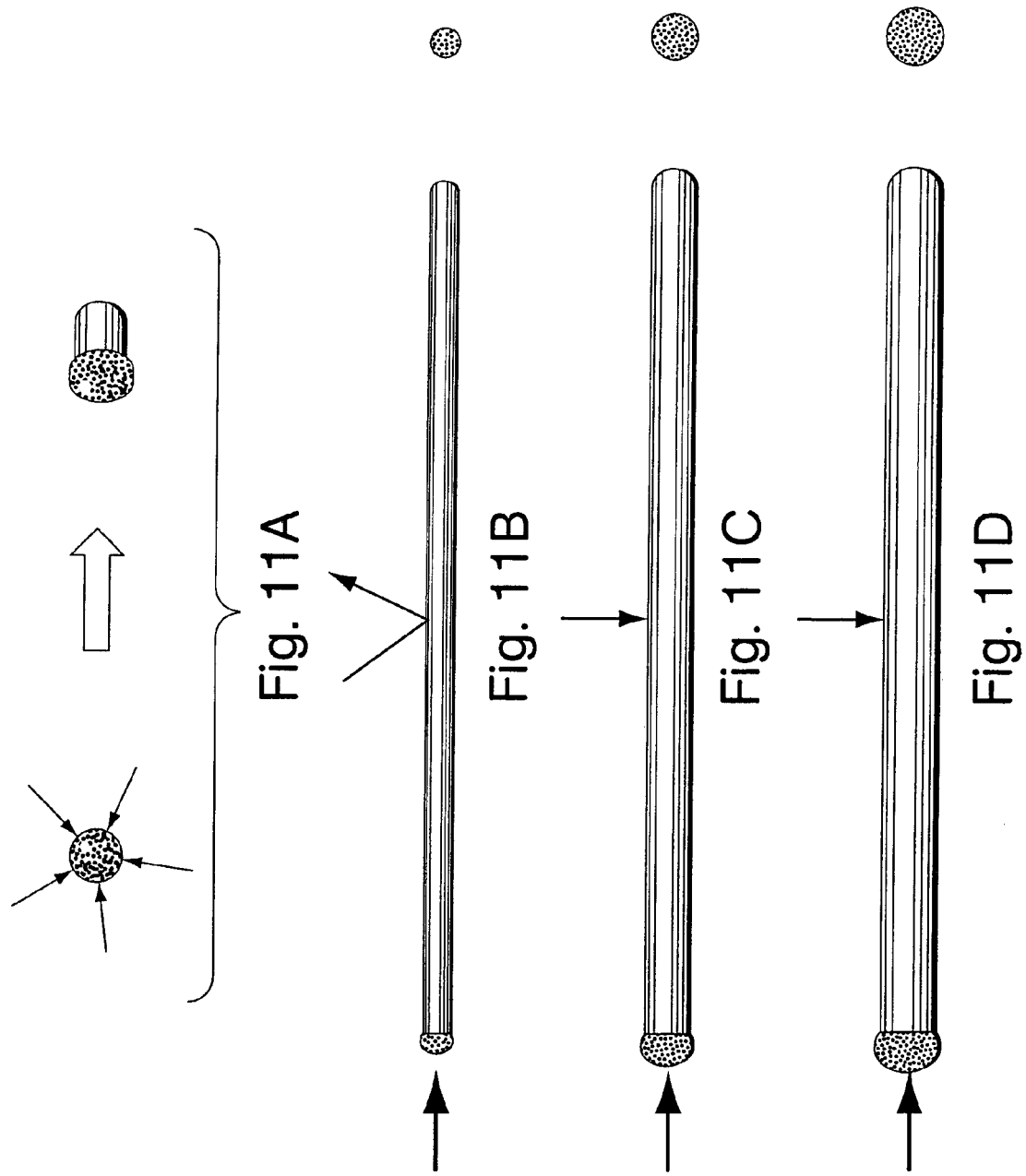

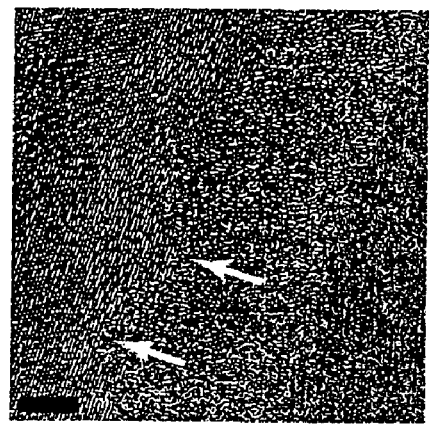
Fig. 12A          Fig. 12B
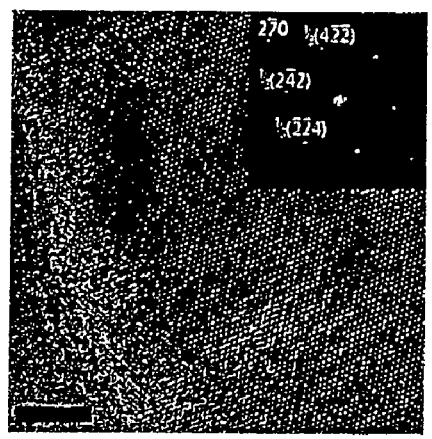
Fig. 12C          Fig. 12D
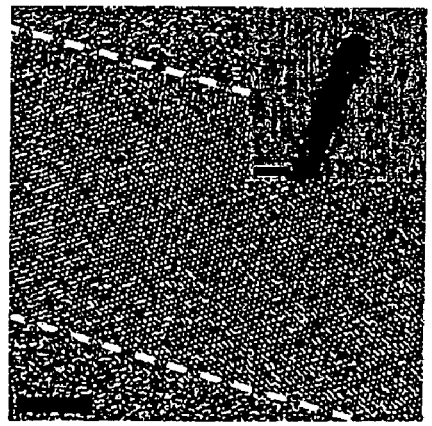
Fig. 12E          Fig. 12F

NANOSCALE COHERENT OPTICAL COMPONENTS

RELATED APPLICATIONS

This application is a continuation-in-part of U.S. Ser. No. 10/624,135, filed Jul. 21, 2003 now abandoned, which claims the benefit under 35 U.S.C. 119(e) of U.S. Provisional Patent Application Ser. No. 60/397,121, filed Jul. 19, 2002, entitled "Nanowire Coherent Optical Components," by C. Lieber, et al. Each application is incorporated herein by reference in its entirety.

FEDERALLY SPONSORED RESEARCH

This invention was sponsored by Air Force Office of Scientific Research Grant No. F49620-00-1-0084, Office of Naval Research Grant Nos. N00014-01-1-0651 and N00014-00-1-0476. The Government has certain rights to the invention.

BACKGROUND

1. Field of the Invention

This invention generally relates to nanotechnology and nanooptoelectronics as well as associated methods and devices. In particular, the invention relates to nanoscale optical components such as electroluminescent devices (e.g., LEDs), amplified stimulated emission devices (e.g., lasers), waveguides, and optical cavities (e.g., resonators). Articles and devices of a size greater than the nanoscale are also included.

2. Description of the Related Art

Interest in nanotechnology, in particular sub-microelectronic technologies such as semiconductor quantum dots and nanowires, has been motivated by the challenges of chemistry and physics at the nanoscale, and by the prospect of utilizing these structures in electronic, optical, and other related devices. Nanoscopic articles may be well-suited for transport of charge carriers and excitons (e.g. electrons, electron pairs, etc.) and thus may be useful as building blocks in nanoscale electronics, optics, and other applications.

SUMMARY OF THE INVENTION

This invention generally relates to nanoscale optical devices, as well as associated methods and devices. For example, at least one embodiment of the present invention is more particularly related to nanoscale lasers. The subject matter of this application involves, in some cases, interrelated products, alternative solutions to a particular problem, and/or a plurality of different uses of a single system or article application involves, in some cases, interrelated products, alternative solutions to a particular problem, and/or a plurality of different uses of a single system or article.

In one aspect, the invention comprises an apparatus. In one embodiment, the apparatus includes at least one nanoscale wire constructed and arranged to generate amplified stimulated emission of radiation based on at least one electric signal applied to the at least one nanoscale wire. In another embodiment, the apparatus includes at least one nanoscale wire constructed and arranged as an optical cavity. The optical cavity includes at least one Bragg grating. In yet another embodiment, the apparatus comprises an electrical injection laser including a single nanoscale wire. In still another embodiment, the apparatus includes at least one nanoscale wire constructed and arranged to generate amplified stimulated emission of radiation based on an optical signal applied to the at least one nanoscale wire. The nanoscale wire is made entirely or in part of at least one material selected from the group consisting of cadmium sulfide (CdS), cadmium selenide (CdSe), zinc selenide (ZnSe), gallium nitride (GaN), and indium phosphide (InP).

The invention, in another aspect, is a multi-wavelength radiation source. The multi-wavelength radiation source includes a first nanoscale wire electrical injection laser constructed and arranged to generate radiation having a first wavelength, and at least one second nanoscale wire electrical injection laser constructed and arranged to generate radiation having a second wavelength different from the first wavelength.

In still another aspect, the invention is an electronic device. The device is defined, at least in part, by a substrate, at least one nanoscale wire electrical injection laser integrated with the substrate, and at least one semiconductor device integrated with the substrate. In another aspect, the invention comprises an optoelectronic device. The device includes a substrate, at least one nanoscale wire electrical injection laser integrated with the substrate, and at least one semiconductor optical device integrated with the substrate.

In a further aspect, the invention is a data storage device. The device includes a memory configured to store data, and at least one nanoscale wire electrical injection laser to process data associated with the memory.

In one aspect, the invention comprises a method of generating amplified stimulated emission of radiation. The method includes the step of applying an electrical signal to a nanoscale wire formed as an optical resonator including at least one p-n junction. The invention, in another aspect, includes a method of generating amplified stimulated emission of radiation. The method is defined, at least in part, by the step of sufficiently injecting charge carriers into a nanoscale wire formed as an optical resonator.

In another aspect, the invention comprises a method of fabricating a nanoscale wire laser. The method includes the steps of forming at least one nanoscale wire into an optical cavity, and forming at least one p-n junction in the optical cavity. In still another aspect, the invention comprises a method of fabricating a nanoscale wire optical cavity. The invention includes the step of forming at least one Bragg grating on at least one nanoscale wire.

In another aspect, the invention is directed to a method of making any of the embodiments described herein. In yet another aspect, the invention is directed to a method of using any of the embodiments described herein.

Other advantages, novel features, and objects of the invention will become apparent from the following detailed description of non-limiting embodiments of the invention when considered in conjunction with the accompanying drawings, which are schematic and which are not intended to be drawn to scale. In the figures, each identical or nearly identical component that is illustrated in various figures typically is represented by a single numeral. For purposes of clarity, not every component is labeled in every figure, nor is every component of each embodiment of the invention shown where illustration is not necessary to allow those of ordinary skill in the art to understand the invention. In cases where the present specification and a document incorporated by reference include conflicting disclosure, the present specification shall control.

BRIEF DESCRIPTION OF THE DRAWINGS

Non-limiting embodiments of the present invention will be described by way of example with reference to the accompanying drawings in which:

FIG. 8 illustrates fabrication techniques;

FIGS. 11A–11D are schematic diagrams of certain core-shell nanoscale wires according to embodiments of the invention;

FIGS. 12A–12G illustrate certain core-shell nanoscale wires according to embodiments of the invention;

DETAILED DESCRIPTION

Figure 1:
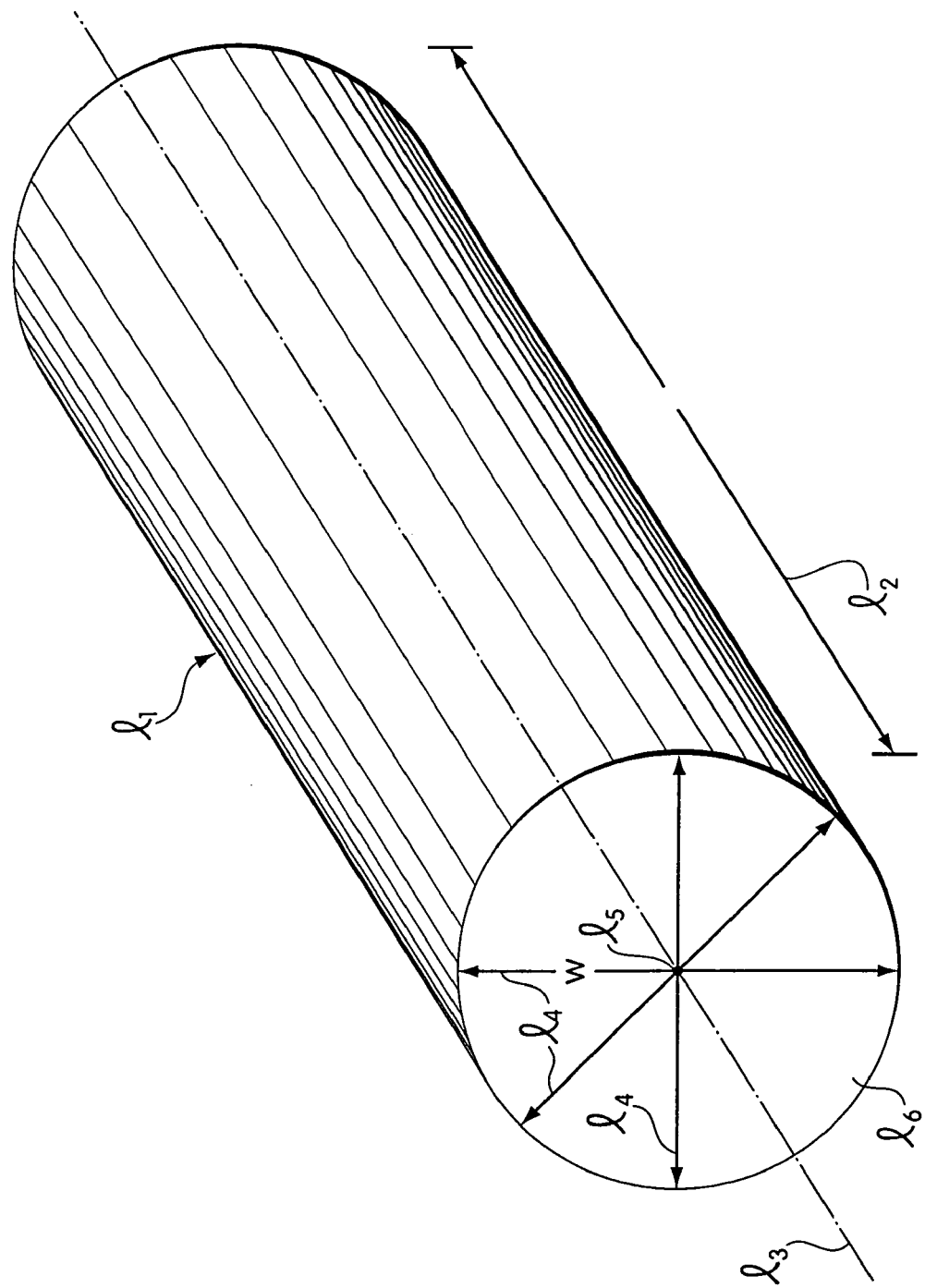
FIG. 1 is a perspective view of an example of a semiconductor article in accordance with an embodiment of the invention.

The following U.S. provisional and utility patent application documents are incorporated herein by reference in their entirety for all purposes: Ser. No. 60/397,121, entitled: "Nanowire Coherent Optical Components," filed Jul. 19, 2002; Ser. No. 60/226,835, entitled, "Semiconductor Nanowires," filed Aug. 22, 2000; Ser. No. 60/254,745, entitled, "Nanowire and Nanotube Nanosensors," filed Dec. 11, 2000 Ser. No. 60/292,035, entitled "Nanowire and Nanotube Nanosensors," filed May 18, 2001 Ser. No. 60/292,121, entitled, "Semiconductor Nanowires," filed May 18, 2001 Ser. No. 60/292,045, entitled "Nanowire Electronic Devices Including Memory and Switching Devices," filed May 18, 2001; Ser. No. 60/291,896, entitled "Nanowire Devices Including Emissive Elements and Sensors," filed May 18, 2001; Ser. No. 09/935,776, entitled "Doped Elongated Semiconductors, Growing Such Semiconductors, Devices Including Such Semiconductors, and Fabricating Such Devices," filed Aug. 22, 2001; Ser. No. 10/020,004, entitled "Nanosensors," filed Dec. 11, 2001; Ser. No. 60/348,313, entitled "Transistors, Diodes, Logic Gates and Other Devices Assembled from Nanowire Building Blocks," filed Nov. 9, 2001; Ser. No. 60/354,642, entitled "Nanowire Devices Including Emissive Elements and Sensors," filed Feb. 6, 2002; Ser. No. 10/152,490, entitled "Nanoscale Wires and Related Devices," filed May 20, 2002. The following International Patent Publications are incorporated herein by reference in their entirety for all purposes: International Patent Publication No. WO 02/17362, published Feb. 28, 2002, entitled "Doped Elongated Semiconductors, Growing Such Semiconductors, Devices Including Such Semiconductors, and Fabricating Such Devices," and International Patent Publication No. WO 02/48701, published Jun. 20, 2002, entitled "Nanosensors." The application entitled "Nanoscale Wires and Related Devices," filed Jul. 16, 2002, Ser. No. 10/196,337, is also incorporated herein by reference in its entirety for all purposes.

This invention generally relates to nanotechnology and nanoelectronics as well as associated methods and devices. In particular, the invention relates to nanoscale optical components such as electroluminescence devices (e.g., LEDs), amplified stimulated emission devices (e.g., lasers), waveguides, and optical cavities (e.g., resonators). Articles and devices of a size greater than the nanoscale are also included. Such devices can be formed from nanoscale wires such as nanowires or nanotubes. In some cases, the nanoscale wire is a single crystal. In one embodiment, the nanoscale laser is constructed as a Fabry-Perot cavity, and is driven by electrical injection. Any electrical injection source may be used. For example, electrical injection may be accomplished through a crossed wire configuration, an electrode or distributed electrode configuration, or a core/shell configuration. The output wavelength can be controlled, for example, by varying the types of materials used to fabricate the device. One or more such nanoscale lasers may also be integrated with other nanoscale components within a device.

In preferred embodiments, devices of the invention may include wires or other components of scale commensurate with nanometer-scale wires, which includes nanotubes and nanowires. In certain embodiments, however, the invention comprises articles that may be greater than nanometer size (e.g., micrometer-sized).

All definitions as used herein are solely for the purposes of this application. These definitions should not necessarily be imputed to other commonly-owned applications, whether related or unrelated to this application.

As used herein, the term "Group" is given its usual definition as understood by one of ordinary skill in the art. For instance, Group II elements include Zn, Cd and Hg; Group III elements include B, Al, Ga, In and Tl; Group IV elements include C, Si, Ge, Sn and Pb; Group V elements include N, P, As, Sb and Bi; and Group VI elements include O, S, Se, Te and Po. Combinations involving more than one element from each group are also possible. For example, a Group II-VI material may include at least one member from Group II and at least one member from Group VI, for example, ZnS, ZnSe, ZnSSe, ZnCdS, CdS, or CdSe. Similarly, a Group III-V material may comprise at least one member from Group III and at least one member from Group V, for example GaAs, GaP, GaAsP, InAs, InP, GaN, AlGaAs, or InAsP. Other dopants may also be included with these materials and combinations thereof, for example, transition metals such as Fe, Co, Te, Au, and the like.

As used herein, "nanoscopic-scale," "nanoscopic," "nanometer-scale," "nanoscale," the "nano-" prefix, and the like generally refer to elements or articles having widths or diameters of less than about 1 µm, preferably less than about 100 nm in some cases. In all embodiments, specified widths can be a smallest width (i.e. a width as specified where, at that location, the article can have a larger width in a different dimension), or largest width (i.e. where, at that location, the article's width is no wider than as specified, but can have a length that is greater).

A "wire" generally refers to any material having a conductivity of any semiconductor or any metal, and in some embodiments may be used to connect two electronic components such that they are in electronic communication with each other. For example, the term "electrically conductive" or a "conductor" or an "electrical conductor" when used with reference to a "conducting" wire or a nanoscale wire, refers to the ability of that wire to pass charge. Preferred electrically conductive materials have a resistivity lower than about $10^{-3}$, more preferably lower than about $10^{-4}$, and most preferably lower than about $10^{-6}$ or $10^{-7}$ $\Omega$m.

A "nanoscopic wire" (also known herein as a "nanoscopic-scale wire" or "nanoscale wire") generally is a wire, that at any point along its length, has at least one cross-sectional dimension and, in some embodiments, two orthogonal cross-sectional dimensions less than 1 µm, preferably less than about 500 nm, preferably less than about 200 nm, more preferably less than about 150 nm, still more preferably less than about 100 nm, even more preferably less than about 70, still more preferably less than about 50 nm, even more preferably less than about 20 nm, still more preferably less than about 10 nm, and even less than about 5 nm. In other embodiments, the cross-sectional dimension can be less than 2 nm or 1 nm. In one set of embodiments, the nanoscale wire has at least one cross-sectional dimension ranging from 0.5 nm to 200 nm. Where nanoscale wires are described having, for example, a core and an outer region, the above dimensions generally relate to those of the core. The cross-section of the elongated semiconductor may have any arbitrary shape, including, but not limited to, circular, square, rectangular, tubular, or elliptical, and may a regular or an irregular shape. The nanoscale wire may be solid or hollow. Any nanoscale wire can be used, including carbon nanotubes, nanorods, nanowires, organic and inorganic conductive and semiconducting polymers, and the like, unless otherwise specified. Other conductive or semiconducting elements that may not be molecular wires, but are of various small nanoscopic-scale dimension, also can be used in some instances, e.g. inorganic structures such as main group and metal atom-based wire-like silicon, transition metal-containing wires, gallium arsenide, gallium nitride, indium phosphide, germanium, cadmium selenide structures. A wide variety of these and other nanoscale wires can be grown on and/or applied to surfaces in patterns useful for electronic devices in a manner similar to techniques described herein involving nanoscale wires, without undue experimentation.

The nanoscale wires should be able to be formed of at least 1 µm, preferably at least 3 µm, more preferably at least 5 µm, and more preferably still at least 10 or 20 µm in length, and preferably are less than about 200 nm, more preferably less than about 100 nm, more preferably less than about 80 nm, and more preferably less than about 50 nm, and more preferably still less than about 25 nm in thickness (height and width). The wires should have an aspect ratio (length to thickness) of at least about 2:1, preferably greater than about 10:1, and more preferably greater than about 1000:1.

As used herein, a "nanotube" (e.g. a carbon nanotube) is generally nanoscopic wire that is hollow, or that has a hollowed-out core, including those nanotubes known to those of ordinary skill in the art. "Nanotube" is abbreviated herein as "NT." Nanotubes are used as one example of small wires for use in the invention and, in preferred embodiments, devices of the invention include wires of scale commensurate with nanotubes.

A "nanowire" (e.g. comprising silicon or an other semiconductor material) (abbreviated herein as "NW") is an elongated semiconductor, i.e., a nanoscale semiconductor. A "non-nanotube nanowire" is any nanowire that is not a nanotube. In one set of embodiments of the invention, a non-nanotube nanowire having an unmodified surface is used in any arrangement of the invention described herein in which a nanowire or nanotube can be used.

Many nanoscopic wires as used in accordance with the present invention are individual nanoscopic wires. As used herein, "individual nanoscopic wires" means a nanoscopic wire free of contact with another nanoscopic wire (but not excluding contact of a type that may be desired between individual nanoscopic wires in a crossbar array). For example, an "individual" or a "free-standing" article may at some point in its life, not be attached to another article, for example, with another nanoscopic wire, or the free-standing article maybe in solution. As one example, typical individual nanotubes can have a thickness as small as about 0.5 nm. This is in contrast to nanotubes produced primarily by laser vaporization techniques that produce high-quality materials, but materials formed as ropes having diameters of about 2 to about 50 nm or more and containing many individual nanotubes (see, for example, Thess, et al., "Crystalline Ropes of Metallic Carbon Nanotubes" *Science* 273:483–486 (1996), incorporated herein by reference in its entirety for all purposes).

As used herein, an "elongated" article (e.g. a semiconductor or a section thereof) is an article for which, at any point along the longitudinal axis of the article, the ratio of the length of the article to the largest width at that point is greater than 2:1. This ratio is termed the "aspect ratio."

In some embodiments, at least a portion of a nanoscopic wire may be a bulk-doped semiconductor. As used herein, a "bulk-doped" article (e.g. an article or a section or region of an article) is an article for which a dopant is incorporated substantially throughout the crystalline lattice of the article, as opposed to an article in which a dopant is only incorporated in particular regions of the crystal lattice at the atomic scale, for example, only on the surface or exterior. For example, some articles such as carbon nanotubes are typically doped after the base material is grown, and thus the dopant only extends a finite distance from the surface or exterior into the interior of the crystal line lattice. It should be understood that "bulk-doped" does not define or reflect a concentration or amount of doping in a semiconductor, nor does it indicate that the doping is necessarily uniform. In particular, in some embodiments, a bulk-doped semiconductor may comprise two or more bulk-doped regions. Thus, as used herein to describe nanoscopic wires, "doped" refers to bulk-doped nanoscopic wires, and, accordingly, a "doped nanoscopic (or nanoscale) wire" is a bulk-doped nanoscopic wire. "Heavily doped" and "lightly doped" are terms the meaning of which is clearly understood by those of ordinary skill in the art.

As used herein, a "width" of an article is the distance of a straight line from a point on a perimeter of the article, through the center of the article, to another point on the perimeter of the article. As used herein, a "width" or a "cross-sectional dimension" at a point along a longitudinal axis of an article is the distance along a straight line that passes through the center of a cross-section of the article at that point and connects two points on the perimeter of the cross-section. The "cross-section" at a point along the longitudinal axis of the article is a plane at that point that crosses the article and is orthogonal to the longitudinal axis of the article. The "longitudinal axis" of an article is the axis along the largest dimension of the article. Similarly, a "longitudinal section" of an article is a portion of the article along the longitudinal axis of the article that can have any length greater than zero and less than or equal to the length of the article. Additionally, the "length" of an elongated article is a distance along the longitudinal axis from end to end of the article. FIG. 1 is a perspective diagram illustrating an example of a cylindrical semiconductor L1, for example, a wire-like semiconductor such as a nanowire. The cylindrical semiconductor L1 has a length L2 and a longitudinal axis L3. At a point L5 along the longitudinal axis L3, the cylindrical semiconductor L1 has a plurality of widths L4 across cross-section L6, where one of the widths L4 is a smallest width at the point L5.

As used herein, a "cylindrical" article is an article having an exterior shaped like a cylinder, but does not define or reflect any properties regarding the interior of the article. In other words, a cylindrical article may have a solid interior or may have a hollowed-out interior. Generally, a cross-section of a cylindrical article appears to be circular or approximately circular, but other cross-sectional shapes are also possible, such as a hexagonal shape. The cross-section may have any arbitrary shape, including, but not limited to, square, rectangular, or elliptical. Regular and irregular shapes are also included.

As used herein, a first article (e.g., a nanoscopic wire or larger-sized structure) "coupled" to a second article is disposed such that the first article either physically contacts the second article or is proximate enough to the second article to influence a property (e.g., an electrical property, an optical property, or a magnetic property) of the second article. The term "electrically coupled" when used with reference to a nanoscopic wire and an analyte or another moiety such as a reaction entity, refers to an association between any of the analyte, other moiety, and the nanoscopic wire such that electrons can move from one to the other, or in which a change in an electrical characteristic of one can be determined by the other. This may include electron flow between these entities, or a change in a state of charge, oxidation state, redox potential, and the like. As examples, electrical coupling can include direct covalent linkage between the analyte or other moiety and the nanoscopic wire, indirect covalent coupling (e.g. via a linking entity), direct or indirect ionic bonding, or other types of bonding (e.g. hydrophobic bonding). In some cases, no actual bonding may be required and the analyte or other moiety may simply be contacted with the nanoscopic wire surface. There also need not necessarily be any contact between the nanoscopic wire and the analyte or other moiety, in embodiments where the nanoscopic wire is sufficiently close to the analyte to permit electron tunneling or other field effects between the analyte and the nanoscopic wire.

As used herein, an "array" of articles (e.g., nanoscopic wires) comprises a plurality of the articles. As used herein, a "crossed array" is an array where at least one of the articles contacts either another of the articles or a signal node (e.g., an electrode).

As used herein, a "single crystal" item (e.g., a semiconductor) is an item that has covalent bonding, ionic bonding, or a combination thereof throughout the item. Such a single crystal item may include defects in the crystal, but is distinguished from an item that includes one or more crystals, not ionically or covalently bonded, but merely in close proximity to one another.

The term "quantum dot" is given its ordinary meaning in the art, and generally refers to semiconductor or metal nanoparticles (for example, a cadmium selenide nanoparticle) that absorb light and re-emit light in a different color. The wavelength of the emitted light may depend on the size of the quantum dot. For example, a 2 nm quantum dot may be able to emit green light, while a 5 nm quantum dot may be able to emit red light.

As used herein, "attached to," in the context of a species relative to another species or to a surface of an article, means that the species is chemically or biochemically linked via covalent attachment, attachment via specific biological binding (e.g., biotin/streptavidin), coordinative bonding such as chelate/metal binding, or the like. For example, "attached" in this context includes multiple chemical linkages, multiple chemical/biological linkages, etc.

The term "fluid" generally refers to a substance that tends to flow and to conform to the outline of its container. Typically, fluids are materials that are unable to withstand a static shear stress. When a shear stress is applied to a fluid, it experiences a continuing and permanent distortion. Typical fluids include liquids and gasses, but may also include free flowing solid particles, viscoelastic fluids, and the like.

The term "sample" can be any cell, tissue, or fluid that can be derived from or originates from a biological source (a "biological sample"), or other similar media, biological or non-biological, and that can be evaluated in accordance with the invention, such as a bodily fluid, environmental matter, water, or the like. A sample can include, but is not limited to, a biological sample drawn from an organism (e.g. a human, a non-human mammal, an invertebrate, a plant, a fungus, an algae, a bacteria, a virus, etc.); a sample drawn from food designed for human consumption, a sample including food designed for animal consumption such as livestock feed, milk; an organ donation sample, a sample of blood destined for a blood supply; a sample from a water supply, and the like. One example of a sample is a sample drawn from a human or animal to determine the presence or absence of a specific nucleic acid sequence.

As used herein, "plurality" means two or more. As used herein, a "set" of items may include one or more of such items. As used herein, the terms "comprising," "including," "carrying," "having," "containing," "involving," and the like are to be understood to be open-ended, i.e., to mean including but not limited to.

The present invention includes, in many embodiments, nanoscopic wires, each of which can be any nanoscopic wire, including nanorods, nanowires, organic and inorganic conductive and semiconducting polymers, nanotubes, semiconductor components or pathways and the like. Other nanoscopic-scale conductive or semiconducting elements that may be used in some instances include, for example, inorganic structures such as Group IV, Group III/Group V, Group II/Group VI elements, transition group elements, or the like, as described below. For example, the nanoscale wires may be made of semiconducting materials such as silicon, indium phosphide, gallium nitride and others. The nanoscale wires may also include, for example, any organic, inorganic molecules that are polarizable or have multiple charge states. For example, nanoscopic-scale structures may include main group and metal atom-based wire-like silicon, transition metal-containing wires, gallium arsenide, gallium nitride, indium phosphide, germanium, or cadmium selenide structures.

The nanoscale wires may include various combinations of materials, including semiconductors and dopants. The following are non-comprehensive examples of materials that may be used as dopants. For example, the dopant may be an elemental semiconductor, for example, silicon, germanium, tin, selenium, tellurium, boron, diamond, or phosphorous. The dopant may also be a solid solution of various elemental semiconductors. Examples include a mixture of boron and carbon, a mixture of boron and $P(BP_6)$, a mixture of boron and silicon, a mixture of silicon and carbon, a mixture of silicon and germanium, a mixture of silicon and tin, or a mixture of germanium and tin.

In some embodiments, the dopant or the semiconductor may include mixtures of Group IV elements, for example, a mixture of silicon and carbon, or a mixture of silicon and germanium. In other embodiments, the dopant or the semiconductor may include a mixture of a Group III and a Group V element, for example, BN, BP, BAs, AlN, AlP, AlAs, AlSb, GaN, GaP, GaAs, GaSb, InN, InP, InAs, or InSb. Mixtures of these may also be used, for example, a mixture of BN/BP/BAs, or BN/AlP. In other embodiments, the dopants may include alloys of Group III and Group V elements. For example, the alloys may include a mixture of AlGaN, GaPAs, InPAs, GaInN, AlGaInN, GaInAsP, or the like. In other embodiments, the dopants may also include a mixture of Group II and Group VI semiconductors. For example, the semiconductor may include ZnO, ZnS, ZnSe, ZnTe, CdS, CdSe, CdTe, HgS, HgSe, HgTe, BeS, BeSe, BeTe, MgS, MgSe, or the like. Alloys or mixtures of these dopants are also be possible, for example, (ZnCd)Se, or Zn(SSe), or the like. Additionally, alloys of different groups of semiconductors may also be possible, for example, a combination of a Group II-Group VI and a Group III-Group V semiconductor, for example, $(GaAs)_x(ZnS)_{1-x}$. Other examples of dopants may include combinations of Group IV and Group VI elements, such as GeS, GeSe, GeTe, SnS, SnSe, SnTe, PbO, PbS, PbSe, or PbTe. Other semiconductor mixtures may include a combination of a Group I and a Group VII, such as CuF, CuCl, CuBr, CuI, AgF, AgCl, AgBr, AgI, or the like. Other dopant compounds may include different mixtures of these elements, such as $BeSiN_2$, $CaCN_2$, $ZnGeP_2$, $CdSnAs_2$, $ZnSnSb_2$, $CuGeP_3$, $CuSi_2P_3$, $Si_3N_4$, $Ge_3N_4$, $Al_2O_3$, $(Al,Ga,In)_2(S,Se,Te)_3$, $Al_2CO$, $(Cu,Ag)(Al,Ga,In,Tl,Fe)(S,Se,Te)_2$ and the like.

For Group IV dopant materials, a p-type dopant may be selected from Group III, and an n-type dopant may be selected from Group V, for example. For silicon semiconductor materials, a p-type dopant may be selected from the group consisting of B, Al and In, and an n-type dopant may be selected from the group consisting of P, As and Sb. For Group III-Group V semiconductor materials, a p-type dopant may be selected from Group II, including Mg, Zn, Cd and Hg, or Group IV, including C and Si. An n-type dopant may be selected from the group consisting of Si, Ge, Sn, S, Se and Te. It will be understood that the invention is not limited to these dopants, but may include other elements, alloys, or materials as well.

Controlled doping of nanoscale wires can be carried out to form, e.g., n-type or p-type semiconductors. One set of embodiments involves use of at least one semiconductor, controllably-doped with a dopant (e.g., boron, aluminum, phosphorous, arsenic, etc.) selected according to whether an n-type or p-type semiconductor is desired. A bulk-doped semiconductor may include various combinations of materials, including other semiconductors and dopants. For instance, the nanoscopic wire may be a semiconductor that is doped with an appropriate dopant to create an n-type or p-type semiconductor, as desired. As one example, silicon may be doped with boron, aluminum, phosphorous, or arsenic. In various embodiments, this invention involves controlled doping of semiconductors selected from among indium phosphide, gallium arsenide, gallium nitride, cadmium selenide. Dopants including, but not limited to, zinc, cadmium, or magnesium can be used to form p-type semiconductors in this set of embodiments, and dopants including, but not limited to, tellurium, sulfur, selenium, or germanium can be used as dopants to form n-type semiconductors from these materials. These materials may define direct band gap semiconductor materials and these and doped silicon are well known to those of ordinary skill in the art. The present invention contemplates use of any doped silicon or direct band gap semiconductor materials for a variety of uses.

Nanotubes that may be used in the present invention include single-walled nanotubes (SWNTs) that exhibit unique electronic, and chemical properties that may be particularly suitable for molecular electronics. Structurally, SWNTs may be formed of a single graphene sheet rolled into a seamless tube with a diameter that may be, for example, on the order of about 0.5 nm to about 5 nm, and a length that can exceed about 10 μm, about 20 μm, or more in some cases. Depending on diameter and helicity, SWNTs may behave as a one-dimensional metal or a semiconductor material, and may also be formed as a mixture of metallic and semiconducting regions. Methods of manufacture of nanotubes, including SWNTs, and characterization are known. Methods of selective functionalization on the ends and/or sides of nanotubes also are known, and the present invention makes use of these capabilities for use in molecular electronics. The basic structural and electronic properties of nanotubes can be used to create connections or input/output signals, and nanotubes have a size consistent with molecular or nanoscopic-scale architecture.

The present invention contemplates, in one aspect, a nanoscale wire, for example, with a smallest width of less than 500 nm, having two or more regions having different compositions. The regions may be positioned radially, as in a core/shell arrangement, or longitudinally from each other. Combinations of these arrangements are also possible. Each regions may have any shape or dimension, as long as at least one of the regions is nanoscopically-sized. For example, the region may have a smallest dimension of less than 1 μm, less than 100 nm, less than 10 nm, or less than 1 nm. In some cases, one or more regions may comprise a single monolayer of atoms ("delta-doping"). In certain cases, the region may be less than a single monolayer thick (for example, if some of the atoms within the monolayer are absent).

As used herein, regions differing in composition may comprise different materials or elements, or may comprise the same materials or elements, but at different ratios or concentrations. Each region may be of any size or shape within the wire, for example, the regions may be adjacently positioned along the longitudinal axis of the nanoscale wire. The junctions may be, for example, a p/n junction, a p/p junction, an n/n junction, a p/i junction (where i refers to an intrinsic semiconductor), an n/i junction, an i/i junction, or the like. The junction may also be a Schottky junction. The junction may also be a semiconductor/semiconductor junction, a semiconductor/metal junction, a semiconductor/insulator junction, a metal/metal junction, a metal/insulator junction, an insulator/insulator junction, or the like. The junction may also be a junction of two materials, a doped semiconductor to a doped or an undoped semiconductor, or a junction between regions having different dopant concentrations. The junction may also be a defected region to a perfect single crystal, an amorphous region to a crystal, a crystal to another crystal, an amorphous region to another amorphous region, a defected region to another defected region, an amorphous region to a defected region, or the like.

More than two regions may be present, and these regions may have unique compositions or may comprise the same compositions. As one example, a wire may have a first region having a first composition, a second region having a second composition, and a third region having a third composition or the same composition as the first composition. Specific non-limiting examples include gallium arsenide/gallium phosphide compositionally modulated superlattices containing from 2 to 21 layers, or n-silicon/p-silicon and n-indium phosphide/p-indium phosphide modulation doped nanoscale wires.

Figure 15A:
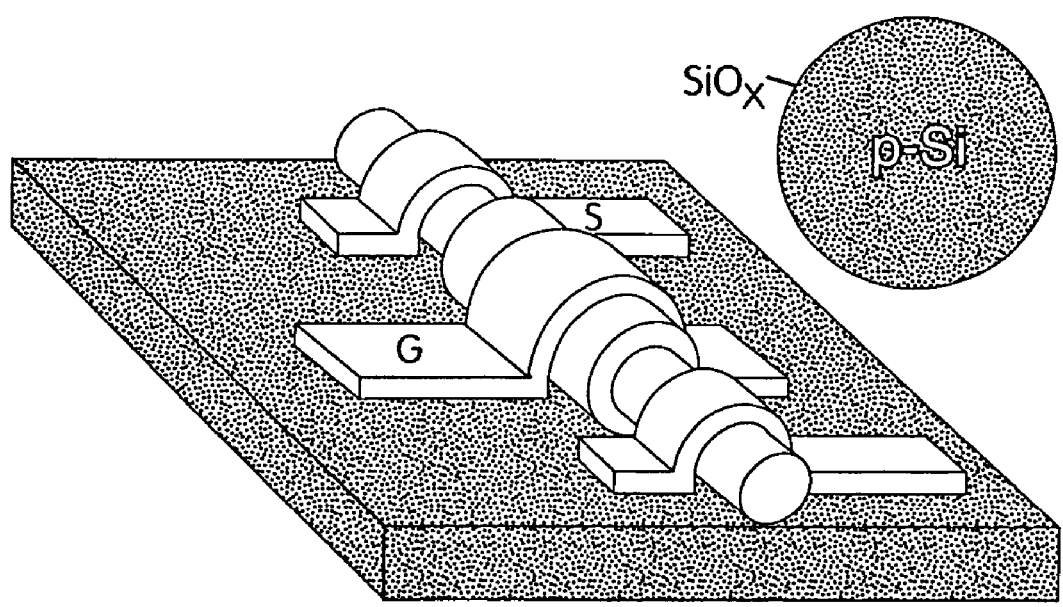
FIGS. 15A–15C illustrate certain nanoscale transistors according to embodiments of the invention.
Figure 15B:
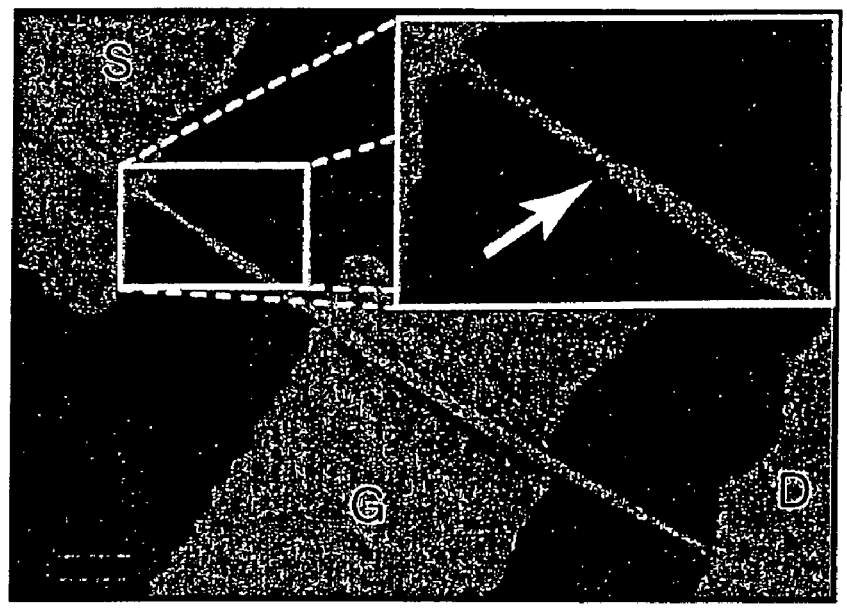
Figure 15C:
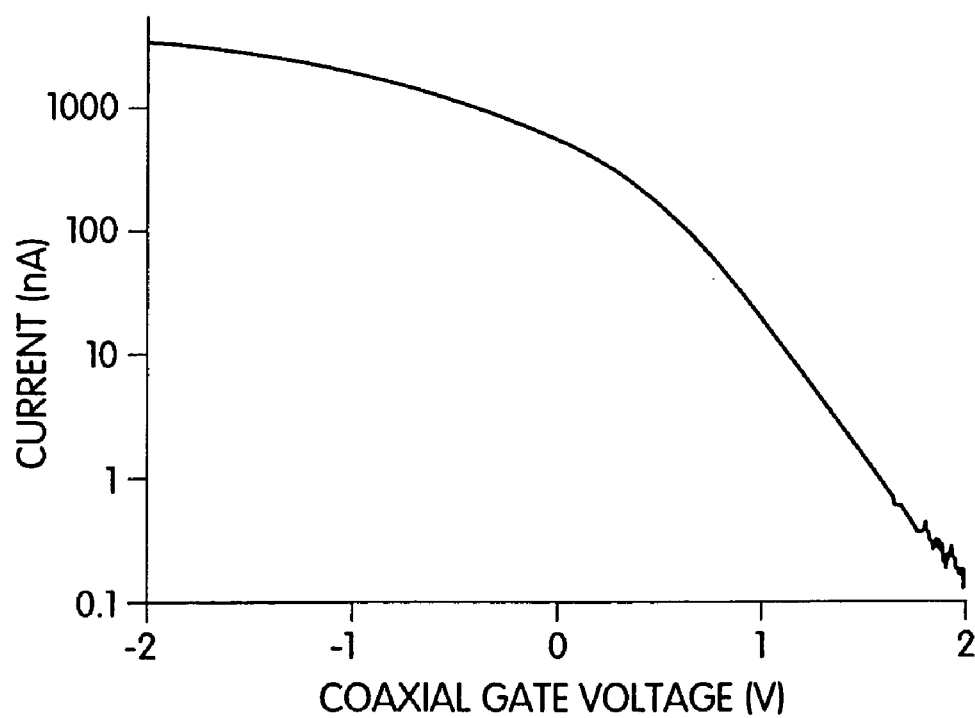

The regions of the nanoscale wire may be distinct from each other with minimal cross-contamination, or the composition of the nanoscale wire may vary gradually from one region to the next. The regions may be both longitudinally arranged relative to each other, or radially arranged (e.g., as in a core/shell arrangement) on the nanoscale wire. As one example, the nanoscale wire may have multiple regions of alternating semiconductor materials arranged longitudinally, each having a segment length of about 500 nm. In another example, a nanoscale wire may have two regions having different compositions arranged longitudinally, surrounded by a third region or more having a composition different from that of the other regions. As a specific example, the regions may be arranged in a layered structure within the nanoscale wire, and one or more of the regions may be delta-doped or partially delta-doped. One example of a nanoscale wire having a series of regions positioned both longitudinally and radially relative to each other is shown in FIG. 15a. FIG. 15 illustrates one specific embodiment in which a nanowire arrangement includes at least one portion (at least the core, as illustrated), that is constant in composition along its length, and includes at least two shell portions, arranged longitudinally relative to each other, each of which is radially arranged relative to the core, each differing from the other in composition. The arrangement can include a core that differs in composition along its length (changes in composition or concentration longitudinally). The shell portions can be adjacent each other (contacting each other, or defining a change in composition or concentration of a unitary shell structure longitudinally), or can be separated from each other by, for example, air (as illustrated), an insulator, a fluid, or an auxiliary, non-nanowire component. The shell portions can be positioned directly on the core, or can be separated from the core by one or more intermediate shells portions that can themselves be consistent in composition longitudinally, or varying in composition longitudinally. That is, the invention allows the provision of any combination of a nanowire core and any number of radially-positioned shells (e.g., concentric shells), where the core and/or any shells can vary in composition and/or concentration longitudinally, any shell sections can be spaced from any other shell sections longitudinally, and different numbers of shells can be provided at different locations longitudinally along the structure.

In some embodiments, the junction between two differing regions (e.g., between different longitudinal regions of a core or shell, or between a core and shell, or between two different shells) may be "atomically-abrupt," where there is a sharp transition at the atomic scale between two adjacent regions that differ in composition. However, in other embodiments, the junction between two differing regions may be more gradual. For example, the "overlap region" between the adjacent regions may be a few nanometers wide, for example, less than about 10 nm, less than about 20 nm, less than about 40 nm, less than about 50 nm, less than about 100 nm, or less than about 500 nm. In certain embodiments, the overlap region between a first region having a composition and a second region having a composition different from the first region (i.e., different concentrations or different species) can be defined as the distance between where the composition of the overlap region ranges between about 10 vol % and about 90 vol % of the composition of the first region, with the remainder having a complementary amount of the composition of the second region. In certain embodiments of the invention, nanoscale wires having more than one junction between two regions having different compositions are also contemplated. For example, a nanoscale wire may have 2, 3, 4, or more overlap regions. The number of periods and the repeat spacing may be constant or varied during growth.

In some embodiments, a gradual change in composition between two adjacent regions may relieve strain and may enable the defect free junctions and superlattices. However, in other embodiments, atomically-abrupt interfaces may be desirable, for example, in certain photonic and electronic applications. The nature of the interface between the two adjacent regions may be controlled by any suitable method, for example, by using different nanocluster catalysts or varying the growth temperature when reactants are switched during synthesis. Nanoscale wires having atomically abrupt regions may be fabricated, for example, by reducing the diameter of the nanoscale wire, for example, by reducing the size of the starting nanocluster, or by controlling exposure of the growing wire to dopant gases, for example, by selectively purging or evacuating the region surrounding the wire between different gas exposures or reaction conditions. All of these embodiments can be provided with one, or multiple shells. These shells can be of the same or different composition relative to each other, and any of the shells can be of the same composition of a segment of the core, or of a different composition, or can contain the same or different concentration of a dopant as is provided in a section of the core. The shells may be grown using any suitable growth technique, for example, including the techniques described herein, such as CVD or LCG.

Certain devices of the invention make particular use of adjacent regions having different compositions within a nanoscale wire, for example, p-type and n-type semiconductor regions. A p/n junction may be defined by at least one n-type semiconductor and at least one p-type semiconductor positioned adjacent to each other within the nanoscale wire, where at least one portion of each region contacts at least one portion of the other region, and each semiconductor including portions that do not contact the other component.

In various embodiments, this invention also involves controlling and altering the doping of semiconductors in a nanoscale wire. In certain embodiments, the nanoscale wires may be produced using techniques that allow for direct and controlled growth of the nanoscale wires. The direct growth of doped nanoscale wires may eliminate the need to use lithographic steps during production of the nanoscale wire, thus facilitating the "bottom-up" assembly of complex functional structures.

As illustrated in FIG. 8, fabrication paradigms for single nanoscale wire devices that are contemplated in the present invention include, but are not limited to, direct fabrication of nanoscale wire junctions during synthesis, or doping of nanoscale wires via post-synthesis techniques (e.g., annealing of dopants from contacts or solution-processing techniques). The dopants may be changed at any point during the growth of the nanoscale wire.

In one aspect, the invention includes a nanoscale optical component. As used herein, an "optical component" is a component constructed and arranged in such a way as to be able to produce or affect light, as further described below.

In one set of embodiments, the optical component is able to produce light under certain conditions. In one embodiment, the optical component is a laser, such as an electrically-driven laser. In other embodiments, the optical component may be a waveguide, a cavity or resonator, or an amplifier. In one set of embodiments, the nanoscale component may be made from a single semiconductor nanoscale wire, for example, for use in an integrated electrically-driven photonic device. The component may be a single crystal in certain embodiments of the invention. Different materials may also be combined to achieve desired device function in some cases. A nanoscale wire may also function as a stand-alone optical cavity or a gain medium, and in some cases, it may function as a combination of a stand-alone optical cavity and a gain medium.

In one embodiment, the optical component is any structure able to generate amplified stimulated emission of electromagnetic radiation, for example, a laser. As used herein, a "laser" is given its ordinary meaning, i.e., a device able to emit amplified and coherent electromagnetic radiation having one or more discrete frequencies, typically in response to an electrical or an optical stimulus (e.g., incident light, or "stimulation" light). The emitted light may have any frequency or wavelength, for example, in the ultraviolet, visible, or infrared wavelengths. Within the laser, atoms may be excited into a metastable "excited" energy state (for example, due to electrical stimulation), such that these excited atoms decay to a lower energy level, releasing photons. Thus, a coherent beam of radiation may be produced within the laser. Any suitable lasing mechanism may be used within the invention.

The optical component may be "optically-driven" in some embodiments of the invention to generate amplified stimulated emission of radiation. As used herein, "optically-driven" refers to components powered by an external optical or electromagnetic radiation source. In an optically-driven device, electromagnetic radiation is injected into a cavity region of the device where the atoms are to be excited. The electromagnetic radiation source may be any suitable source, for example, a flash tube, a diode, or another laser.

Figure 19A:
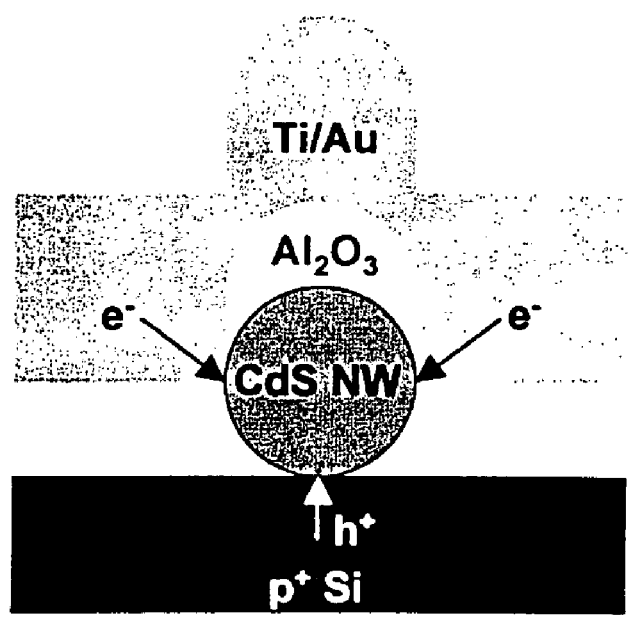
FIGS. 19A–19E illustrate another electrical injection nanoscale laser in another embodiment of the invention.

The optical component may also be "electrically-driven" in some embodiments of the invention to generate amplified stimulated emission of radiation. As used herein, "electrically-driven" refers to components powered by an external electrical source. In an electrically-driven device, charge is injected into the device (including (n-type) electrons or (p-type) "holes") ("electrical injection"), for example, into a cavity region where atoms are to be excited. Electricity may be supplied to the component using any suitable technique, for example, using a crossed wire configuration, by injecting charge from another region of the nanoscale wire (for example, from a shell region to the core region or vice versa, or from a second longitudinally positioned region), from an electrode or a redox species located externally of the nanoscale wire, from an electric or a magnetic field surrounding the nanoscopic wire, from a substrate that contacts the nanoscale wire (e.g., longitudinally as shown in FIG. 19a, in more than one location, etc.). The shell region may be complete or a partially complete shell, as previously described. Combinations of these techniques are also envisioned.

One embodiment of the invention employs an optical cavity, for example, a Fabry-Perot cavity or resonator. The Fabry-Perot cavity, as is understood by those of ordinary skill in the art, makes use of multiple reflections between two reflective surfaces to amplify electromagnetic radiation based on constructive interference. The Fabry-Perot cavity is excited using an electrical source supplied to the nanoscale wire, which, based on electrical injection, creates photons within the cavity.

The reflective surfaces found on the nanoscale wire to create the Fabry-Perot cavity may be created by any suitable technique, for example, by cleaving the ends of the nanoscopic wires (e.g., along the [001] growth axis). In one embodiment, the nanoscale wire may be cleaved by solution phase sonication. The cleaved ends can function as two reflecting mirrors that define the Fabry-Perot optical cavity. The reflective surfaces can also be created by forming a junction between a first region and a second region within the nanoscopic wire where the regions have different compositions that causes reflection, by coating the ends of the nanoscopic wire with a partially reflective coating, or by placing the nanoscopic wire within a medium such that the interface between the nanoscopic wire and the medium creates a partially reflective surface. Additionally, different techniques may be used to create partially reflective surfaces on different ends of the nanoscopic wire. In one set of embodiments, Bragg gratings may be prepared, e.g. at one end of a nanoscale wire (or both ends), or at various locations within a wire, for example through axial composition modulation, or the core-shell nanowire structures may be used to enable uniform injection of charge into the active medium or cavity.

The frequency of the generated electromagnetic radiation can be dependent on the composition of the nanoscale wire. Various dopants can be incorporated into the nanoscale wire to alter the wavelength of the emitted radiation. Additionally, the intensity of the emitted radiation may be separately controlled, for example, by controlling the parameters of the electrical energy supplied to the component. The electrical energy can be controlled as desired, for example, based on current or voltage, or to create a specific intensity or intensity profile, and can vary in time.

In another set of embodiments, the optical component is a waveguide or an amplifier. Light entering a nanoscopic wire may be directed from one end of the wire to the other end. In one embodiment, the nanoscopic wire is able to function as a single mode optical waveguide based on the equation $1 \sim (\pi D/\lambda)(n_1^2 - n_0^2)^{0.5} < 2.4$, where D is the diameter of the nanoscopic wire and $n_0$ is the refractive index of the surrounding medium.

As discussed above, in one embodiment, the nanoscale wire is a single crystal. In some embodiments, a single crystal structure may have more efficient electrical transport along the wire, or may exhibit less electrical resistance. The single crystal structure may also promote coherency of the emitted light, or reduce the amount of light scattering that takes place, for example due to grain boundaries within the component. A defect-free structure, such as is found in a free-standing semiconductor nanowire comprising single crystal, may also exhibit efficient electrical transport. In one embodiment, a free-standing semiconductor nanowire may be prepared as a single crystal with controlled diameters, for example, via metal nanocluster catalyzed growth, as described herein.

In another embodiment, a device of the invention comprises two or more crossed nanoscopic wires. Crossed wire junctions may be defined by at least two different nanoscopic wires, at least one portion of each wire contacting at least one portion of the other wire, and each nanoscopic wire including portions that do not contact the other component. The wires can be arranged by pre-doping the nanoscale wires, then bringing them into proximity with each other.

Figure 18A:
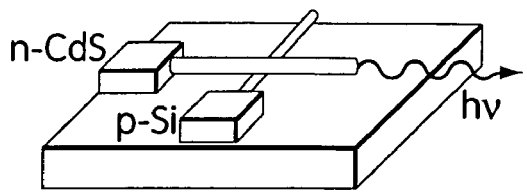
FIGS. 18A–18J illustrate an electrical injection nanoscale laser in one embodiment of the invention.

In the example device shown in FIG. 18A, one wire represents the component itself (for example, a Fabry-Perot optical cavity), while electrical energy is introduced into the device through the other nanowire. Charge can then be injected into the device through the supply nanoscale wire.

In another embodiment where the nanoscopic wire has a shell and a core, where the core represents the coherent optical component, charge may be supplied to the nanoscale optical device through the shell region. Conversely, charge may be supplied to the shell region through the core region in embodiments where the shell region is a coherent optical component. As one example, a shell region carrying charge may be in direct contact with the core region. The shell region may be adjacent to the core region, or the shell region may be insulated by or separated by one or more other layers (e.g., an inert layer) within the nanoscale wire. Electrical energy may be supplied to the nanoscopic wire by any suitable technique, as described above. For example, electrical energy may be supplied through external contacts, through electrodes in electronic communication with the nanoscale wire, or through other nanoscale wires placed in electrical contact with the shell.

Figure 9A:
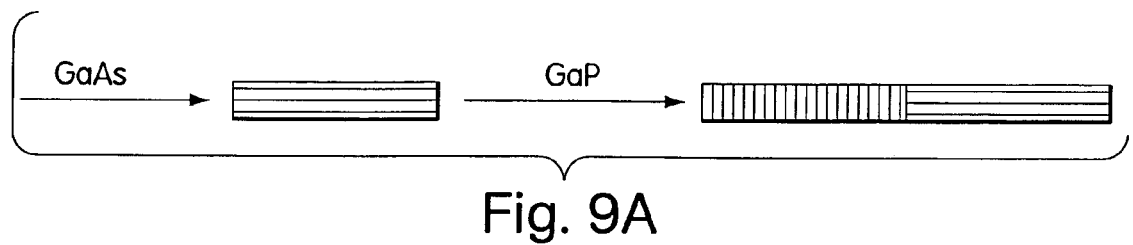
FIGS. 9A–9C illustrate data from one embodiment of the invention.
Figure 9B:
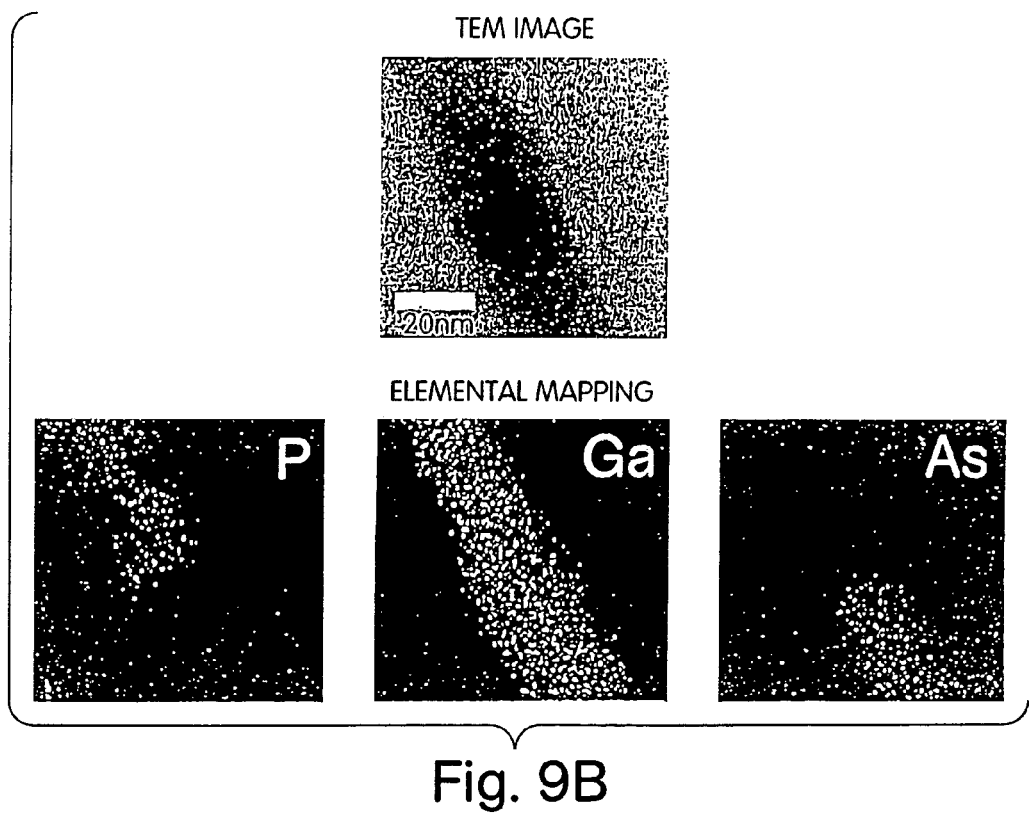
Figure 9C:
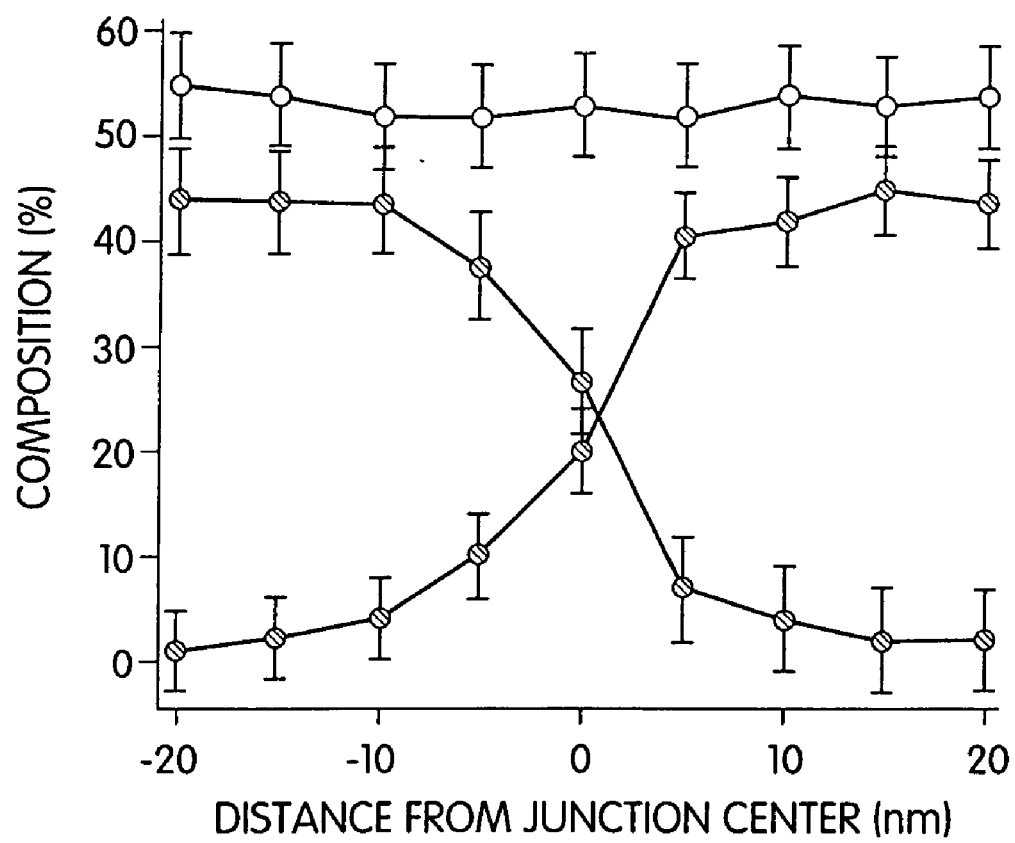
Figure 10A:
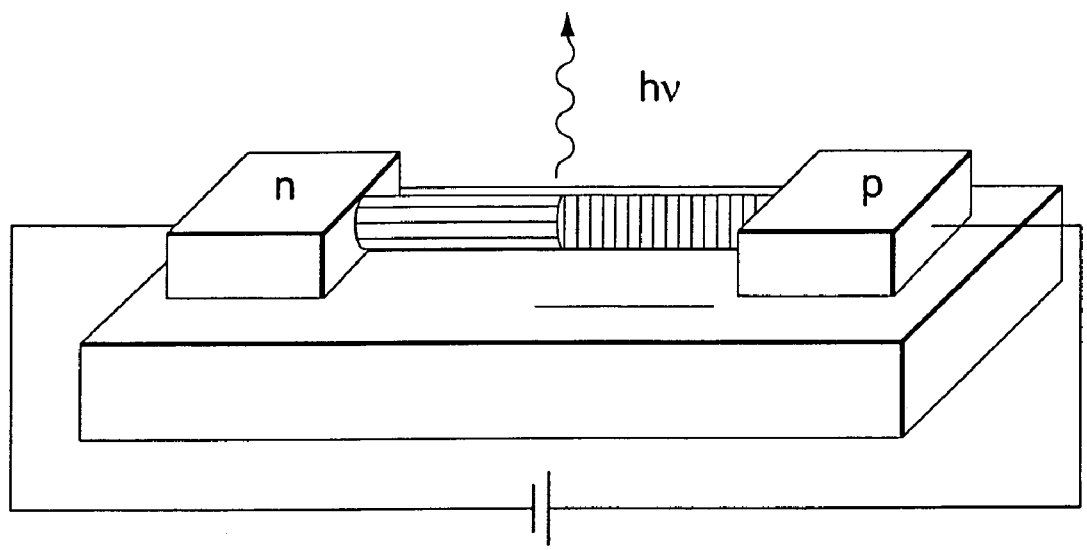
FIGS. 10A–10D illustrate data from one embodiment of the invention.
Figure 10B:
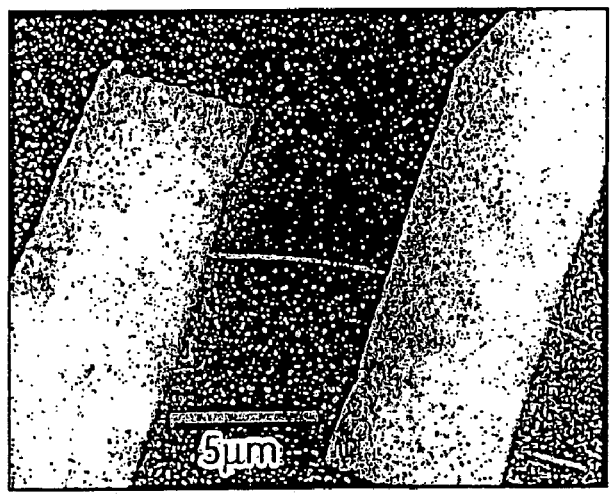
Figure 10C:
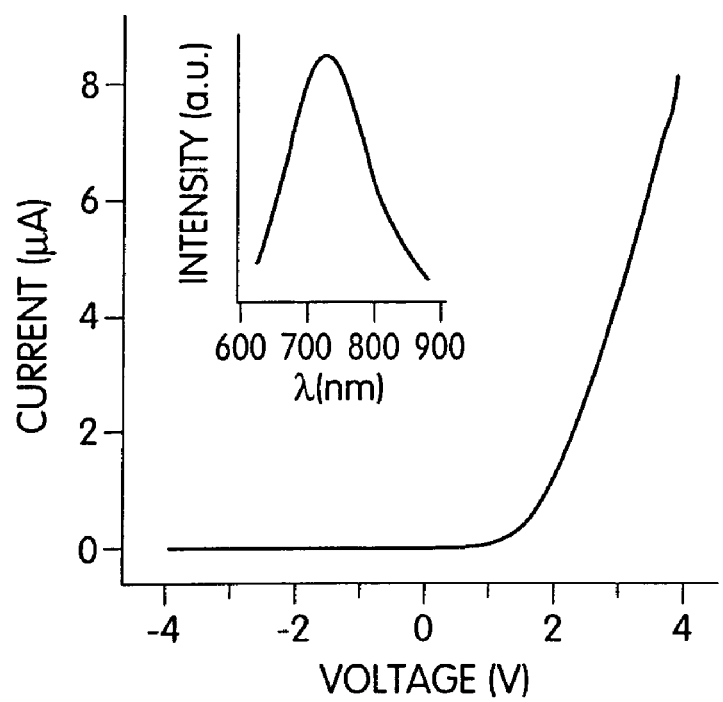
Figure 10D:
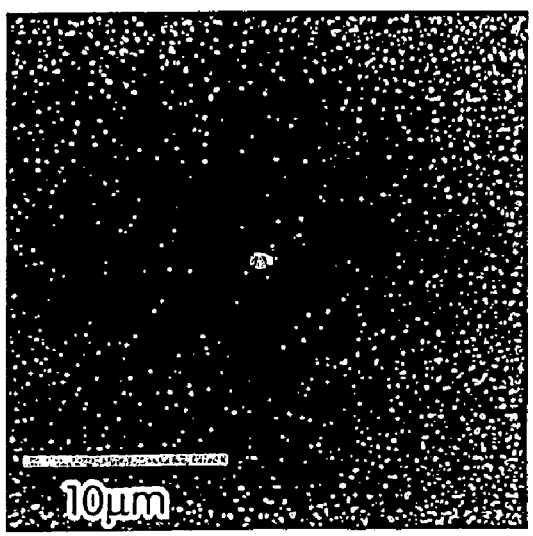

One technique for direct fabrication of nanoscale wires is generally referred to as laser catalytic growth ("LCG"). This methodology also allows the direct formation of adjacent regions having different compositions within a nanoscale wire, such as a p/n junction, and/or adjacent regions differing in concentration of a particular element or composition. LCG also allows the creation of semiconductor superlattices, in which multiple layers of different composition are grown, which may give rise to a one-dimensional analog of multiple quantum states that are well known from thin-film studies. In LCG, a nanoparticle catalyst is used during growth of the nanoscale wire, which may be further subjected to different semiconductor reagents during growth. Alteration of the semiconductor reagents may allow for the formation of abrupt or gradual changes in the composition of the growing semiconductor material, allowing heterostructured materials to be synthesized. One example of an LCG-grown semiconductor is depicted in FIG. 9, where a GaP/GaAs heterojunction within a single 20 nm nanowire is shown. An initial growth of GaAs, followed by subsequent GaP growth, gives an abrupt junction within a single nanowire, as is shown from transmission electron microscopy ("TEM") elemental mapping.

A technique of post-synthetic doping of nanoscale wires is illustrated in FIG. 10. In this figure, a nanoscale wire having a substantially homogeneous composition is first synthesized, then is doped post-synthetically with various dopants as is discussed below. For example, in FIG. 10, a p/n junction was created by introducing p-type and an n-type dopants down on a single nanoscale wire. The p/n junction was then further annealed to allow the dopants to migrate further into the nanoscale wire to form a bulk-doped nanoscale wire.

As one example, the nanoscale wire may be doped during growth of the nanoscale wire. Doping the nanoscale wire during growth may result in the property that the doped nanoscale wire is bulk-doped. Furthermore, such doped nanoscale wires may be controllably doped, such that a concentration of a dopant within the doped nanoscale wire can be controlled and therefore reproduced consistently, making possible the commercial production of such nanoscale wires. Additionally, the dopant may be systematically altered during the growth of the nanoscale wire, for example, so that the final nanoscale wire has a first doped region and a second doped region differing in composition from the first doped region; for example, the second doped region may comprise a second dopant different from the first dopant, or the second doped region may comprise the first dopant but at a different concentration than the first doped region.

Figure 2:
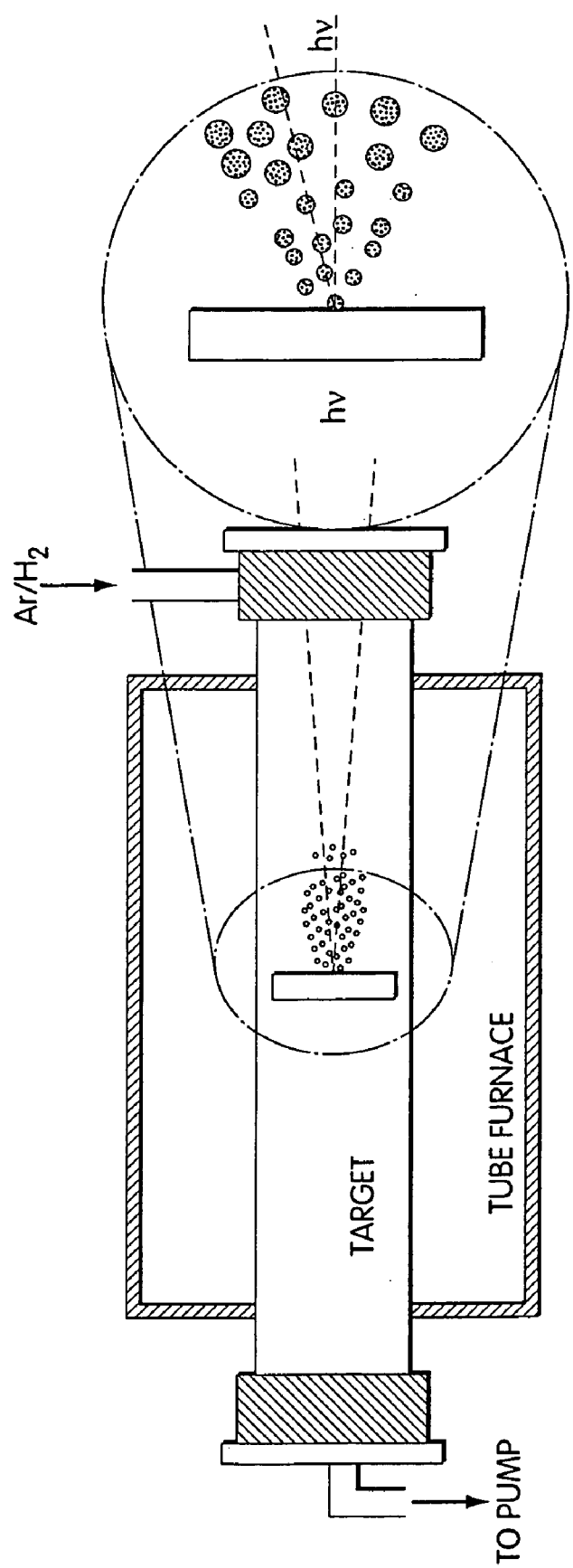
FIG. 2 is a simplified schematic diagram of an example of a laser assisted catalytic growth process for fabrication of semiconductors.
Figure 3:
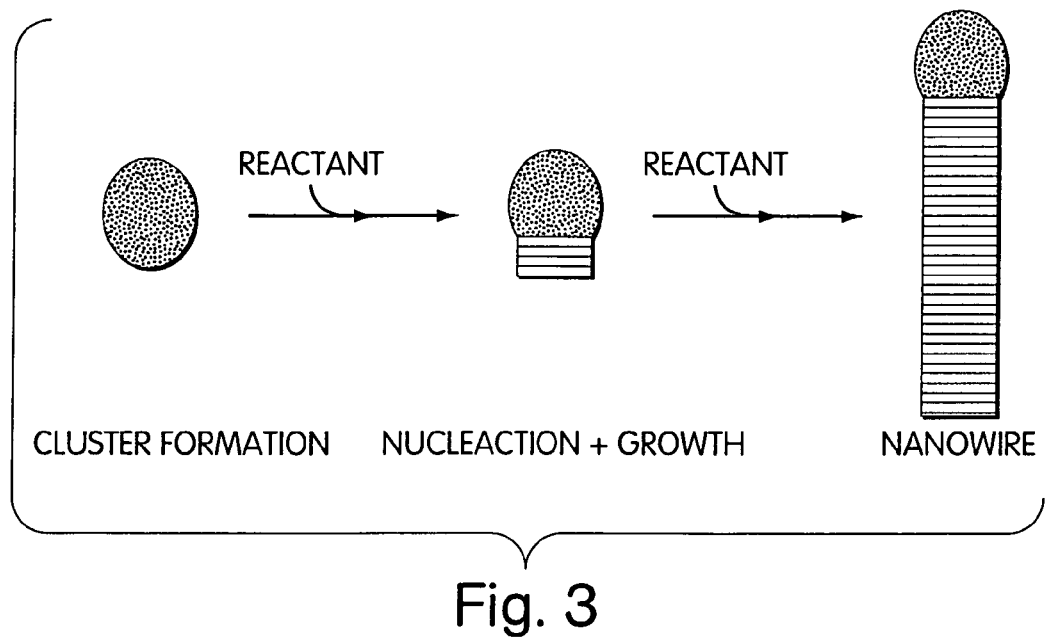
FIG. 3 is a schematic diagram that illustrates nanoscopic wire growth.

In some embodiments, laser catalytic growth techniques ("LCG") may be used to controllably introduce dopants during vapor phase growth of nanoscale wires. As shown in FIGS. 2 and 3, laser vaporization of a composite target composed of a desired material (e.g. silicon or indium phosphide) and a catalytic material (e.g. gold) may create a hot, dense vapor. The vapor may condenses into liquid nanoclusters through collision with a buffer gas. Growth may begin when the liquid nanoclusters become supersaturated with the desired phase and can continue as long as reactant is available. Growth may terminate when the nanoscale wire passes out of the hot reaction zone or when the temperature is decreased.

In LCG, vapor phase semiconductor reactants required for nanoscale wire growth may be produced by laser ablation of solid targets, vapor-phase molecular species, or the like. To create a single junction within a nanoscale wire, the addition of the first reactant may be stopped during growth, and then a second reactant may be introduced for the remainder of the synthesis. Repeated modulation of the reactants during growth is also contemplated, which may produce nanoscale wire superlattices. LCG also may require a nanocluster catalyst suitable for growth of the different superlattice components, for example, a gold nanocluster catalyst can be used in a wide-range of III-V and IV materials. Nearly monodisperse metal nanoclusters may be used to control the diameter, and, through growth time, the length various semiconductor nanoscale wires.

Figure 12G:
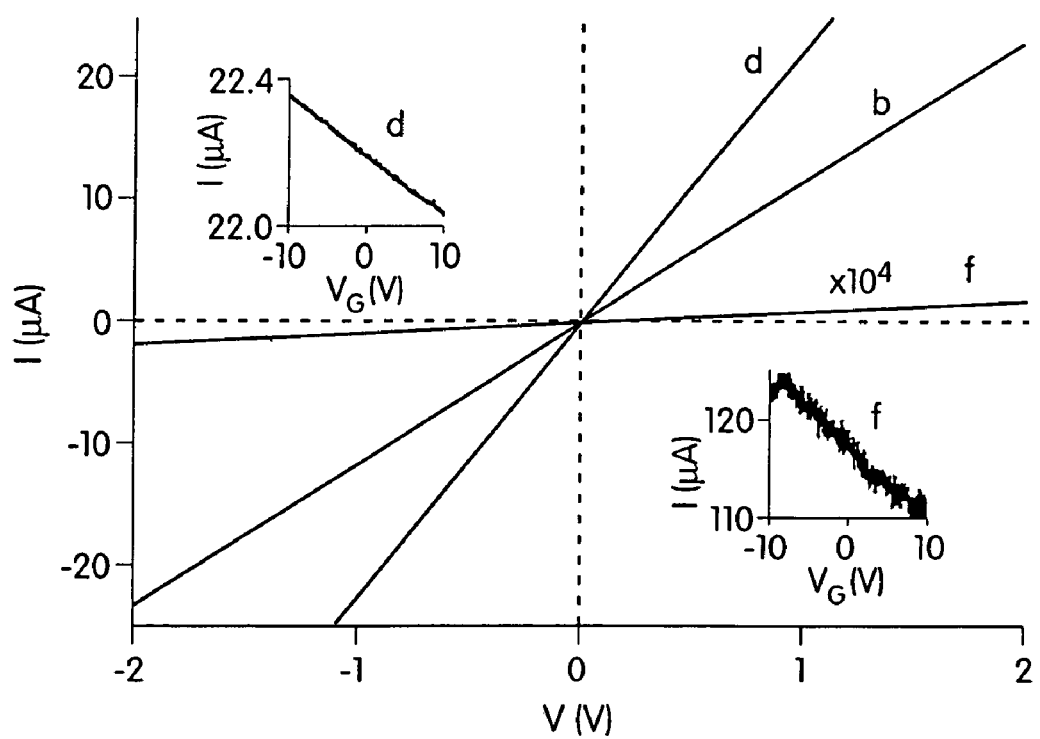
Figure 13A:
FIGS. 13A–13G illustrate certain nanoscale wires according to embodiments of the invention, comprising germanium or silicon.
Figure 13B:
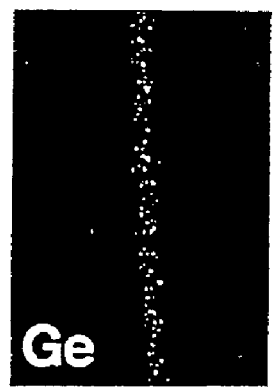
Figure 13C:
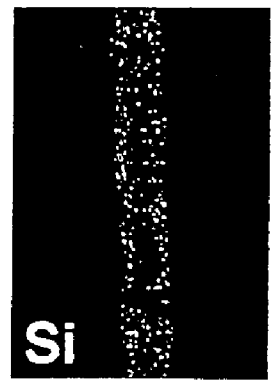
Figure 13D:
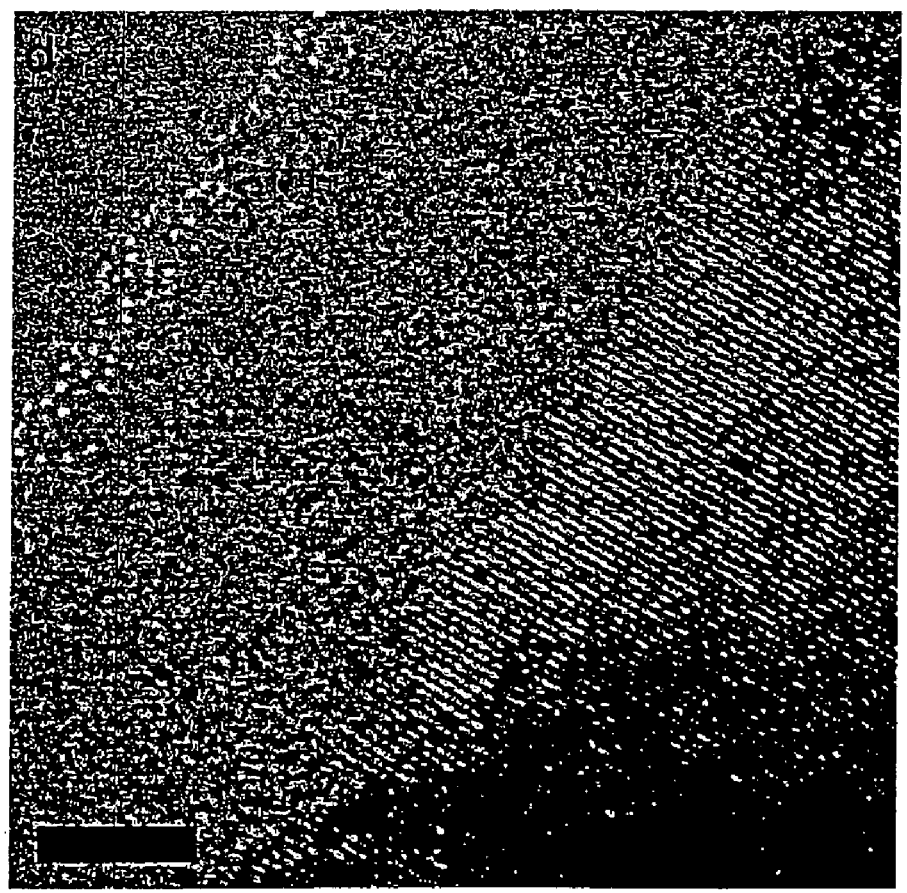
Figure 13E:
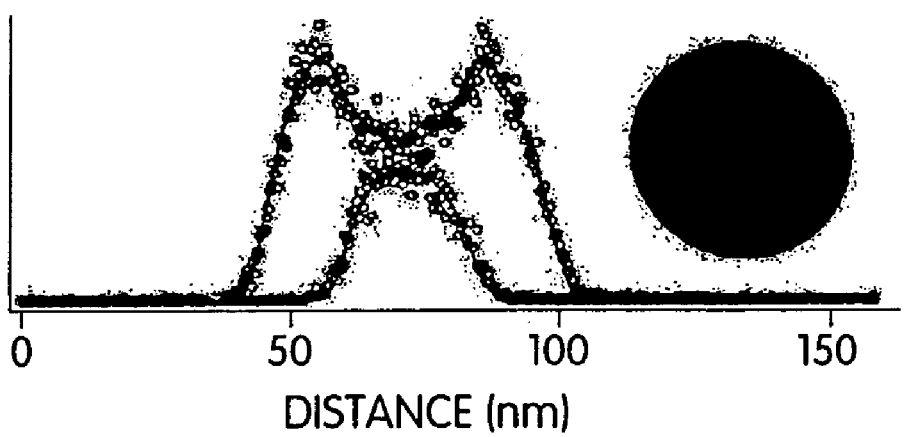
Figure 13F:
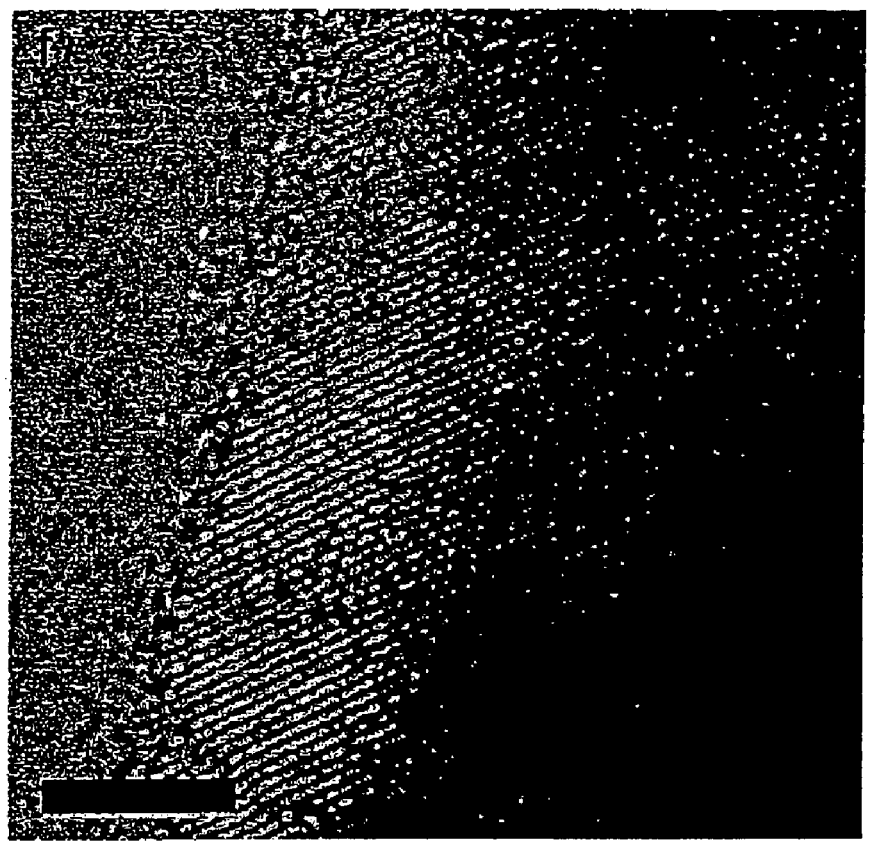
Figure 13G:
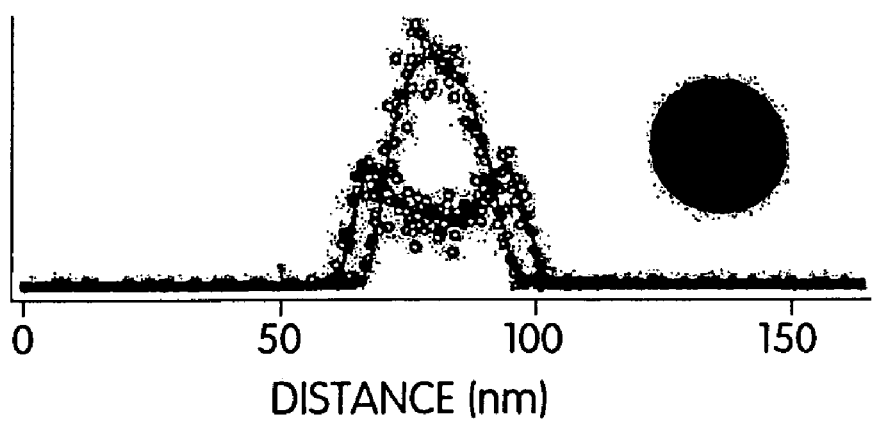
Figure 14A:
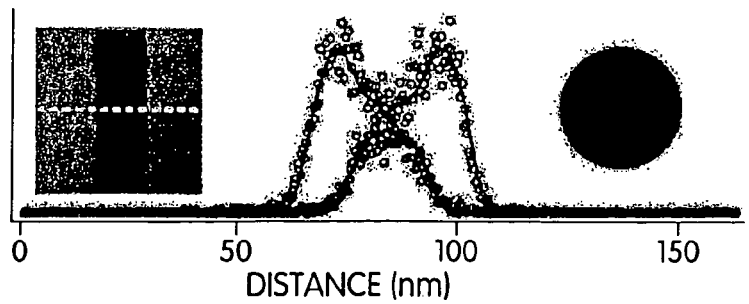
FIGS. 14A–14C illustrate certain core-shell nanoscale wires according to embodiments of the invention.
Figure 14B:
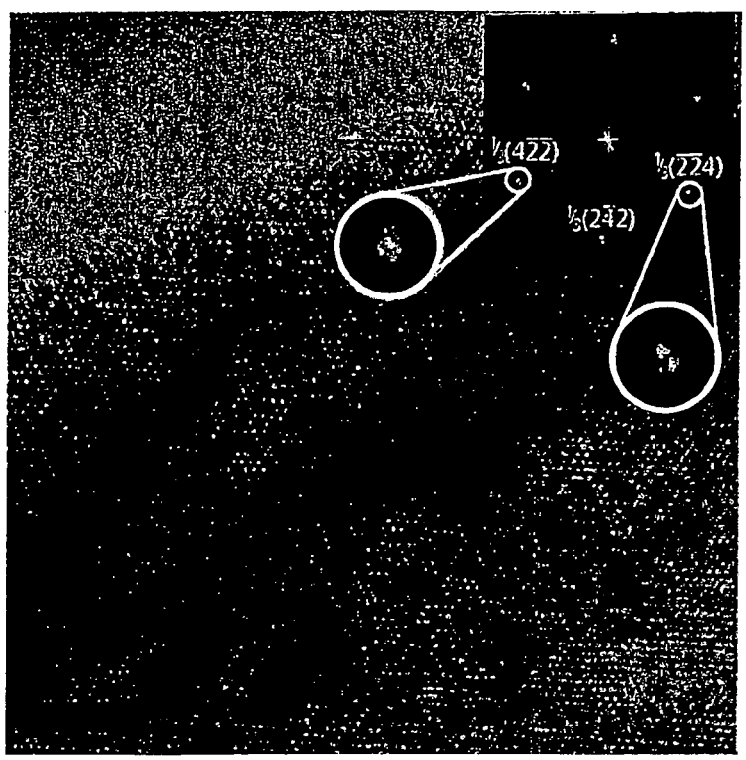
Figure 14C:
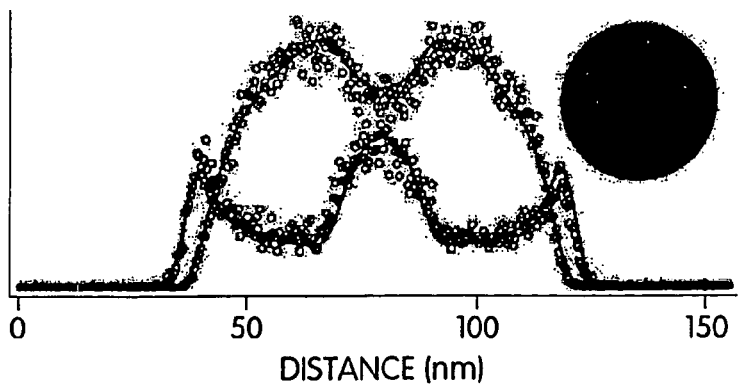

As another example, LCG methods may be used to create nanoscale wires having a multishell configuration, for example, as illustrated in FIG. 12e or FIG. 13a. For example, by altering the synthetic conditions during laser catalytic growth, homogeneous reactant decomposition may occur on the surface of the nanoscale wire, as is illustrated in FIG. 11. Control of the synthetic conditions may lead to a shell forming on the surface of the nanoscale wire, and in some embodiments, the synthetic reaction conditions may be controlled to cause the formation of a thin, uniform shell, a shell having a thickness of one atomic layer, or less in some cases. In other embodiments, by modulating or altering the reactants within the laser catalytic growth system, more than one shell may be built up on the outer surface of the nanoscale wire, as is shown in FIG. 11d. As one example, a silicon nanoscale wire core may be grown, and additional semiconductor materials may be deposited onto the surface, for example, a germanium shell, or a silicon shell doped with a dopant such as boron, or other dopants as described elsewhere in this application. The boundaries between the shells may be atomically abrupt, or may be graduated in some fashion, depending on how reactants such as, for example, silane, germane, or diborane are introduced into the laser catalytic growth system. Arbitrary sequences of Si, Ge, and alloy overlayers on both Si and Ge nanowire cores may also be prepared. Other factors may also contribute to the growing nanoscale wire, such as, for example, the reaction temperature, or the sample position within the furnace. By varying these parameters, the ratio of axial growth to radio growth may be controlled as desired.

Any catalyst able to catalyze the production of nanoscale wires may be used. Gold may be preferred in certain embodiments. A wide range of other materials may also be contemplated, for example, a transition metal such as silver, copper, zinc, cadmium, iron, nickel, cobalt, and the like. Generally, any metal able to form an alloy with the desired semiconductor material, but does not form a more stable compound than with the elements of the desired semiconductor material may be used as the catalyst.

The buffer gas may be any inert gas, for example, $N_2$ or a noble gas such as argon. In some embodiments, a mixture of $H_2$ and a buffer gas may be used to reduce undesired oxidation by residual oxygen gas.

A reactive gas used during the synthesis of the nanoscale wire may also be introduced when desired, for example, ammonia for semiconductors containing nitrogen, such as gallium nitride. Nanoscale wires may also be flexibly doped by introducing one or more dopants into the composite target, for example, a germanium alloy during n-type doping of InP. The doping concentration may be controlled by controlling the relative amount of doping element, for example, between 0 and about 10% or about 20%, introduced in the composite target.

Laser ablation may generate liquid nanoclusters that subsequently define the size and direct the growth direction of the nanoscale wires. The diameters of the resulting nanoscale wires are determined by the size of the catalyst cluster, which may be varied by controlling the growth conditions, such as the pressure, the temperature, the flow rate and the like. For example, lower pressure may produce nanoscale wires with smaller diameters in certain cases. Further diameter control may be performed by using uniform diameter catalytic clusters.

Figure 4:
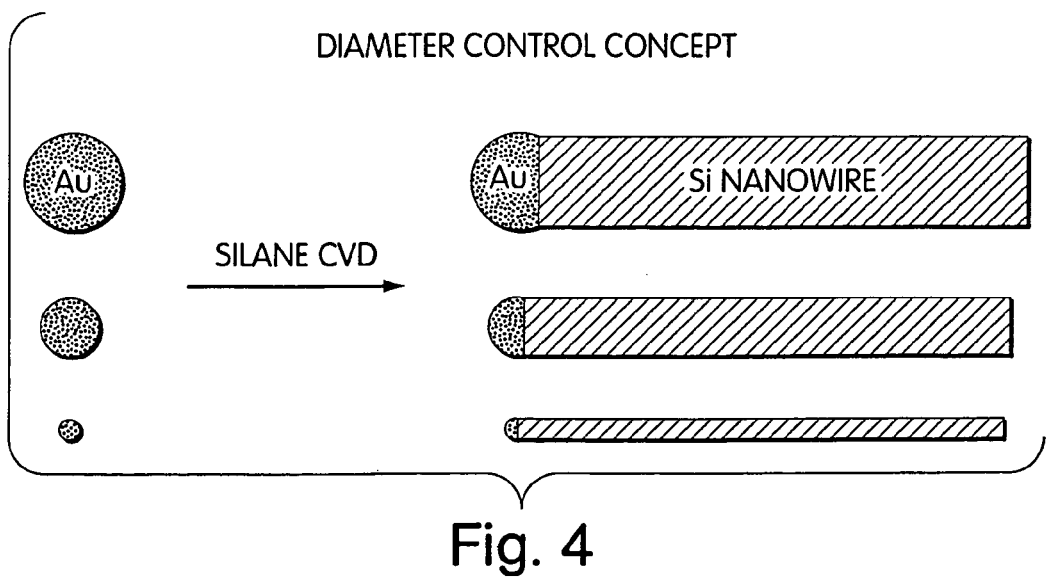
FIG. 4 is a schematic diagram illustrating nanowire formation.

With same basic principle as LCG, if uniform diameter nanoclusters (less than 10–20% variation depending on how uniform the nanoclusters are) are used as the catalytic cluster, nanoscale wires with uniform size (diameter) distribution can be produced, where the diameter of the nanoscale wires is determined by the size of the catalytic clusters, as illustrated in FIG. 4. By controlling the growth time or the position of the sample within the reactor, nanoscale wires with different lengths or different shell thicknesses may be grown.

Nanoscale wires having uniform diameters or size distributions may be produced in embodiments where the diameter of the nanoscale wire is determined by the size of the catalytic cluster. For example, uniform diameter nanoclusters (for example, having a variation of less than about 10% to about 20% in the average diameter) may be used as the starting catalytic clusters. By controlling the growth time, nanoscale wires having different lengths may be grown.

The catalytic clusters or the vapor phase reactants may be produced by any suitable technique. For example, laser ablation techniques may be used to generate catalytic clusters or vapor phase reactant that may be used during LCG. Other techniques may also be contemplated, such as thermal evaporation techniques.

The laser ablation technique may generate liquid nanoclusters that may subsequently define the size and direct the growth direction of the nanoscopic wires. The diameters of the resulting nanoscale wires may be determined by the size of the catalyst cluster, which in turn may be determined using routine experiments that vary the growth conditions, such as background pressure, temperature, flow rate of reactants, and the like. For example, lower pressure generally produces nanoscale wires with smaller diameters. Further diameter control may be achieved by using uniform diameter catalytic clusters.

Certain aspects of the invention may utilize metal-catalyzed CVD techniques ("chemical vapor deposition") to synthesize individual nanoscopic-scale wires, such as nanotubes for molecular electronics. CVD synthetic procedures needed to prepare individual wires directly on surfaces and in bulk form are generally known, and can readily be carried out by those of ordinary skill in the art. See, for example, Kong, et al., "Synthesis of Individual Single-Walled Carbon Nanotubes on Patterned Silicon Wafers," *Nature*, 395:878–881 (1998); or Kong, et al., "Chemical Vapor Deposition of Methane for Single-Walled Carbon Nanotubes," *Chem. Phys. Lett.*, 292:567–574 (1998), both incorporated herein by reference their entirety for all purposes. Nanoscopic wires may also be grown through laser catalytic growth. See, for example, Morales, et al., "A Laser Ablation Method for the Synthesis of Crystalline Semiconductor Nanowires," *Science*, 279:208–211 (1998), incorporated herein by reference in its entirety for all purposes. With same basic principles as LCG, if uniform diameter nanoclusters (less than 10–20% variation depending on how uniform the nanoclusters are) are used as the catalytic cluster, nanoscale wires with uniform size (diameter) distribution can be produced, where the diameter of the nanoscale wires is determined by the size of the catalytic clusters, as illustrated in FIG. 4. By controlling the growth time, nanoscale wires with different lengths can be grown.

One technique that may be used to grow nanoscale wires is catalytic chemical vapor deposition ("C-CVD"). In the C-CVD method, the reactant molecules (e.g., silane and the dopant) are formed from the vapor phase, as opposed to from laser vaporization. In C-CVD, nanoscale wires may be doped by introducing the doping element into the vapor phase reactant (e.g. diborane and phosphane for p-type and n-type doped regions). The doping concentration may be controlled by controlling the relative amount of the doping compound introduced in the composite target. The final doping concentration or ratios are not necessarily the same as the vapor-phase concentration or ratios. By controlling growth conditions, such as temperature, pressure or the like, nanoscale wires having the same doping concentration may be produced.

To produce a nanoscale wire having adjacent regions having different compositions within a nanoscale wire, the doping concentration may be varied by simply varying the ratio of gas reactant (e.g. from about 1 ppm to about 10%, from about 10 ppm to about 20%, from about 100 ppm to about 50%, or the like), or the types of gas reactants used may be altered during growth of the nanoscale wire. The gas reactant ratio or the type of gas reactants used may be altered several times during growth of the nanoscale wire, which may produce nanoscale wires comprising regions having multiple compositions, all of which may or may not be unique.

Figure 5:
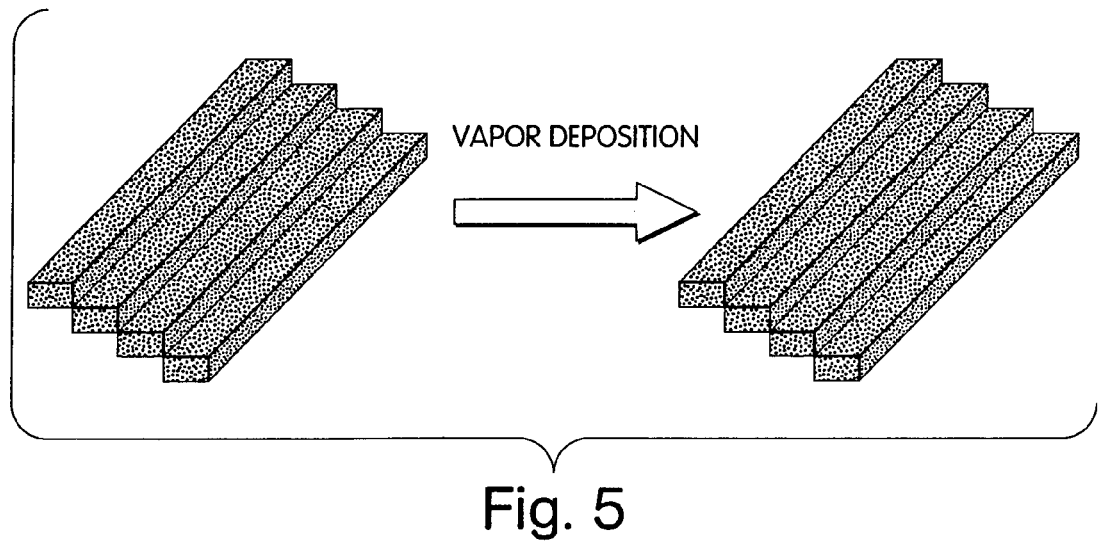
FIG. 5 is a schematic diagram that illustrates nanoscopic wire fabrication by deposition on the edge of surface steps.
Figure 6:
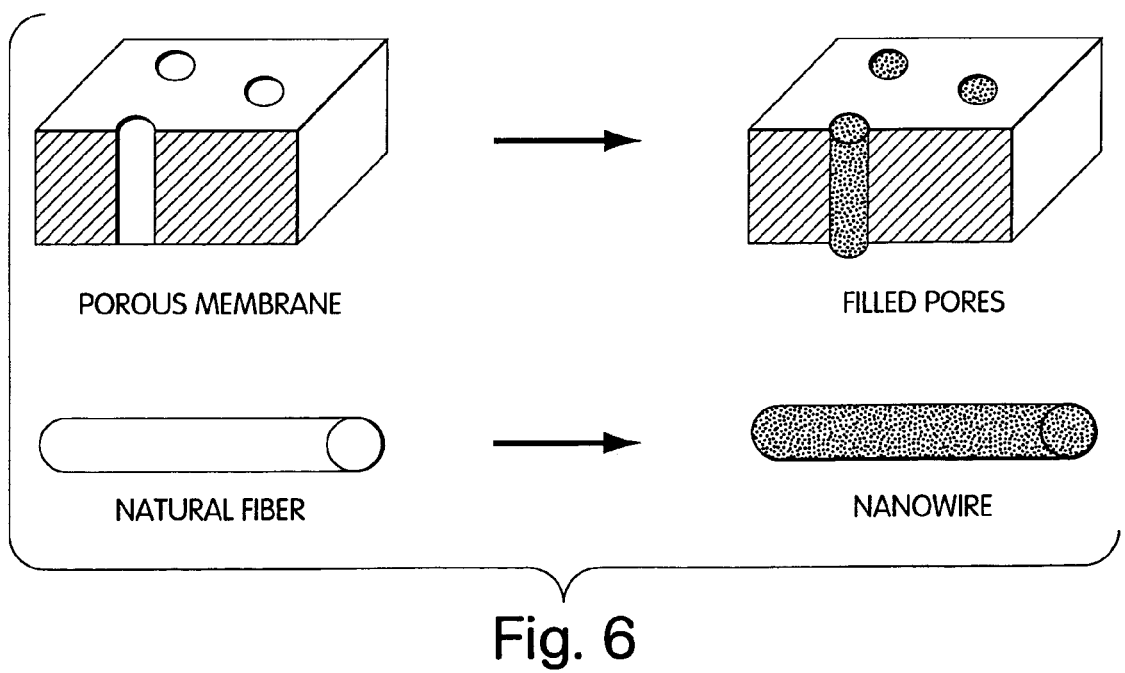
FIG. 6 is a schematic diagram that illustrates nanoscale wire growth by vapor deposition in or on an elongated template.
Figure 7A:
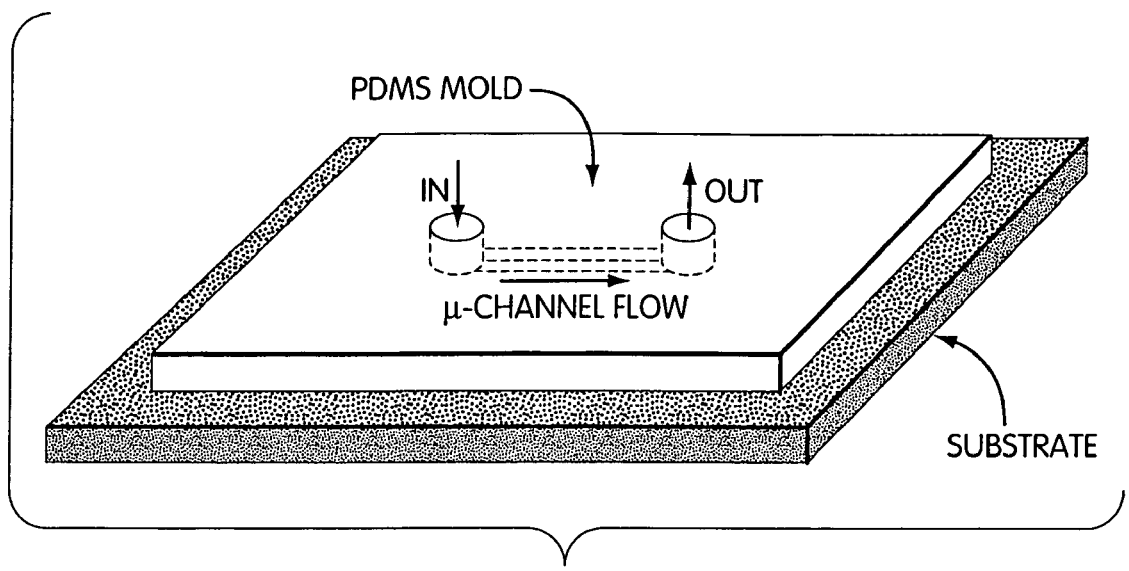
FIGS. 7A–7E illustrate orthogonal assembly of semiconductor nanoscale wires to form devices.
Figure 7B:
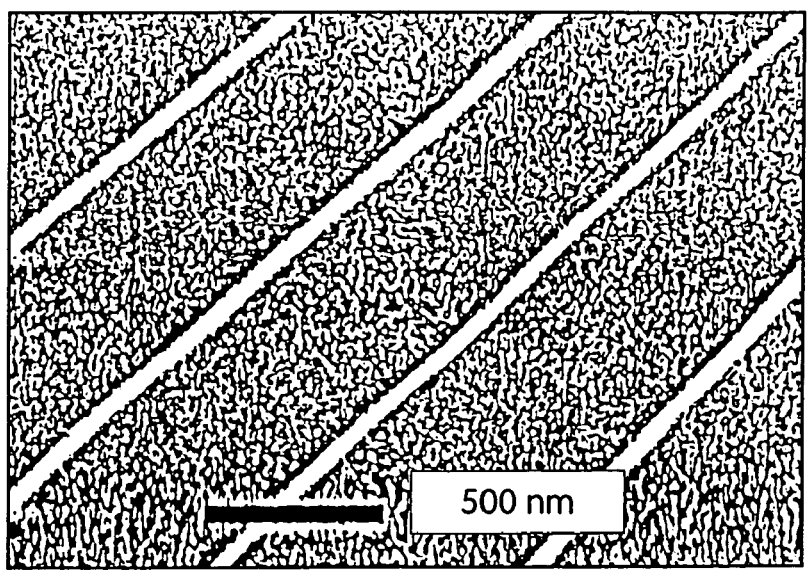
Figure 7C:
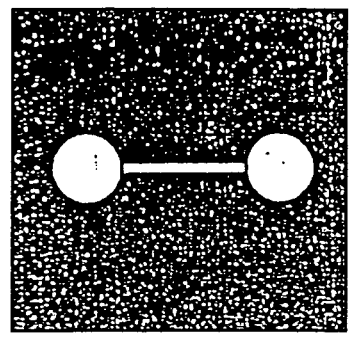
Figure 7D:
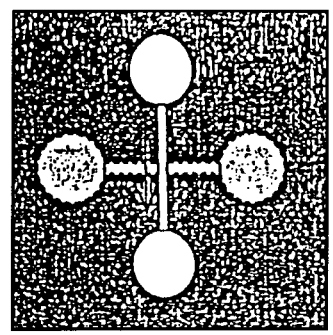
Figure 7E:
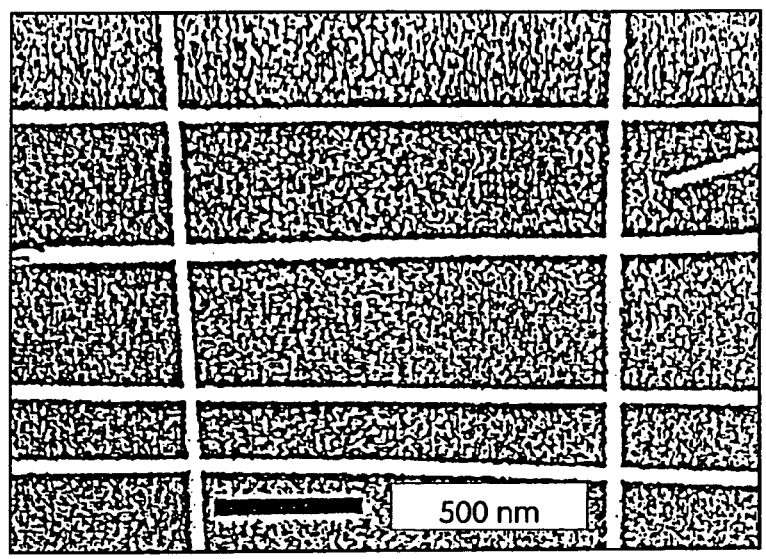

Other techniques to produce nanoscale semiconductors such as nanoscale wires are also within the scope of the present invention. For example, nanoscale wires of any of a variety of materials may be grown directly from vapor phase through a vapor-solid process. Also, nanoscale wires may also be produced by deposition on the edge of surface steps, or other types of patterned surfaces, as shown in FIG. 5. Further, nanoscale wires may be grown by vapor deposition in or on any generally elongated template, for example, as shown in FIG. 6. The porous membrane may be porous silicon, anodic alumnia, a diblock copolymer, or any other similar structure. The natural fiber may be DNA molecules, protein molecules carbon nanotubes, any other elongated structures. For all the above described techniques, the source materials may be a solution or a vapor. In some embodiments, while in solution phase, the template may also include be column micelles formed by surfactant molecules in addition to the templates described above.

For a doped semiconductor, the semiconductor may be doped during growth of the semiconductor. Doping the semiconductor during growth may result in the property that the doped semiconductor is bulk-doped. Further, such doped semiconductors may be controllably doped, such that a concentration of a dopant within the doped semiconductor can be controlled and therefore reproduced consistently, making possible the commercial production of such semiconductors.

The nanoscopic wires may be either grown in place or deposited after growth. Assembly, or controlled placement of nanoscopic wires on surfaces after growth may be performed by aligning nanoscopic wires using an electrical field. An electrical field may be generated between electrodes. The nanoscopic wires may be positioned between the electrodes (optionally flowed into a region between the electrodes in a suspending fluid), and may align in the electrical field, thereby spanning the distance between and contact each of the electrodes.

In another arrangement, individual contact points may be arranged in opposing relation to each other. The individual contact points may be tapered to form points directed towards each other. An electric field may be generated between such points that will attract a single nanoscopic wire to span the distance between the points, forming a pathway for electronic communication between the points. Thus, individual nanoscopic wires may be assembled between individual pairs of electrical contacts. Crossed-wire arrangements, including multiple crossings (multiple parallel wires in a first direction crossed by multiple parallel wires in a perpendicular or approximately perpendicular second direction) can readily be formed by first positioning contact points (electrodes) at locations where opposite ends of the crossed wires desirably will lie. Electrodes, or contact points, may be fabricated via any suitable microfabrication techniques, such as the ones described herein.

These assembly techniques can be substituted by, or complemented with, a positioning arrangement involving positioning a fluid flow directing apparatus to direct a fluid that may contain suspended nanoscopic wires toward and in the direction of alignment with locations at which nanoscale wires are desirably positioned. A nanoscopic wire solution may be prepared as follows. After nanoscopic wires are synthesized, they are transferred into a solvent (e.g., ethanol), and then may be sonicated for several seconds to several minutes to obtain a stable suspension.

Another arrangement involves forming surfaces including regions that selectively attract nanoscale wires surrounded by regions that do not selectively attract them. For example, —$NH_2$ can be presented in a particular pattern at a surface, and that pattern will attract nanoscale wires or nanotubes having surface functionality attractive to amines. Surfaces can be patterned using known techniques such as electron-beam patterning, "soft-lithography" such as that described in International Patent Publication No. WO 96/29629, published Jul. 26, 1996, or U.S. Pat. No. 5,512,131, issued Apr. 30, 1996, each of which is incorporated herein by reference in its entirety for all purposes. Additional techniques are described in U.S. patent application Ser. No. 60/142,216, filed Jul. 2, 1999, by Lieber, et al., incorporated herein by reference in its entirety for all purposes. Fluid flow channels can be created at a size scale advantageous for placement of nanoscale wires on surfaces using a variety of techniques such as those described in International Patent Publication No. WO 97/33737, published Sep. 18, 1997, and incorporated herein by reference in its entirety for all purposes. Other techniques include those described in U.S. patent application Ser. No. 09/578,589, filed May 25, 2000, and incorporated herein by reference in its entirety for all purposes.

FIGS. 7a–7e show one such technique for creating a fluid flow channel using a polydimethylsiloxane (PDMS) mold. Channels may be created and applied to a surface, and a mold may be removed and re-applied in a different orientation to provide a cross flow arrangement or different arrangement. The flow channel arrangement can include channels having a smallest width of less than about 1 mm, preferably less than about 0.5 mm, more preferably less than about 200 µm or less. Such channels are easily made by fabricating a master by using photolithography and casting PDMS on the master, as described in the above-referenced patent applications and international publications. Larger-scale assembly may be possible as well. The area that can be patterned with nanoscale wire arrays may be defined only by the feature of the channel which can be as large as desired.

The assembly of nanoscale wires onto substrate and electrodes may also be assisted using bimolecular recognition in certain embodiments, for example, by immobilizing one biological binding partner on a nanoscale wire surface and the other one on substrate or electrodes using physical adsorption or covalently linking. Bio-recognition techniques suitable for use in the present invention may include DNA hybridization, antibody-antigen binding, biotin-avidin, biotin-streptavidin binding, and the like.

Another technique which may be used to direct the assembly of a nanoscopic wires into a device is by using "SAMs," or self-assembled monolayers. The SAMs may be chemically patterned in certain embodiments. In one example of patterning SAMs for directed assembly of nanoscopic scale circuitry using nanoscopic wires of the present invention, atomic force microscopy (AFM) may be used to write, at high resolution, a pattern in a SAM, after which the SAM may then be removed. The pattern may be, for example, a linear or a parallel array, or a crossed array of lines.

In another embodiment, microcontact printing may be used to apply patterned SAMs to a substrate. Open areas in the patterned surface (i.e., the SAM-free linear region between linear SAM) may be filled, for example, with an amino-terminated SAM that may interact in a highly specific manner with a nanoscopic wire such as a nanotube. The result may be a patterned SAM, on a substrate, that includes linear SAM portions separated by a line of amino-terminated SAM material. Any desired pattern may be formed where regions of the amino-terminated SAM material corresponds to regions at which wire deposition may be desired. The patterned surface may then be dipped into a suspension of nanoscopic wires, e.g. nanotubes, and may be rinsed to create an array of nanoscale wires. Where nanotubes are used, an organic solvent such as dimethyl formamide may be used to create the suspension of nanotubes. Suspension and deposition of other nanoscopic-scale wires may be achieved with solvents well-known to those of ordinary skill in the art.

Any of a variety of substrates and SAM-forming material can be used along with microcontact printing techniques, such as those described in international patent publication WO 96/29629 of Whitesides, et al., published Jun. 26, 1996 and incorporated herein by reference in its entirety for all purposes. Patterned SAM surfaces may be used to direct a variety of nanoscopic wires or nanoscopic-scale electronic elements. SAM-forming material can be selected, with suitable exposed chemical functionality, to direct assembly of a variety of electronic elements. Electronic elements, including nanotubes, can be chemically tailored to be attracted specifically to specific, predetermined areas of a patterned SAM surface. Suitable functional groups include, but are not limited to SH, $NH_3$, and the like. Nanotubes are particularly suitable for chemical functionalization on their exterior surfaces, as is well known.

Chemically patterned surfaces other than SAM-derivitized surfaces can be used, and many techniques for chemically patterning surfaces are known. Suitable exemplary chemistries and techniques for chemically patterning surfaces are described in, among other places, International Patent Publication Serial No. WO 97/34025 of Hidber, et al., entitled, "Microcontact Printing of Catalytic Colloids," and U.S. Pat. Nos. 3,873,359; 3,873,360; and 3,900,614, each by Lando, all of these documents incorporated herein by reference in their entirety for all purposes. Another example of a chemically patterned surface may be a micro-phase separated block copolymer structure. These structures provide a stack of dense lamellar phases. A cut through these phases reveals a series of "lanes" wherein each lane represents a single layer. The block copolymer may typically be an alternating block and can provide varying domains by which to dictate growth and assembly of a nanoscopic wire. Additional techniques are described in International patent application Ser. No. PCT/US00/18138 filed Jun. 30, 2000, by Lieber, et al., incorporated herein by reference in its entirety for all purposes.

The present invention also comprises a wide variety of devices. Such devices may include electrical devices, optical devices, optronic devices, spintronic devices, mechanical devices or any combination thereof, for example, optoelectronic devices and electromechanical devices. Functional devices assembled from the nanoscale wires of the present invention may be used to produce various computer or device architectures. For example, nanoscale wires of the invention may be assembled into nanoscale versions of conventional semiconductor devices, such as diodes, light emitting diodes (LEDs), inverters, sensors, and bipolar transistors. These inventions may include single, free-standing nanoscale wires, crossed nanoscale wires, or combinations of single nanoscale wires combined with other components. Nanoscale wires having different dopants, doping levels, or combinations of dopants may also be used in certain cases to produce these devices. The nanoscale wires, in particular cases, may also have multiple regions, each of which may have different compositions. In some embodiments, a further step may include the fabrication of these structures within the nanoscale wires themselves, wherein a single nanoscale wire may operate as a functional devices. In other embodiments, a nanoscale wire may also be used as an interconnect between two devices, or between a device and an external circuit or system.

In some embodiments of the invention, the nanoscale optical components of the invention may be integrated with other devices or components. For example, an optical component may be combined with other optical components, nanoscale wires, electrodes, semiconductor chips, and the like. In one embodiment, an optical component is positioned near a series of other components, such that the components are in electronic communication. For example, the nanoscale wires may be part of a computing apparatus (e.g., part of a memory system) or a sensor (e.g., a chemical sensor or a biological sensor). In another embodiment, an optical component may be embedded within a nanoscale wire having a series of different regions, such that the nanoscale wire is able to perform different functions. For example, the nanoscale wire may include a series of transistors, logic gates, or other elements, in addition to the optical component. The components may be arranged radially, for example, in a series of shells around a core structure, or longitudinally along the length of the wire.

One set of embodiments of the invention may be used in an optical or optronic system. For example, components of the invention may be used in sensors (for example, chemical or biological sensors, which may be highly integrated devices, or as nanoprobes for stimulating or analyzing biology samples), in lithographic processing techniques (e.g., near-field optical lithography or nanolithography), in scanning probe microscopy, in laser-based (e.g, to perform micro- or nanosurgery), in information storage media (for example, the laser may be used to read or write data from a substrate), in optical communication equipment, in medical diagnostics, in scanning probe microscopy, or in various therapeutic methods. The components may also be used in single or multi-color laser source arrays, for example, in silicon microelectronics or "lab-on-a-chip" devices.

In one series of embodiments, an apparatus of the invention may include more than one optical component. For example, the apparatus may include an array of nanoscale lasers. The lasers within the array may be independently addressable, such that any desired frequency or color can be produced upon demand. The array of lasers may be used, for example, to display an image, to read data from a memory unit, or the lasers may be used in a detection apparatus, for example, in a "lab-on-a-chip" device.

The function and advantage of these and other embodiments of the present invention will be more fully understood from the examples below. The following examples are intended to illustrate the benefits of the present invention, but do not exemplify the full scope of the invention.

EXAMPLE 1

Figure 16A:
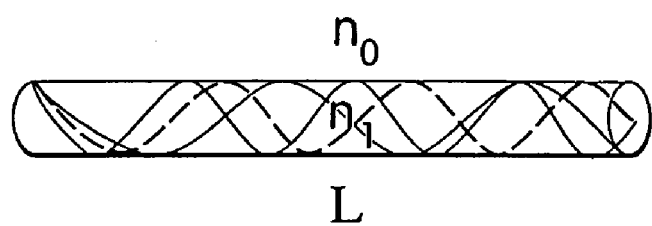
FIGS. 16A–16F illustrate nanoscale wires constructed and arranged as Fabry-Perot optical cavities.

In this example, a single-crystal, 80–200 nm diameter cadmium sulfide (CdS) nanowire having a wurtzite structure with [001] growth axis is used in an embodiment of the invention. A nanowire may function as a single mode optical waveguide when $1 \sim (\pi D/\lambda)(n_1^2 - n_0^2)^{0.5} < 2.4$, where D is the nanowire diameter, $\lambda$ is the wavelength, and $n_1$ and $n_0$ are the refractive indices of the nanowire and surrounding medium, respectively. FIG. 16a illustrates a schematic showing a nanowire as an optical waveguide, with cleaved ends defining a Fabry-Perot cavity. In this particular example ($n_1$=2.5; $\lambda$=510 nm at 300 K), the minimum diameter needed to support a single mode was found to be on the order of 70 nm. In this example, the ends of the nanowire were cleaved, so that the ends could function as two reflecting mirrors defining a Fabry-Perot optical cavity with modes $m(\lambda/2n_1)=L$, where m is an integer and L is the length of the cavity.

Figure 16B:
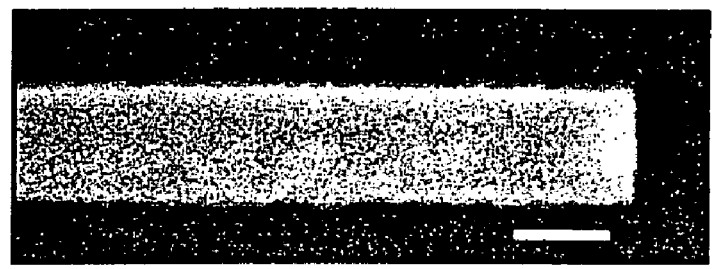

Transmission and scanning electron microscopy studies showed that the solution phase sonication of CdS nanowires produced a high (>50%) yield of flat ends, indicative of cleavage perpendicular to the [001] growth direction. FIG. 16b shows an SEM image of a cleaved CdS nanowire end. The scale bar represents 100 nm.

Figure 16C:
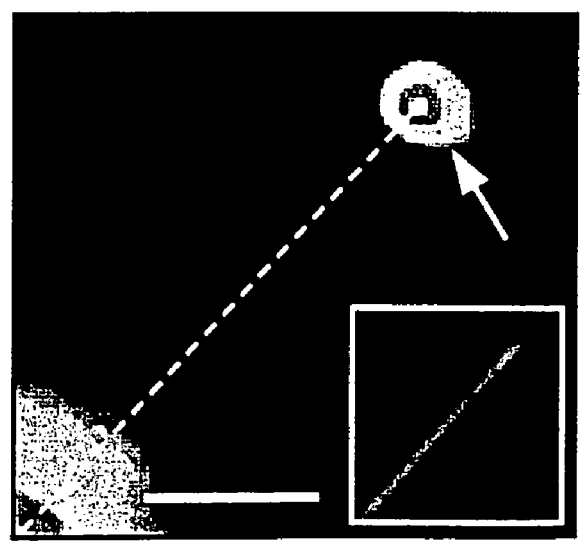

The optical cavity properties of the CdS nanowires were characterized by photoluminescence measurements at the single nanowire level using a far-field epifluorescence microscope. An example room-temperature luminescence image of a CdS nanowire excited with a tightly focused laser approximately 15 microns from the nanowire end showed strong emission at the excitation locus, and also prominent emission near the nanowire end. For example, FIG. 16c shows a room temperature photoluminescence image of a CdS nanowire excited (lower left corner, power 10 mW), approximately 15 microns away from the nanowire end. The white arrow and dashed line highlight the nanowire end and axis, respectively. The scale bar represents 5 microns. The inset shows an optical image of the nanowire obtained with white light illumination. Examination of a number of nanowires showed that outside of the excitation region, emission was observed primarily from the nanowire ends in these particular experiments, thus indicating that these CdS nanowires function well as waveguides.

Figure 16D:
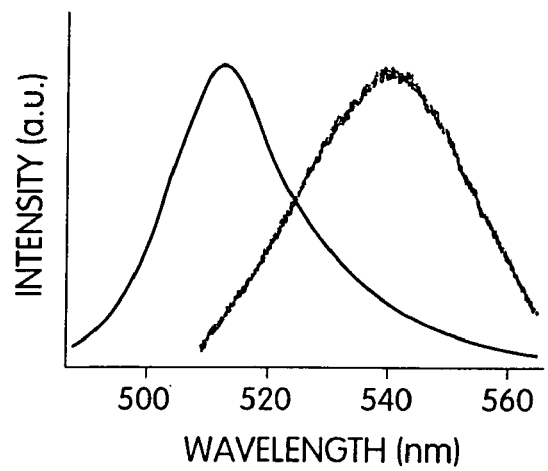

Additionally, spectroscopy measurements were performed at different regions, as a function of excitation power under uniform illumination. At low power, photoluminescence spectra recorded from the body exhibited a broad peak with a maximum at 512 nm and full width at half maximum (FWHM) of 24 nm (FIG. 16d). FIG. 16d illustrates photoluminescence spectra obtained from the body of the nanowire at the excitation point (800) and the end of the nanowire (805) at low pump power (10 mW). The peak maximum was consistent with room temperature band edge emission from CdS, and contrasts with deep level emission around 600 nm that usually dominates emission from epitaxial CdS thin films. Spectra recorded from the nanowire end at low excitation power showed a relatively broad peak that was red shifted about 30 nm relative to spectra from the excitation region. The observed spectral red-shift indicates re-absorption of the band edge emission within the CdS nanowire cavity.

Figure 16E:
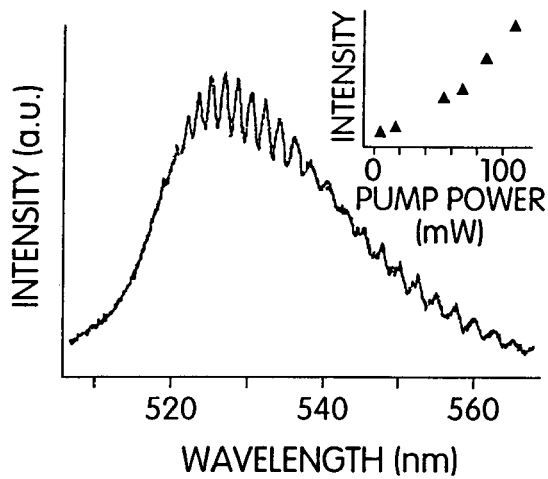
Figure 16F:
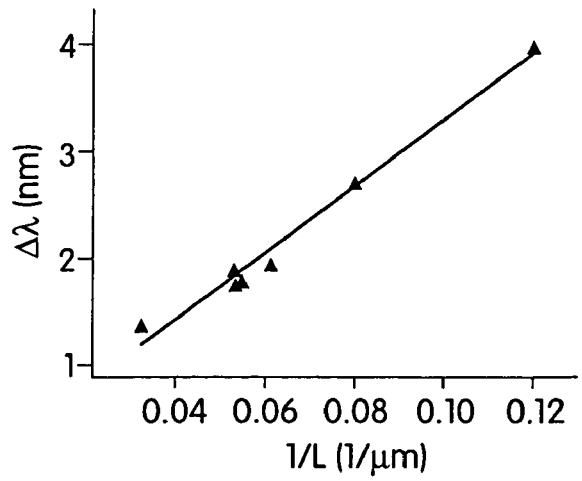

Photoluminescence measurements made at higher excitation powers revealed additional features about the CdS nanowire cavities. For instance, FIG. 16e shows a spectrum from the nanowire end at higher pump power (80 mW), exhibiting periodic intensity variation. The period varies from 1.67–2.59 nm with increasing wavelength, which is consistent with the calculated mode spacing for the 18.8 micron nanowire and the dispersion of the refractive index, $n(\lambda)$. The inset shows the end emission intensity as a function of pump power. In FIG. 16e, the nanowire end emission blue shifted towards the band edge as the re-absorption was partially saturated with increasing excitation power. The end emission intensity also increased super-linearly with excitation power, while emission from the nanowire body exhibited a slight, approximately linear increase. Periodic variations in the intensity, which may be suggestive of the longitudinal modes of a Fabry-Perot cavity, were observed. For a cavity of length L, the mode spacing, $\Delta\lambda$, may be predicted by $\lambda^2/2L(n_1-\lambda(dn_1/d\lambda))^{-1}$, where $dn_1/d\lambda$ is the dispersion relation for the refractive index. This expression experimentally describes the observed spacing when the measured nanowire length is equated with L. Analysis of similar data from nanowires of varying length demonstrated that the mode spacing was inversely proportional to the wire length. From the mode linewidths (background subtracted), a moderate cavity quality factor was estimated to be about 600 at room temperature. FIG. 16f is a graph of mode spacing vs. inverse nanowire length. The triangles are experimental points and the line is a linear fit to these data. The contribution of $n(\lambda)$ was minimized by plotting the mode spacing at 530 nm in all cases. CdS nanowires in this example were synthesized at 880° C. by laser assisted catalytic growth, using gold as the catalyst. The resulting nanowire product was dispersed in ethanol, and sonicated for 30–60 s to produce a high yield of wires with cleaved ends. Room and low temperature luminescence measurements were made with homebuilt epifluorescence microscopes having 0.3 and 0.7 nm resolutions, respectively. A frequency doubled Ti:sapphire laser (76 MHz, ~200 fs pulses, 410 nm) was used for optical excitation. Spectra were recorded using a 300 mm spectrometer (1200 lines/mm grating) and liquid-nitrogen cooled CCD detector. Thus, the CdS nanowire described in this example forms a Fabry-Perot cavity.

EXAMPLE 2

Figure 17A:
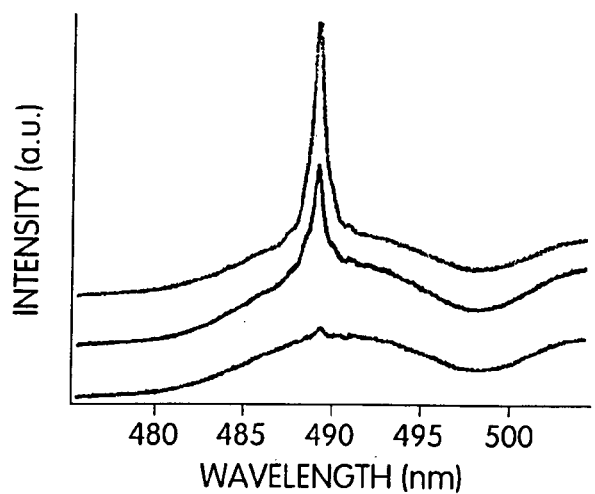
FIGS. 17A–17C illustrate various optical properties in connection with nanoscale lasers.
Figure 17B:
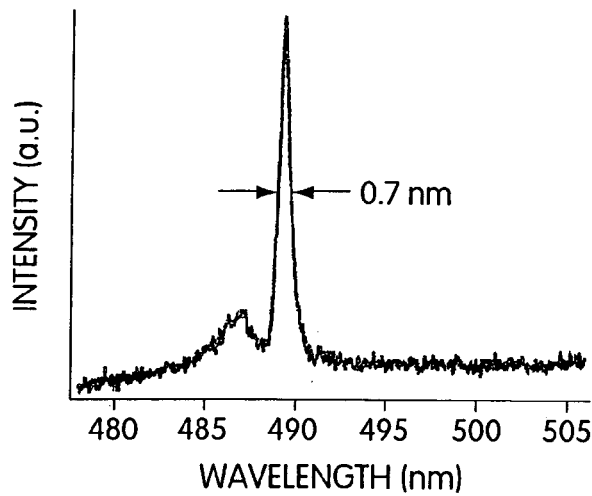
Figure 17C:
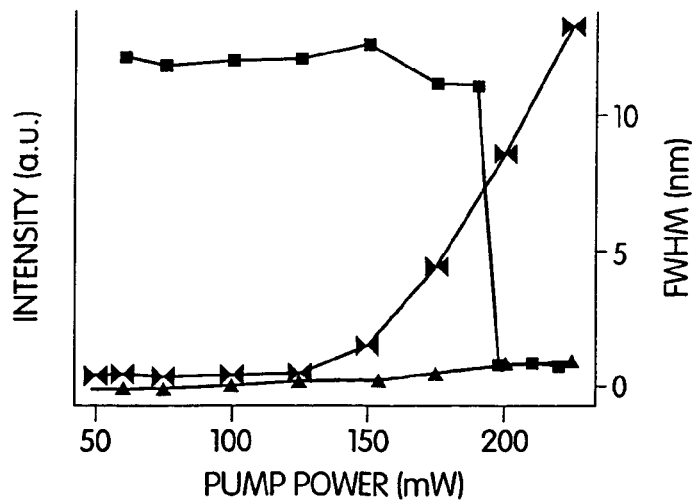

The observation of sharp modes in the uniform CdS nanowire gain medium above the super-linear regime is indicative of amplified stimulated emission in this example. Excitation at higher powers leads to preferential gain in a single mode and the onset of lasing. FIG. 17a shows emission spectra from a CdS nanowire end with a pump power of 190, 197, and 200 mW (810, 815, and 820, respectively) recorded at 8 K. At low temperatures, the broad emission peak observed at the nanowire end was observed to rapidly evolve to a sharp single mode with the 0.7 nm line width, limited by the resolution of the low-temperature instrument. Other measurements of the linewidths as a function of pump power show an abrupt decrease soon after the changeover to superlinear behavior. FIG. 17b shows laser emission from a CdS nanowire end at 8K with instrument resolution limited line width (FWHM ~0.7 nm). The observed abrupt decrease in line width was coincident with the threshold to superlinear dependence for emission. A second weaker mode is also resolved. FIG. 17c illustrates emission intensity and FWHM of emission peaks vs. laser (optical) pump power. The emission intensity from the nanowire body maintained a low value and is roughly linear in pump power, while the emission from the nanowire end (825) exhibits a superlinear behavior as the pump power is increased above about 125 mW. The FWHM (830) has a nearly constant of value of about 12 nm at low power, and narrows to the instrument resolution when the superlinear threshold is exceeded. The solid symbols correspond to experimental data points and lines serve as rough guides to eye. In contrast, emission from the nanowire body was found to be broad and approximately linearly dependent on excitation power, and the background spontaneous emission was found to saturate in the superlinear regime, further demonstrating that the laser emission is due to the cavity along the nanowire axis. From this superlinear behavior, the threshold average pump power was estimated to be about 40 kWcm$^{-2}$, although the threshold can vary from nanowire to nanowire, with the lowest value observed being about 2 kWcm$^{-2}$ at low temperature. These experiments thus demonstrate that individual nanowires may be used as Fabry-Perot cavities and support lasing.

EXAMPLE 3

Figure 18B:
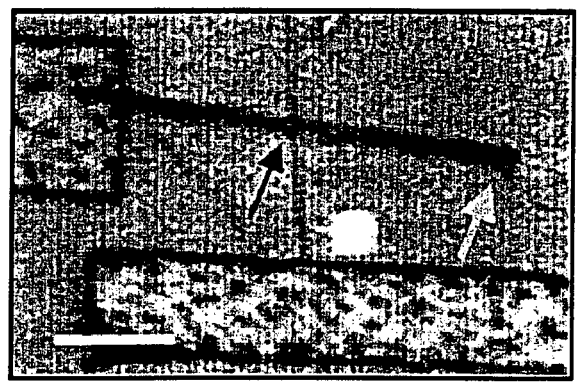
Figure 18C:
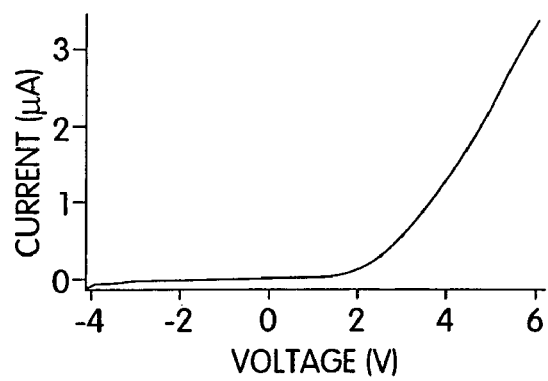
Figure 18D:
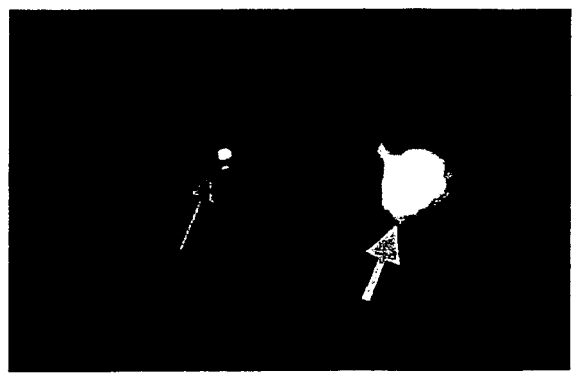

In this example, initial studies of electrical injection into CdS nanowire cavities were performed using a n-type CdS and p-type silicon (p-Si) crossed nanowire structure. FIG. 18a shows a device schematic illustrating a p-n diode formed between p-Si and n-CdS nanowires, where the CdS nanowire forms the cavity and active medium. FIG. 18b shows an optical image of a device with arrows highlighting the cross point (835) and CdS nanowire end (840). The scale bar represents 5 microns. Transport studies of individual CdS nanowires showed that they were n-type, with a doping concentrations on the order of $10^{18}$ to $10^{19}/cm^3$, and electron mobilities on the order of 100 $cm^2/V$-s; the p-type silicon nanowires had a doping concentration of approximately $10^{18}$–$10^{19}/cm^3$ and exhibited mobilities of about 50–300 $cm^2/V$-s. Current-voltage (I-V) measurements made on a typical n-CdS/p-Si crossed nanowire structure (FIG. 18c) showed current rectification, with a sharp forward bias turn-on at about 2 volts, consistent with the formation of a p-n diode. FIG. 18c is a graph of current-voltage (I-V), recorded from the diode in FIG. 18b. In forward bias, the crossed nanowire structures exhibited electroluminescence. Images of the electroluminescence (FIG. 18d) show two points of emission: one corresponding to the n-CdS/p-Si nanowire cross point, and the other to the end of the CdS nanowire. The intensity of the end emission was found to be at least two orders of magnitude larger than the cross point emission, thus demonstrating that the CdS nanowires functions as a waveguide. FIG. 18d is an electroluminescence image obtained at room temperature with the device forward biased at 5 V. The two bright spots highlighted by arrows 845 and 850 correspond to the emission from the cross point and end, respectively. Furthermore, electroluminescence spectra recorded from CdS nanowire ends exhibit a prominent modulation in the intensity that can be assigned to the longitudinal modes of nanowire Fabry-Perot cavities, and thus these electroluminescence data are in general agreement with the optically pumped data recorded (FIG. 17) from similar CdS nanowires.

Figure 18E:
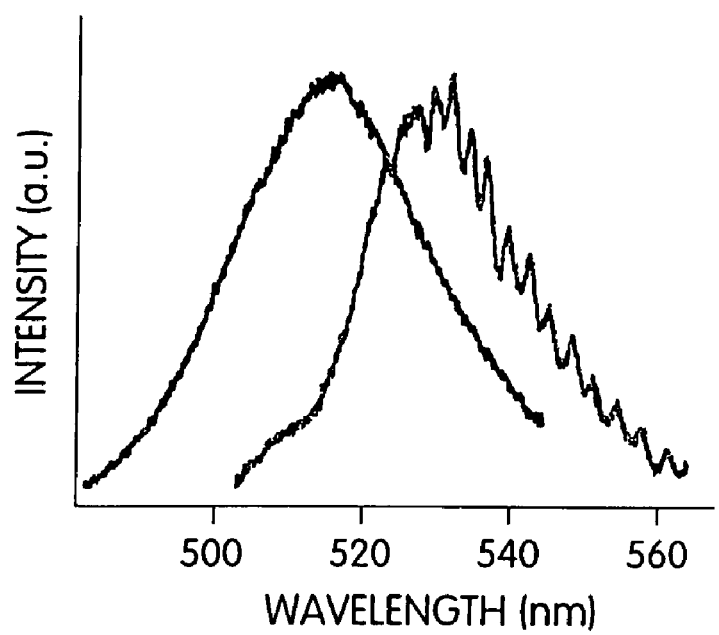
Figure 18F:
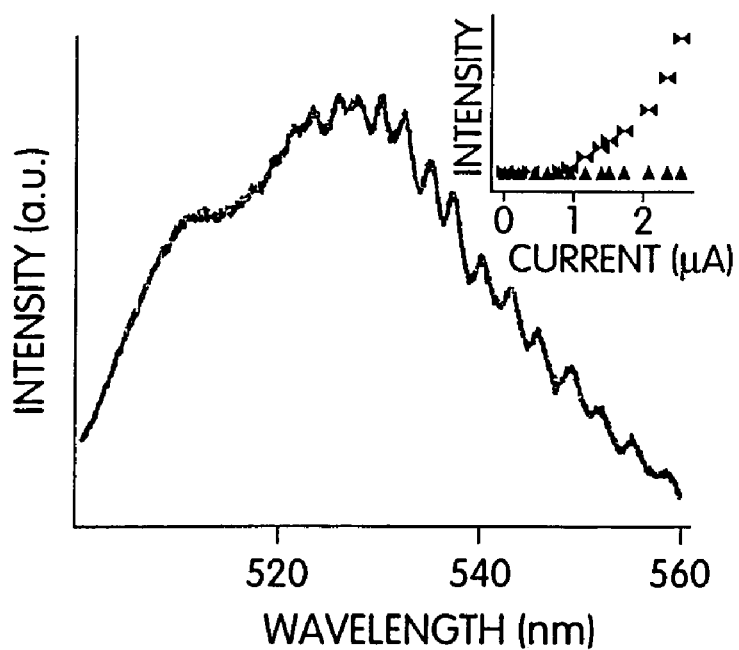
Figure 18G:
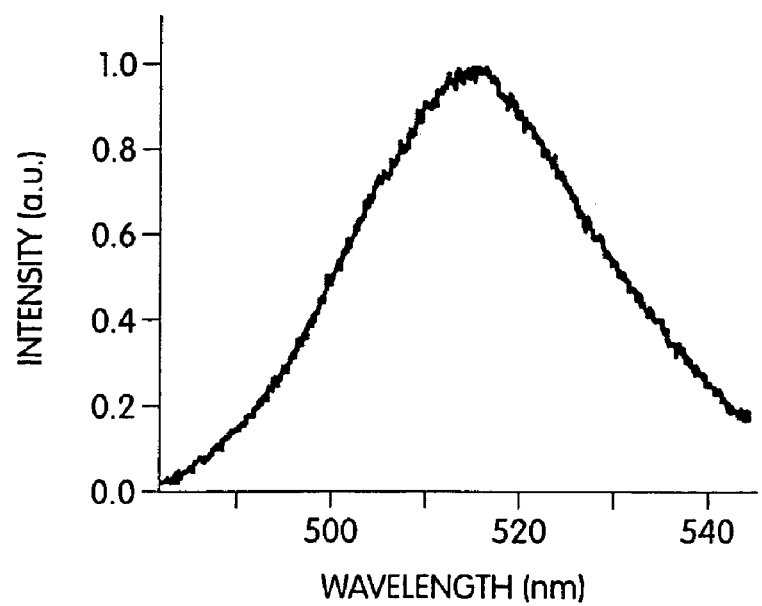
Figure 18H:
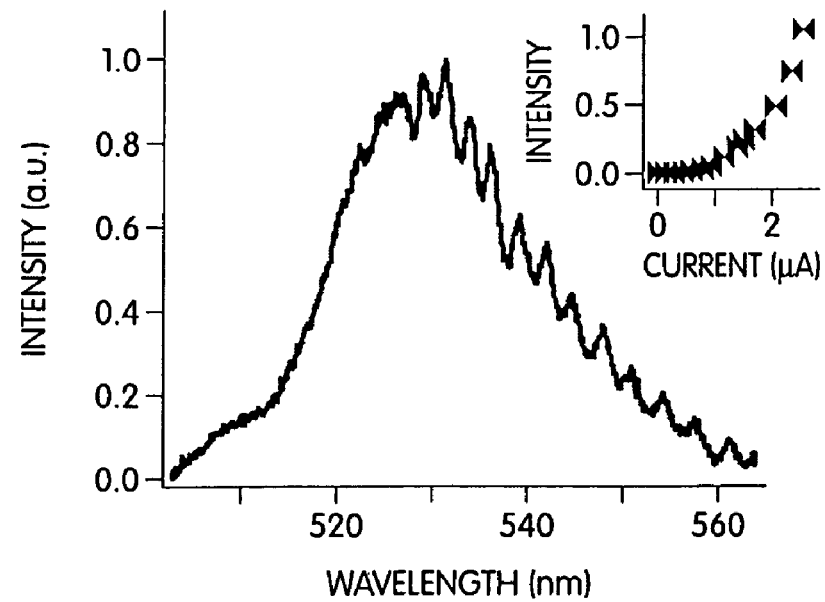
Figure 18I:
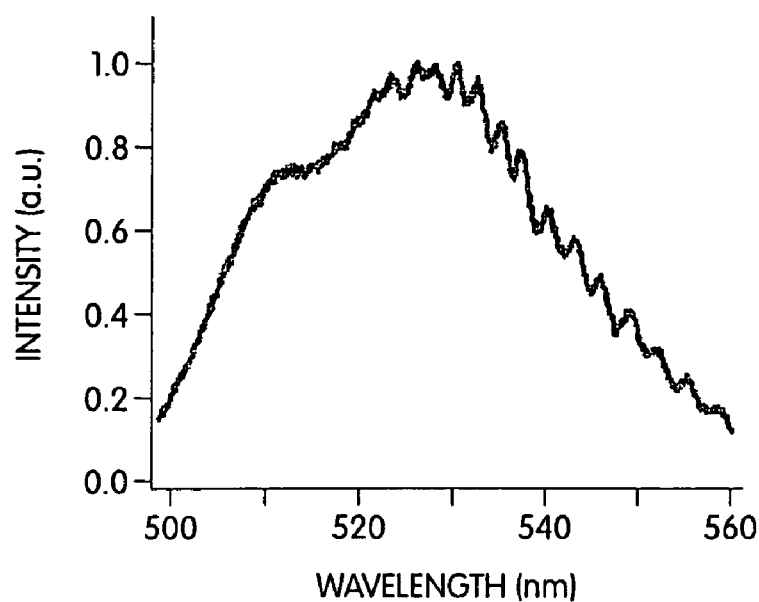
Figure 18J:
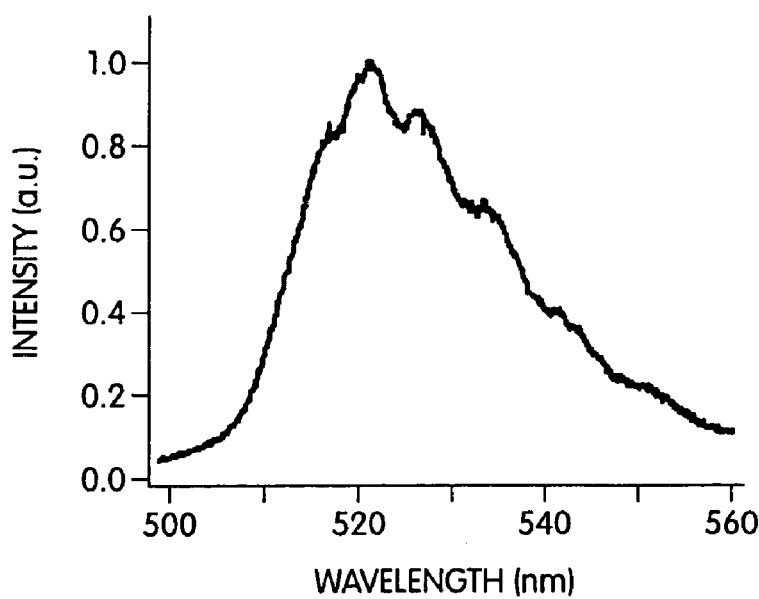

The electroluminescence spectrum recorded from the cross point (FIG. 18e) was found to be a smooth peak with a maximum at 515 nm, consistent with band edge emission. In contrast, electroluminescence spectra recorded from the CdS nanowire end exhibited a prominent modulation in the intensity for injection currents greater than a threshold of about 1.0 microamperes (FIG. 18e). FIG. 18e illustrates an electroluminescence spectra obtained from cross (855) and end (860) of the device at a injection current of about 1.5 microAmps. The observed wavelength dependent intensity modulation corresponded to Fabry-Perot cavity modes, with mode spacing inversely depending on nanowire length (for different devices measured). This threshold current (inset, FIG. 18f) corresponded to a transition from linear to super-linear intensity-current dependence for emission from the nanowire end. Significantly, the intensity modulation may be assigned to the longitudinal modes of a Fabry-Perot cavity having a length consistent with that measured for the CdS nanowire in this device. In addition, the electroluminescence spectra recorded from the CdS nanowire end exhibited a red-shift relative to emission from the cross point, as expected for re-absorption by the nanowire cavity. As the injection current was increased in the superlinear regime, the overall spectrum was found to shift to the blue (FIG. 18f), indicating an approach towards saturation of the reabsorption in the nanowire. These electroluminescence results were thus found to be consistent with optically-pumped luminescence data recorded from similar CdS nanowires. FIG. 18f shows an emission spectrum from the CdS nanowire end at an injection current of about 2.4 microAmps. The inset shows emission intensity (linear scale) vs. injection current. Emission intensity from the nanowire end (865) exhibits super-linear behavior, while emission from the nanowire body is small and roughly linear.

EXAMPLE 4

Figure 19B:
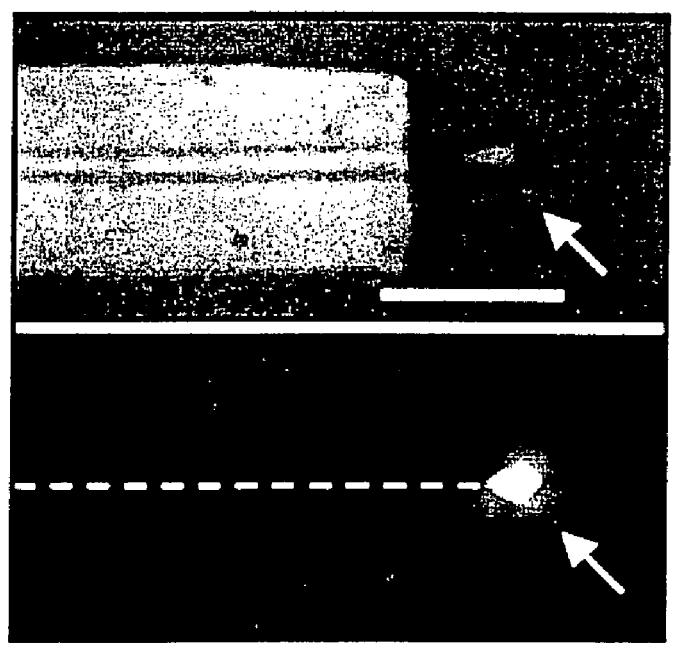
Figure 19C:
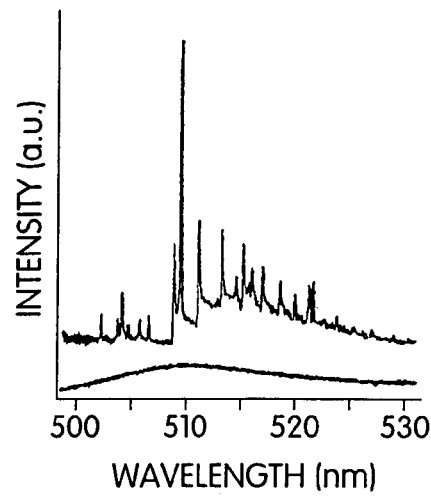
Figure 19D:
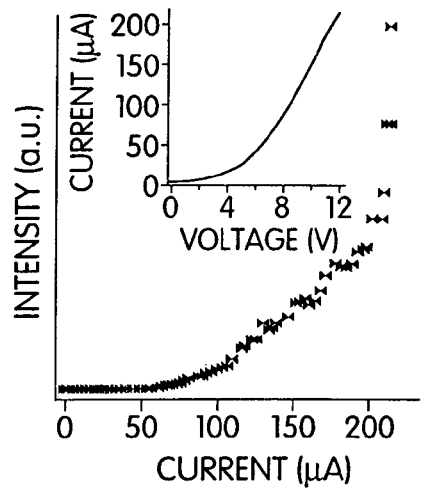
Figure 20A:
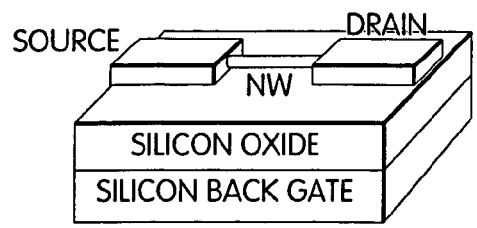
FIGS. 20A–20C illustrate transport properties of certain nanoscale wires.
Figure 20B:
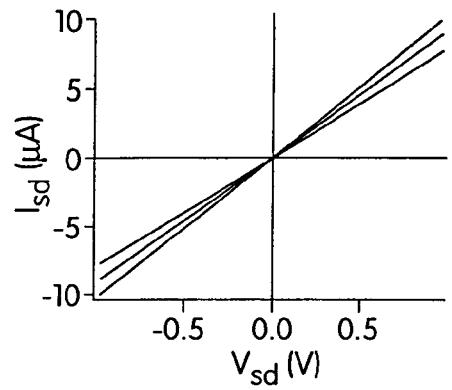
Figure 20C:
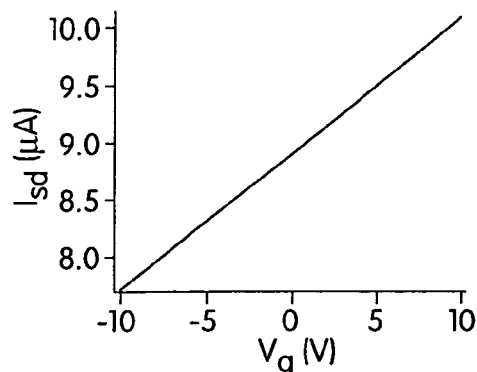

In this example, to investigate nanowire injection lasers, a hybrid structure (FIG. 19A) in which n-type CdS nanowires were assembled onto p-Si electrodes defined in heavily P-doped planar substrates. This substrate was able to produce an n-CdS/p-Si heterojunction needed for an injection device. The hybrid structure can be analogized to the p-n diodes formed in the crossed n-CdS/p-Si nanowire devices, although in this case, holes can be injected along the entire length of CdS nanowire cavity, in contrast to the single cross point in cross-nanowire devices. Large injection currents were achieved using a hybrid structure (FIG. 19a), in which holes were injected along the length of a CdS nanowire cavity from a p-Si electrode defined in a heavily doped p-Si layer on a planar substrate. Images of the room-temperature electroluminescence produced in forward bias from these structures (FIG. 19b) showed strong emission from the exposed CdS nanowire end. Current v. voltage data recorded from devices fabricated in this manner show current rectification with a forward-bias turn-on of 2-V (inset, FIG. 19D), consistent with the formation of p-n diodes. The variation in turn-on voltage may be due to the $Al_2O_3$ barrier between the metal CdS content and/or oxide at the CdS/p-Si junction. FIG. 20a shows a schematic nanowire FET used to characterize the electrical transport properties of individual CdS nanowires. FIG. 20b illustrates source-drain current ($I_{sd}$) vs. source-drain voltage ($V_{sd}$) for a CdS nanowire FET at different fixed gate voltages, and FIG. 20c is a graph of $I_{sd}$ vs. gate voltage ($V_g$) for a CdS nanowire FET with a fixed source-drain bias of 1 V. In these figures, the transconductance was ~100 nA/V, the electron mobilities were 100–400 $cm^2/V$ s, and the electron concentration was $3\times10^{18}$ to $2\times10^{19}/cm^3$.

Figure 19E:
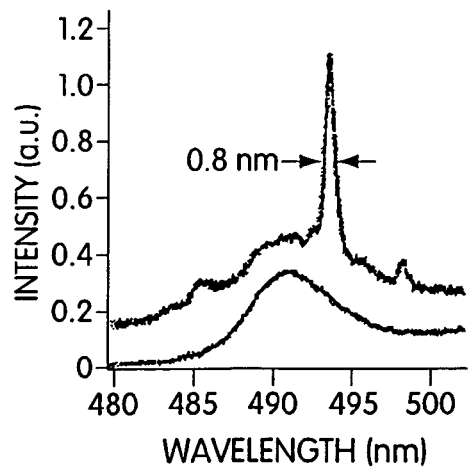

FIG. 19a is a schematic showing the cross section of the device structure. In this structure, electrons and holes may be injected into the CdS nanowire along the whole length from the top metal layer and the bottom p-Si layer, respectively. FIG. 19b is an optical image of a device described in FIG. 19a. The arrow highlights the exposed CdS nanowire end. The scale bar represents 5 microns. FIG. 19e is an electroluminescence image recorded from this device at room-temperature with an injection current of about 80 microamperes. The arrow highlights emission from the CdS nanowire end. The dashed line highlights the nanowire position.

At low injection currents, the spectrum of the end emission (FIG. 19c) showed a broad peak with FWHM ~18 nm, consistent with spontaneous emission. FIG. 19c is an electroluminescence spectra obtained from the nanowire end with injection current below (120 microamperes, 870) and above (210 microamperes, 875) the superlinear threshold. When the injection current was further increased, it was found that the emission intensity increased abruptly, and the spectrum collapsed into a limited number of very sharp peaks with a dominant emission line at 509.6 nm. The sharp peaks corresponded to different modes of the nanowire cavity. Importantly, the dominant mode was found to have an instrument resolution limited line width of only about 0.3 nm. In addition, measurements of the nanowire end electroluminescence intensity vs. current (FIG. 19*d*) showed an initial increase in the intensity at about 90 microamperes and then a much more rapid and highly nonlinear increase at about 200 microamperes. FIG. 19*d* is a graph of the emission intensity vs. injection current. The intensity increases rapidly above about 200 microamperes, which corresponds to the onset of lasing. The inset shows I vs. V for this device. The devices illustrated in this example were fabricated by assembling CdS nanowires on heavily doped p-Si on insulator substrates (>4×10$^{19}$/cm$^3$; 500 nm thick), followed by electron-beam lithography and electron-beam evaporation of 60–80 nm aluminum oxide, 40 nm Ti and 200 nm Au. One end of the nanowire was left uncovered for emission output from the device.

Figure 21:
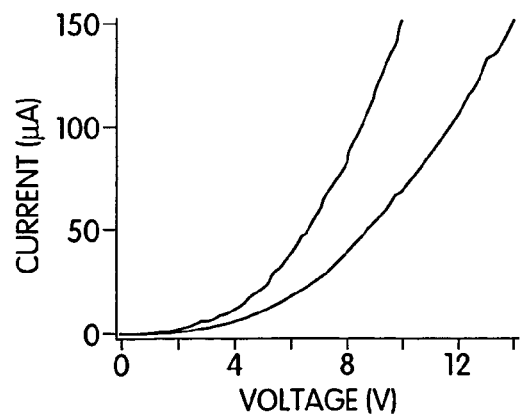
FIG. 21 illustrates electrical transport of a nanolaser device.

FIG. 21 shows current-voltage (I-V) response for two different devices fabricated as discussed above. In general, the I-V data exhibits nonlinear behavior with turn-on voltages ranging from 2 to 5 V. The variation in turn-on voltages is due to the differences in oxide thickness between the top metal electrodes and the CdS nanowires. Other factors, such as a surface oxide coating on the CdS nanowire in a core/shell arrangement may also be used to produce nanoscale wires having different current-voltage responses. Thus, in this example, direct electrical injection into a CdS nanowire Fabry-Perot cavity causes lasing within the device.

EXAMPLE 5

In this example, the mechanism of lasing in single CdS nanowires was spectroscopically analyzed from 4.2 K to 250 K.

At 4.2 K, the photoluminescence spectrum revealed several excitonic lines corresponding to bound excitons. As the excitation intensity was increased, the evolution of the "P" band corresponding to the well-known exciton-exciton interaction phenomena was observed. The increase in the intensity of the "P" band scaled non-linearly with the excitation laser intensity. As the pump power was increased further, the "P" band showed a highly non-linear increase in intensity and eventually collapsed to single mode lasing. The linewidth of the laser line was about 1.2 meV. On further increasing the intensity of the pump beam by more than an order of magnitude, no red shift of the lasing line was observed, which showed that the lasing mechanism is generally excitonic in nature and not due to the formation of an electron-hole plasma. From 4.2 K to 70 K, the mechanism of lasing was found to be due to an exciton-exciton interaction process, whereas at higher temperatures the lasing was found to be either due to exciton-electron interaction process of exciton-LO phonon interaction process. At higher temperatures, a significant red shift of the lasing lines was not observed with increasing pump intensity. The lifetimes of the NWs have also been measured from 4.2K to room temperature (see FIG. 22D).

Figure 22A:
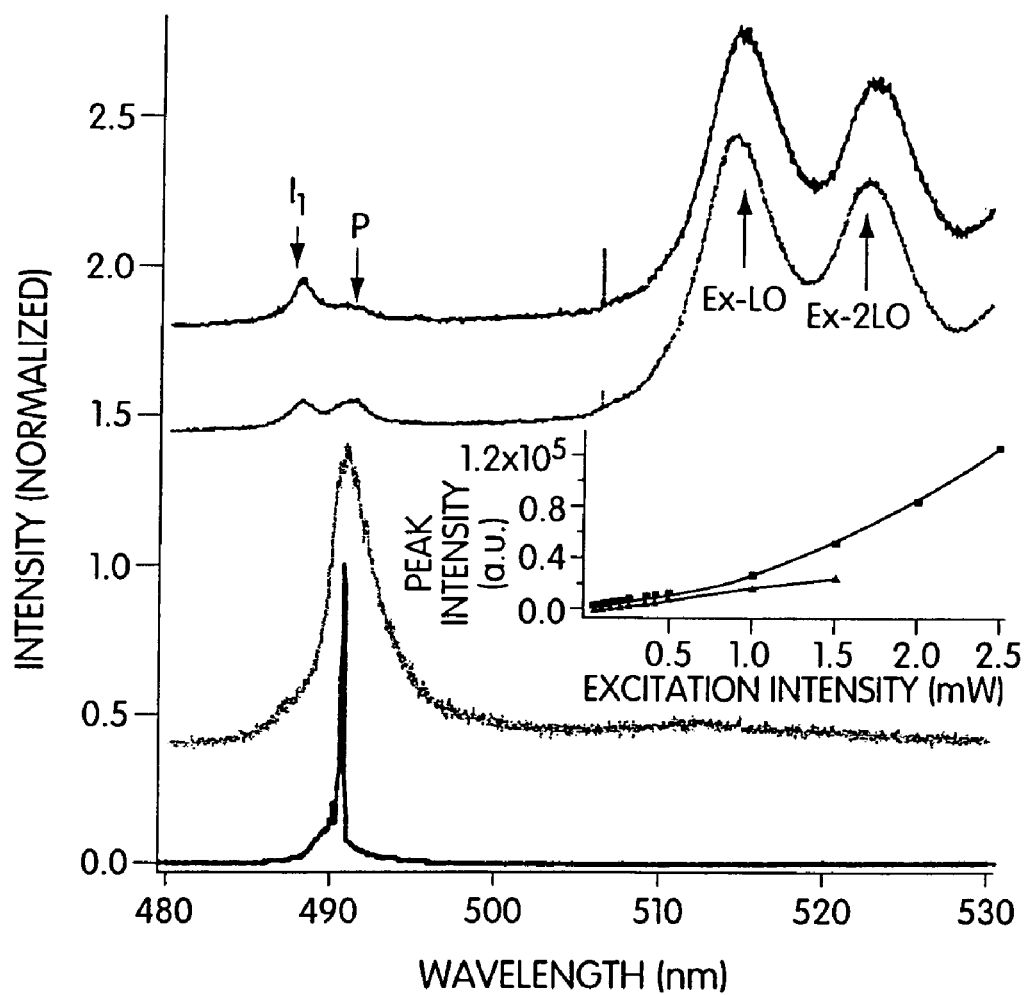
FIGS. 22A–22D illustrate lasing within certain nanoscale wires at various temperatures.
Figure 22B:
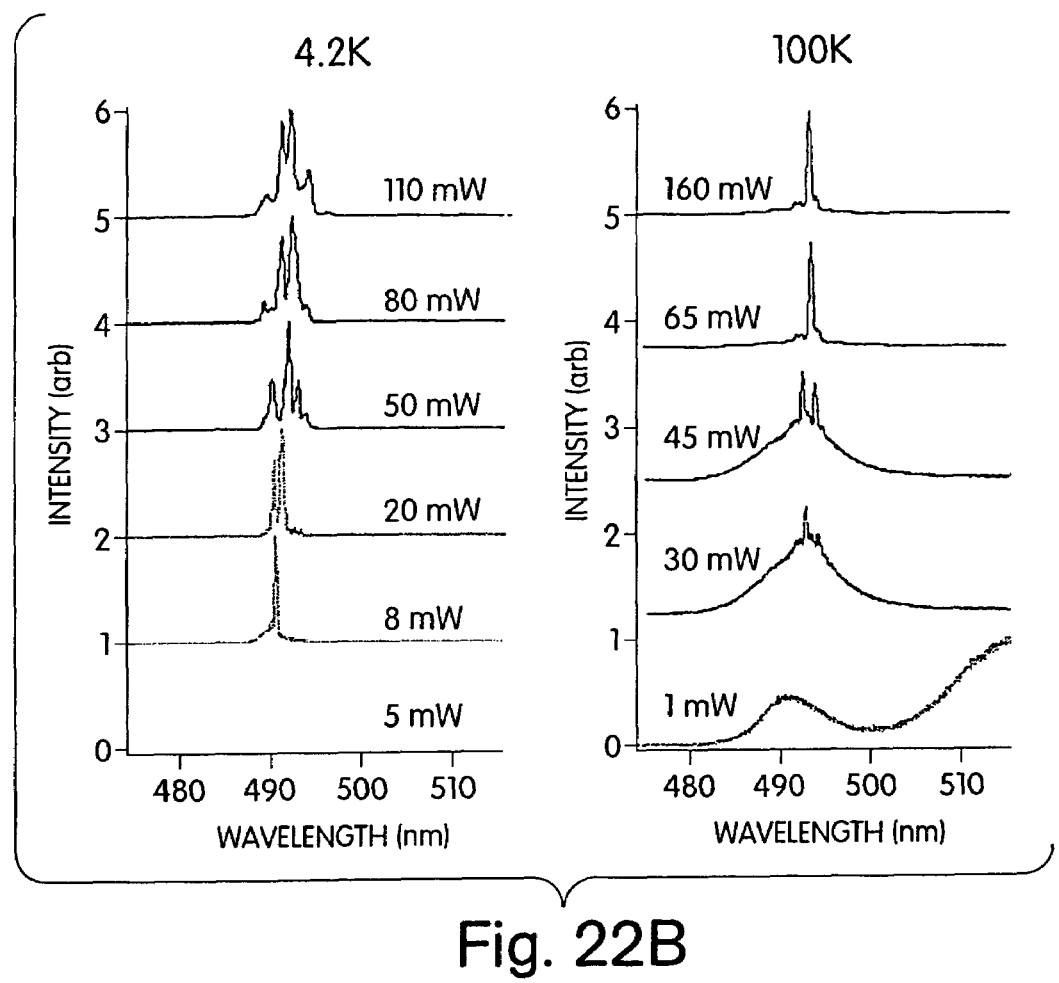
Figure 22C:
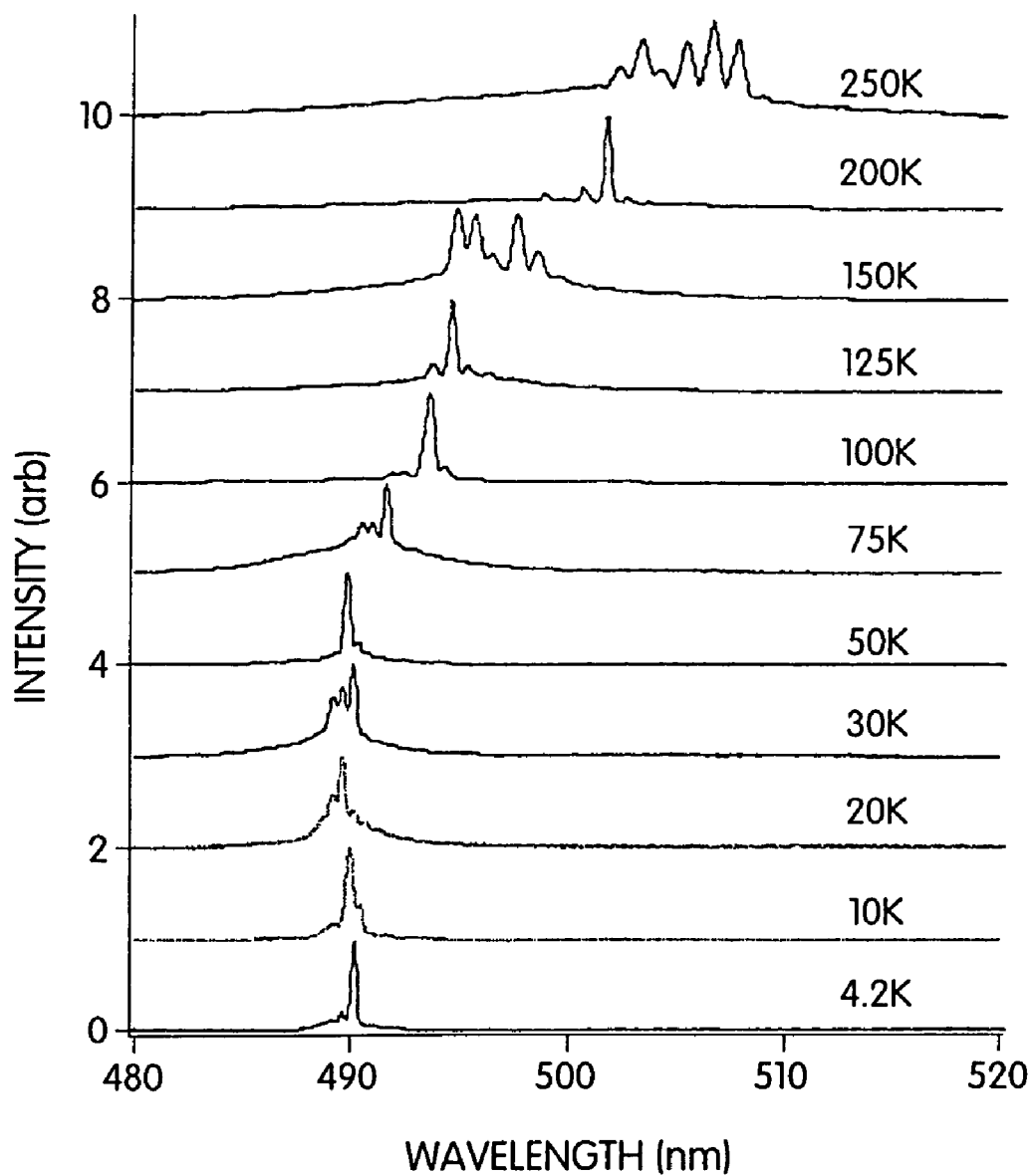
Figure 22D:
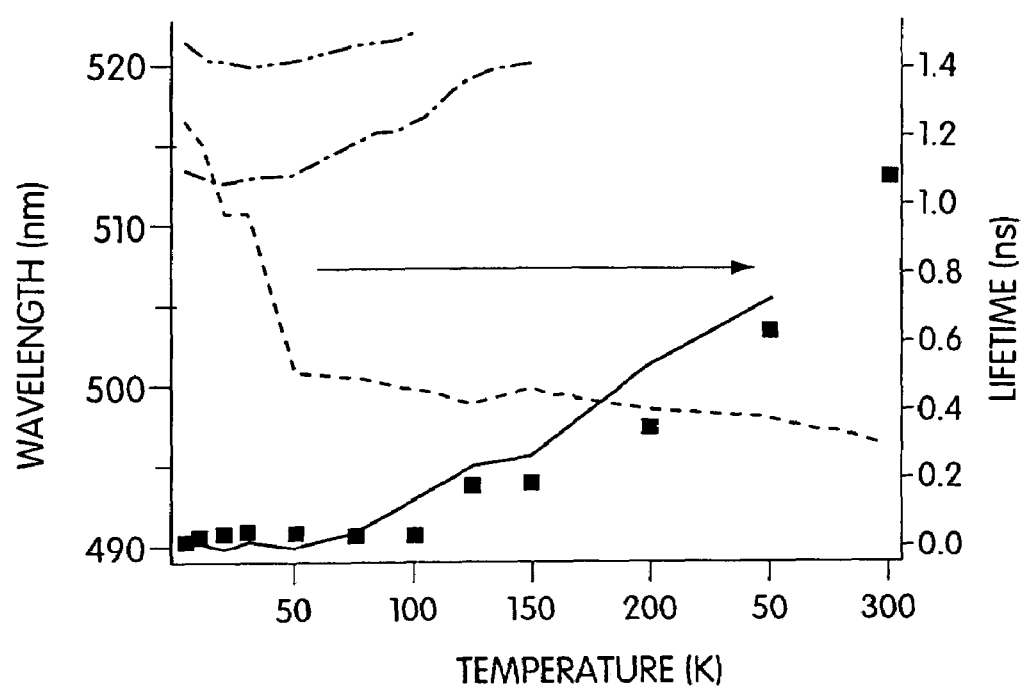

FIG. 22A illustrates the photoluminescence spectra of CdS nanowires at 4.2 K with different excitation intensities. The growth of the "P" band with increasing excitation intensity was observed. The inset shows the peak intensity of the $I_1$ and P exciton band as a function of the incident laser power. FIG. 22B shows the lasing spectra of CdS nanowires at different excitation intensities at 4.2 K and 100 K. FIG. 22C illustrates the temperature dependents of CdS nanowire lasers at various temperatures, as illustrated. FIG. 22D illustrates the photoluminescence spectra, for bands which become lasing (squares), lasing peaks (solid lines) ex-LO peak (dotted-dashed line), ex-2LO peak (dotted-dotted-dashed line), and lifetime (dotted line) of the photoluminescence with temperature.

EXAMPLE 6

Figure 23A:
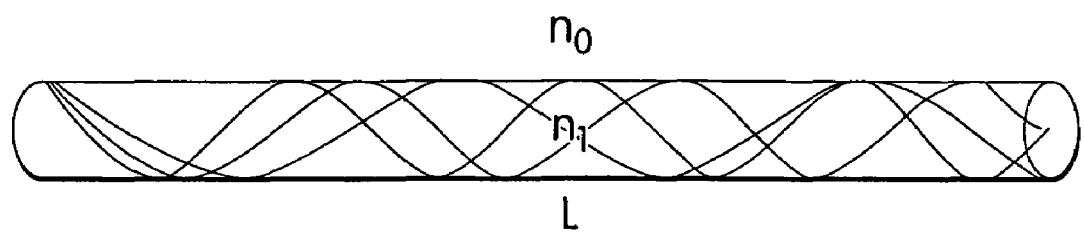
FIGS. 23A–23E illustrate nanoscale wires constructed and arranged as a Fabry-Perot optical cavity.

This example demonstrates that single semiconductor nanowires can function as an optical Fabry-Perot cavity under optical excitation and with electrical injection. In a free-standing cylindrical semiconductor nanowire, the optical field may be effectively confined inside the nanowire body due to large dielectric contrast between the semiconductor material and its surrounding medium (FIG. 23*a*). In this example, if the diameter (D) of the nanowire lies with a certain range as given by $1.5 < (\pi D/\lambda)(n_1^2 - n_0^2)^{0.5} < 2.4$, where D is the diameter of the NW; $\lambda$ the wavelength; $n_1$ and $n_0$ the refractive index of the nanowire material and the surrounding medium, respectively, the nanowire may be able to function as a single-mode optical waveguide to effectively support a single traverse optical mode much like the conventional optical fibers. Furthermore, if the two end facets are appropriately cleaved, the facets can function as two partially reflecting mirrors to enable the radiation to propagate back and forth along the longitudinal axis of the nanowire. The naturally cleaved mirrors can thus define a Fabry-Perot optical cavity with the allowed longitudinal modes given by $m(\lambda/2n_1) = L$, where m is an integer; $n_1$ the refractive index of the nanowire material; L the length of the cavity. Thus, FIG. 23*a* shows a nanowire as an optical waveguide, with cleaved ends defining a Fabry-Perot cavity.

Figure 23B:
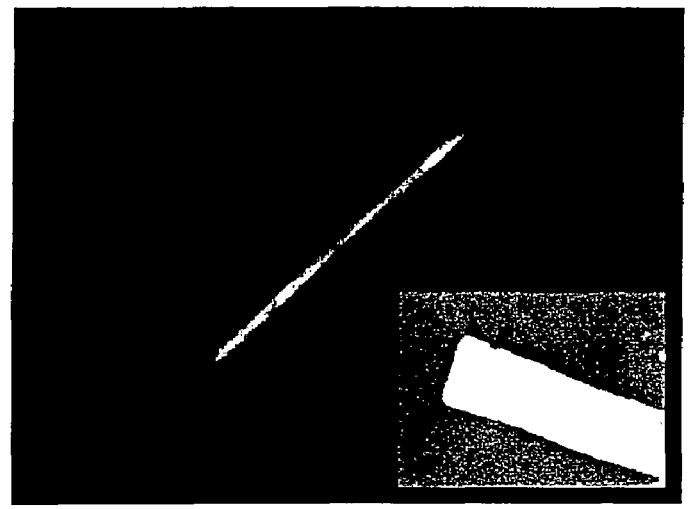

Cadmium sulfide (CdS) nanowires were used in this example as a model system to study the operation of nanowire Fabry-Perot cavity with optical and electrical excitation, although the discussion of the cavity operation is generally applicable to virtually any semiconductor nanowire material, such as those described herein. The CdS nanowires were synthesized at 80° by laser-assisted catalytic growth, using gold as the catalyst. The resulting nanowire was dispersed in ethanol and sonicated for 30–60 seconds to produce a high yield of wires having cleaved ends. Room temperature luminescence measurements, as described below, were made using an epifluorescence microscripts. Ar$^+$ laser (488 nm) was used for optical excitation. Spectra were recorded using a 300 mm spectrometer (1200 lines/mm grating in liquid nitrogen cold CCD detector. The minimum diameter of CdS nanowires ($n_1 = \sim 2.5$; $\lambda = \sim 510$ nm, 300 K) to support a single optical mode was approximately 70 nm. Single crystal CdS nanowires with diameters in the range of 8–200 nm were prepared by a laser-assisted catalytic growth approach. Transmission electron microscope studies reveal that the nanowires have wurtzite structure with [001] growth axis, which were easily cleaved using simple ultrasonication, since the (001) crystal face is the preferred cleaving plane in wurtzite structure. Scanning electron microscope image revealed that many nanowires exhibited flat end cross section after sonication, suggesting well-cleaved end facets (insert, FIG. 23*b*, illustrating an SEM image of a cleaved nanowire end).

Figure 23C:
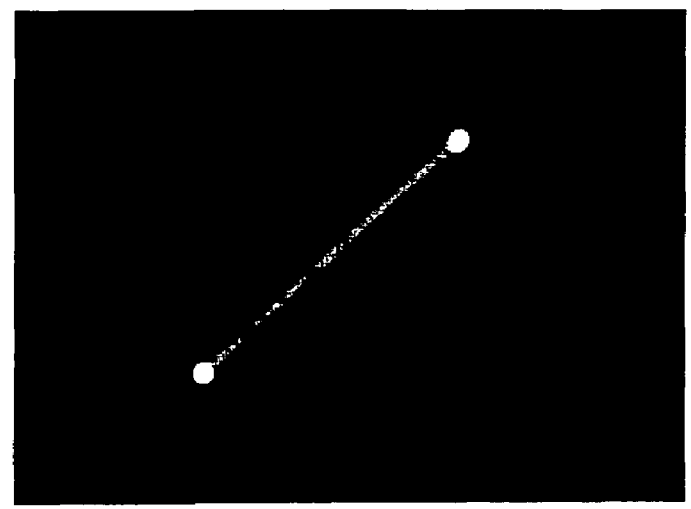

Micro-photoluminescence studies were carried out to investigate the wave-guiding effect of individual nanowires. A dark-field optical image obtained with white light illumination showed uniform light scattering along the nanowire wire axis (FIG. 23*b*). The scale bar indicates 10 microns. In contrast, when the nanowire is excited with UV light (~370 nm) from a mercury lamp, pronounced light emission was observed from both ends of the nanowire in addition to the uniform luminescence along the axis (FIG. 23c). FIG. 23c illustrates a real-color photoluminescence image of a CdS nanowire, excited with a mercury lamp at a frequency of about 370 nm. The emission is consistent with CdS band edge imaging. The pronounced emission from the nanowire ends suggests that the nanowire functions as an optical waveguide, as illustrated in detailed spectroscopic studies.

Figure 23D:
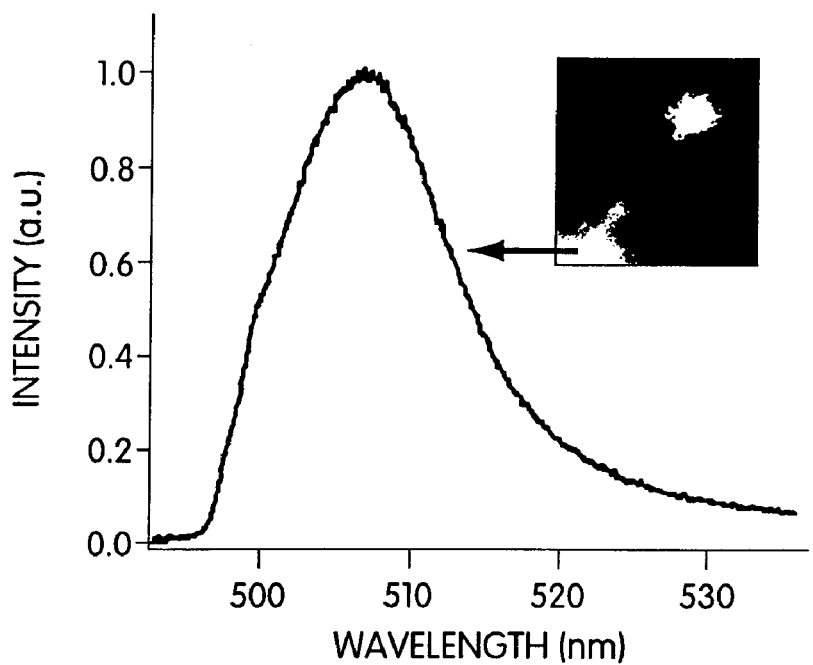
Figure 23E:
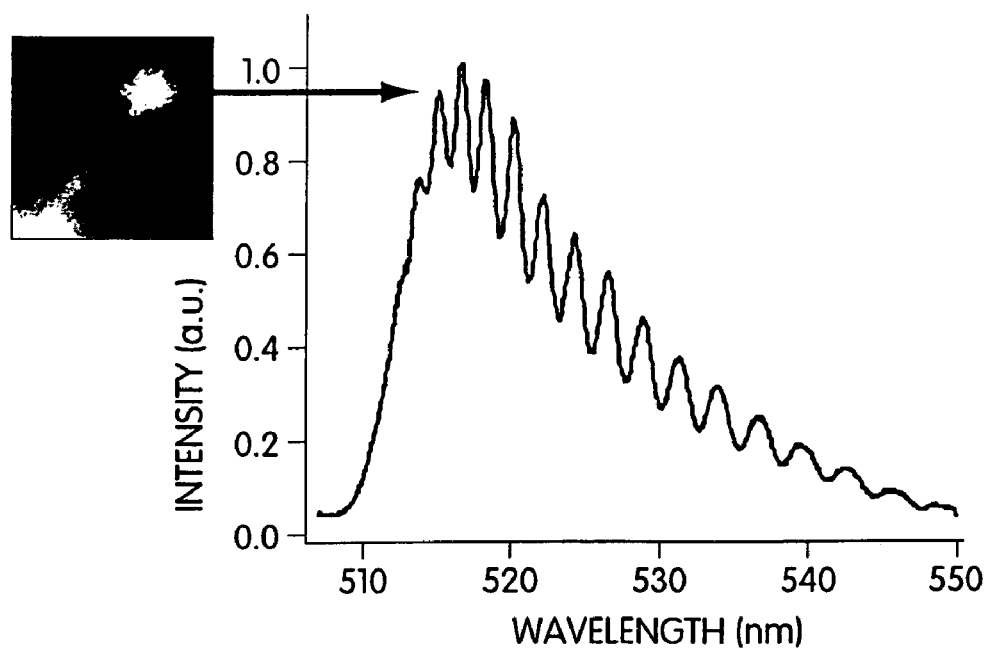

These spectroscopic studies were done using a far-field photoluminescence microscope with an Ar$^+$ ion laser as the excitation source (499 nm). A typical room-temperature luminescence image (inset, FIG. 23d, real-color photoluminescence) of a CdS nanowire excited with a tightly focused laser spot of diameter 10 μm, centered 20 μm from the nanowire end, showed strong emission at the excitation locus and prominent emission near the nanowire end. Spectroscopic studies of the emission from the excitation region showed a smooth spectrum peaked at around 510 nm (FIG. 23d), which is consistent with band edge emission from CdS. The spectrum from the nanowire end (FIG. 23e) was found to be overall red-shifted compared to the emission from the nanowire body (FIG. 23d), which may be attributed to re-absorption of the band edge emission by the nanowire when the photons propagate back and forth inside the cavity. Measurements of emission from nanowire end region also revealed periodic variations, which may be attributed to the longitudinal modes of a Fabry-Perot cavity (FIG. 23e). For a cavity of length L, the mode spacing, $\Delta\lambda$ is given by $(\lambda^2/2 L)(n_1-\lambda(dn_1/d\lambda))^{-1}$, where $dn_1/d\lambda$ is the dispersion relation for the refractive index. This expression provided a good description of the observed spacing when the measured nanowire length was equated with L (~14 μm). The gradual increasing of mode spacing as the wavelength is increased was attributed to the refractive-index dispersion of the CdS material. Moreover, analysis of similar data from nanowires of varying length (data not shown) demonstrated that the mode spacing was generally inversely proportional to the wire length. From the mode line widths (background subtracted), a moderate cavity quality factor of about 500–1000 was estimated. The quality factor was believed to be relatively small due to poor reflectance (~20%) of the cleaved facets estimated from Fresnels equations. The overall spectrum was also found to consist of a modulated spectrum superimposed on a background of a smooth spectrum. This significant background signal was believed to be mainly due to transmission losses from the end facets. In addition, the detection geometry (normal vs. parallel to the wire axis) may also enhance the detected background signal vs. emission propagating along the wire axis.

Figure 24A:
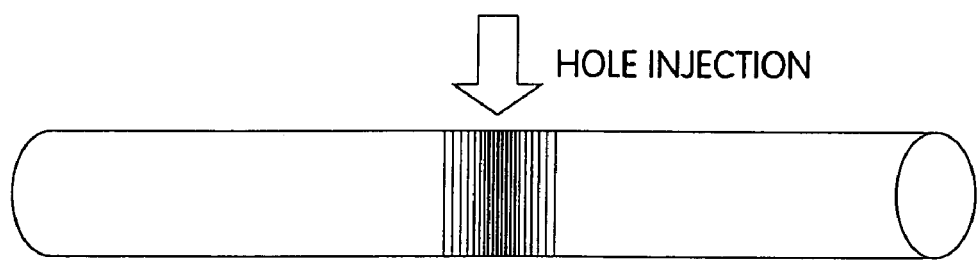
FIGS. 24A–24C schematically illustrate hole injection in a crossed nanowire structure.
Figure 24B:
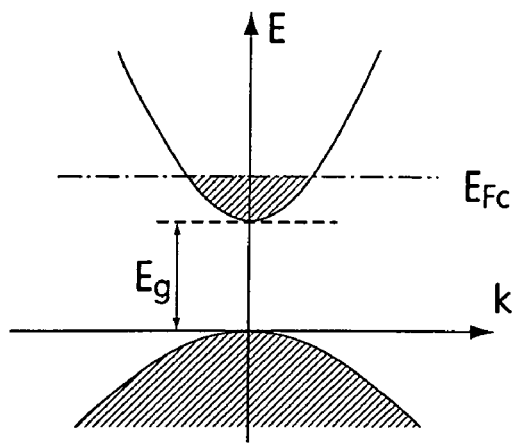
Figure 24C:
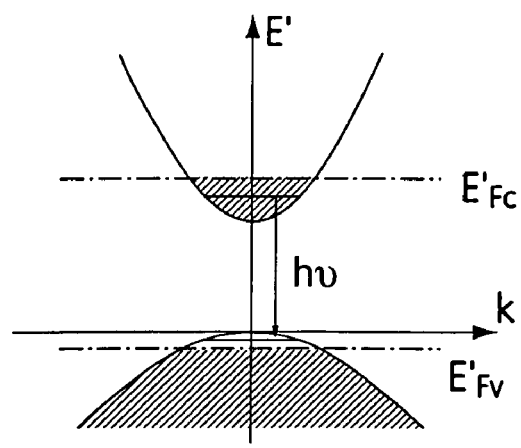

The observation of pronounced end emission in the crossed n-CdS/p-Si nanowire structure where holes are only injected in the crossing region can be interpreted using FIG. 24. FIG. 24a shows that holes may be locally injected from a p-Si nanowire (not shown coming out of the plane of the paper) into the end -CdS nanowire in a crossed nanowire configuration. When there is no hole-injection, the energy band diagram of a heavily doped n-CdS nanowire is illustrated by FIG. 24b, where the equilibrium Fermi level is $E_{Fc}$ and the bandgap is given by $E_g$. The valence band maximum is taken as the zero point, and FIG. 24b is drawn at 0 K for convenience. As a large number of holes are being injected into the CdS nanowire valence band by the crossed p-Si nanowire, the system may rapidly reach a quasi-equilibrium state with a quasi Fermi level $E'_{Fv}$ in valence band and quasi Fermi level $E'_{Fc}$ in the conduction band (FIG. 24c) (assuming a very minor change in the conduction band energy level). Spontaneous emission may occur in this region when electrons in the conduction band combine with the holes in the valence band. This spontaneous emission can propagate in all directions, including the wire axis direction. As the spontaneous emission traverses along the nanowire waveguide along the wire axis for a distance greater than the hole-diffusion length, the photons from the spontaneous emission can stimulate absorption in other parts of the nanowire, but only photons having energy greater than $E_{Fc}$ will be reabsorbed. The low energy photons cannot be reabsorbed and the wire is thus "transparent" to them, causing a red shift of the emission spectra from the end of the nanowires relative to the spectra from the injection region.

As more holes are injected into the nanowire, two processes may occur. First, a blue shift of the emission from the wire end may occur due to the approach to saturation of the reabsorption of the spontaneous emission photons (i.e., a relatively smaller percentage of high energy photons are absorbed and lost at higher injection current level). Secondly, as the photon density increases, other parts of the nanowire can get optically excited and the band diagram becomes more like the one illustrated in FIG. 24c. The photons with energy between $E_g$ and $E_{Fc}$ cannot be absorbed, and get reflected by the end facets of the nanowire. As those photons move back and forth in the nanowire waveguide and across the injection region, they can further stimulate transitions from the conduction to the valence band. As the stimulated emission can preserve the same phase as excitation photons, the injected electron-hole pairs may preferentially be pumped into photons traveling along the axis of the nanowire and thus amplify the emission along the wire axis, which can result in a much more stronger emission near the nanowire end than the cross point region.

While several embodiments of the invention have been described and illustrated herein, those of ordinary skill in the art will readily envision a variety of other means and structures for performing the functions and/or obtaining the results or advantages described herein, and each of such variations or modifications is deemed to be within the scope of the present invention. More generally, those skilled in the art would readily appreciate that all parameters, dimensions, materials, and configurations described herein are meant to be exemplary and that actual parameters, dimensions, materials, and configurations will depend upon specific applications for which the teachings of the present invention are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described. The present invention is directed to each individual feature, system, material and/or method described herein. In addition, any combination of two or more such features, systems, materials and/or methods, if such features, systems, materials and/or methods are not mutually inconsistent, is included within the scope of the present invention.

In the claims (as well as in the specification above), all transitional phrases such as "comprising," "including," "carrying," "having," "containing," "involving," and the like are to be understood to be open-ended, i.e. to mean including but not limited to. Only the transitional phrases "consisting of" and "consisting essentially of" shall be closed or semi-closed transitional phrases, respectively, as set forth in the United States Patent Office Manual of Patent Examining Procedures, section 2111.03.

What is claimed is:

1. An apparatus, comprising:
   at least one nanoscale wire constructed and arranged to generate amplified stimulated emission of radiation, the at least one nanoscale wire including a first type semiconductor material; and
   a substrate,
   wherein the apparatus is constructed and arranged such that at least first carrier types are injected along at least a portion of a length of the at least one nanoscale wire, in response to an electric signal from the substrate, to facilitate generation of the amplified stimulated emission of the radiation.

2. The apparatus of claim 1, wherein the first type semiconductor material is an n-type semiconductor material.

3. The apparatus of claim 1, wherein the first carrier types are holes.

4. The apparatus of claim 1, wherein the first type semiconductor material is a p-type semiconductor material.

5. The apparatus of claim 1, wherein the first carrier types are electrons.

6. The apparatus of claim 1, further comprising at least one second type semiconductor material electrode, wherein the at least one nanoscale wire is arranged with respect to the at least one second type semiconductor material electrode to form at least one p-n junction, such that, in response to the electric signal, at least some of the first carriers are injected along at least the portion of the length of the at least one nanoscale wire via the at least one second type semiconductor material electrode.

7. The apparatus of claim 6, wherein:
   the first type semiconductor material is an n-type semiconductor material;
   the second type semiconductor material is a p-type semiconductor material; and
   the first carrier types are holes.

8. The apparatus of claim 6, wherein:
   the first type semiconductor material is a p-type semiconductor material;
   the second type semiconductor material is an n-type semiconductor material; and
   the first carrier types are electrons.

9. The apparatus of claim 6, further comprising a second type semiconductor layer disposed on the substrate,
   wherein the at least one second type semiconductor material electrode is defined in the second type semiconductor layer.

10. The apparatus of claim 9, wherein:
    the first type semiconductor material is a p-type semiconductor material;
    the second type semiconductor material is an n-type semiconductor material;
    the second type semiconductor layer is an n-type semiconductor layer; and
    the first carrier types are electrons.

11. The apparatus of claim 9, wherein:
    the first type semiconductor material is an n-type semiconductor material;
    the second type semiconductor material is a p-type semiconductor material;
    the second type semiconductor layer is a p-type semiconductor layer; and
    the first carrier types are holes.

12. The apparatus of claim 11, wherein:
    the at least one nanoscale wire is formed of cadmium sulfide; and
    the at least one p-type electrode is formed of doped silicon.

13. The apparatus of claim 12, wherein the doped silicon has a doping concentration of approximately $4 \times 10^{19}/cm^3$.

14. The apparatus of claim 11, further comprising at least one metal layer in contact with the at least one nanoscale wire to provide for the injection of electrons into the at least one nanoscale wire.

15. The apparatus of claim 14, further comprising at least one insulating layer disposed between at least a portion of the at least one nanoscale wire and the at least one metal layer.

16. The apparatus of claim 15, wherein the at least one insulating layer includes aluminum oxide.

17. The apparatus of claim 1, wherein the at least one nanoscale wire includes at least one cadmium selenide nanoscale wire.

18. The apparatus of claim 1, wherein the at least one nanoscale wire includes at least one zinc selenide nanoscale wire.

19. The apparatus of claim 1, wherein the at least one nanoscale wire includes at least one zinc oxide nanoscale wire.

20. The apparatus of claim 1, wherein the at least one nanoscale wire includes at least one gallium nitride nanoscale wire.

21. The apparatus of claim 1, wherein the at least one nanoscale wire includes at least one indium phosphide nanoscale wire.

22. The apparatus of claim 1, wherein the at least one nanoscale wire is constructed and arranged to generate amplified stimulated emission of visible radiation.

23. The apparatus of claim 1, wherein the at least one nanoscale wire is constructed and arranged to generate amplified stimulated emission of ultraviolet radiation.

24. The apparatus of claim 1, wherein the at least one nanoscale wire is constructed and arranged to generate amplified stimulated emission of infrared radiation.

25. The apparatus of claim 1, wherein the at least one nanoscale wire has a diameter in a range of approximate 50 nanometers to 1000 nanometers.

26. The apparatus of claim 25, wherein the at least one nanoscale wire has a diameter in a range of approximate 80 nanometers to 200 nanometers.

27. The apparatus of claim 1, wherein the at least one nanoscale wire is constructed and arranged as an optical cavity.

28. The apparatus of claim 1, wherein the at least one nanoscale wire is constructed and arranged as a Fabry-Perot resonator.

29. The apparatus of claim 1, wherein the at least one nanoscale wire is cleaved so as to provide two end reflectors that define the Fabry-Perot resonator.

30. The apparatus of claim 29, wherein the two end reflectors are formed by solution phase sonication of the at least one nanoscale wire.

31. The apparatus of claim 29, wherein the at least one nanoscale wire is constructed and arranged such that at least one of the two end reflectors includes at least one Bragg grating.

32. The apparatus of claim 31, wherein the at least one Bragg grating is formed by axial composition modulation of the at least one nanoscale wire.

33. The apparatus of claim 1, wherein the at least one nanoscale wire includes:
    a core having a first type semiconductor material; and
    at least one shell having a second type semiconductor material so as to form at least one p-n junction with the core.

34. The apparatus of claim 33, wherein:
    the first type semiconductor material is an n-type semiconductor material;

the second type semiconductor material is a p-type semiconductor material; and the first carrier types are holes.

35. The apparatus of claim 33, wherein:
the first type semiconductor material is a p-type semiconductor material;
the second type semiconductor material is an n-type semiconductor material; and
the first carrier types are electrons.

36. The apparatus of claim 33, wherein the core is formed of cadmium sulfide.

37. The apparatus of claim 33, wherein the core is formed of cadmium selenide.

38. The apparatus of claim 33, wherein the core is formed of zinc sulfide.

39. The apparatus of claim 33, wherein the core is formed of zinc oxide.

40. The apparatus of claim 33, wherein the core is formed of gallium nitride.

41. The apparatus of claim 33, wherein the core is formed of indium phosphide.

42. The apparatus of claim 33, wherein the at least one nanoscale wire is constructed and arranged to generate amplified stimulated emission of visible radiation.

43. The apparatus of claim 33, wherein the at least one nanoscale wire is constructed and arranged to generate amplified stimulated emission of ultraviolet radiation.

44. The apparatus of claim 33, wherein the at least one nanoscale wire is constructed and arranged to generate amplified stimulated emission of infrared radiation.

45. The apparatus of claim 33, wherein the at least one nanoscale wire has a diameter in a range of approximate 50 nanometers to 1000 nanometers.

46. The apparatus of claim 45, wherein the at least one nanoscale wire has a diameter in a range of approximate 80 nanometers to 200 nanometers.

47. The apparatus of claim 33, wherein the at least one nanoscale wire is constructed and arranged as an optical cavity.

48. The apparatus of claim 47, wherein the at least one nanoscale wire is constructed and arranged as a Fabry-Perot resonator.

49. The apparatus of claim 48, wherein the at least one nanoscale wire is cleaved so as to provide two end reflectors that define the Fabry-Perot resonator.

50. The apparatus of claim 49, wherein the two end reflectors are formed by solution phase sonication of the at least one nanoscale wire.

51. The apparatus of claim 49, wherein the at least one nanoscale wire is constructed and arranged such that at least one of the two end reflectors includes at least one Bragg grating.

52. The apparatus of claim 51, wherein the at least one Bragg grating is formed by axial composition modulation of the at least one nanoscale wire.

53. A method of fabricating a nanoscale laser comprising:
a) forming at least one nanoscale wire from a first type semiconductor material;
b) forming the at least one nanoscale wire into an optical cavity; and
c) coupling the at least one nanoscale wire to at least one electrode formed from a second type semiconductor material, the at least one electrode being formed in a semiconductor layer coupled to a substrate.

54. The method of claim 53, wherein the first type semiconductor material is an n-type semiconductor material.

55. The method of claim 53, wherein the second type semiconductor material is a p-type semiconductor material.

56. The method of claim 53, wherein the first type semiconductor material is a p-type semiconductor material.

57. The method of claim 53, wherein the second type semiconductor material is an n-type semiconductor material.

58. The method of claim 53, further comprising an act of:
forming at least one metal layer in contact with the at least one nanoscale wire.

59. The method of claim 58, further comprising an act of:
forming at least one insulating layer disposed between at least a portion of the at least one nanoscale wire and the at least one metal layer.

60. The method of claim 59, wherein the at least one insulating layer includes a layer of aluminum oxide.

61. A method of fabricating a nanoscale wire optical cavity, comprising:
a) forming at least one Bragg grating on at least one nanoscale wire; and
b) positioning the nanoscale wire on a substrate such that carriers can be injected from the substrate into at least a portion of the nanoscale wire.

62. The method of claim 61, wherein the act a) includes an act of:
a1) forming the optical cavity as a Fabry-Perot resonator.

63. The method of claim 62, wherein the act a1) includes an act of:
a2) cleaving the at least one nanoscale wire so as to provide two end reflectors that define the Fabry-Perot resonator.

64. The method of claim 63, wherein the act a2) includes an act of:
a3) forming the two end reflectors by solution phase sonication of the at least one nanoscale wire.

65. The method of claim 62, wherein the act a1) includes an act of:
a2) forming at least one of the two end reflectors as the at least one Bragg grating.

66. The method of claim 65, wherein the act a2) includes an act of:
a3) forming the at least one Bragg grating by axial composition modulation of the at least one nanoscale wire.

67. The method of claim 61, wherein the act a) includes an act of:
forming the at least one nanoscale wire both as the optical cavity and a gain medium.

68. A method of generating amplified stimulated emission of radiation, comprising an act of:
applying an electric signal from a substrate along at least a portion of a length of a nanoscale wire formed as an optical resonator.

69. An apparatus, comprising:
an electrical injection laser including a nanoscale wire constructed and arranged to receive carriers from a substrate along at least a portion of a length of the nanoscale wire.

70. The apparatus of claim 69, wherein the nanoscale wire is made entirely or in part of at least one material selected from the group consisting of cadmium sulfide, cadmium selenide, zinc selenide, zinc oxide, gallium nitride, indium phosphide, and combinations thereof.

* * * * *